US008968887B2

(12) United States Patent
Ma et al.

(10) Patent No.: US 8,968,887 B2

(45) Date of Patent: Mar. 3, 2015

(54) TRIPHENYLENE-BENZOFURAN/ BENZOTHIOPHENE/BENZOSELENOPHENE COMPOUNDS WITH SUBSTITUENTS JOINING TO FORM FUSED RINGS

(75) Inventors: Bin Ma, Plainsboro, NJ (US); James Fiordeliso, Yardley, PA (US); Yonggang Wu, Lawrenceville, NJ (US); Raymond Kwong, Plainsboro, NJ (US)

(73) Assignee: Universal Display Corporation, Ewing, NJ (US)

( * ) Notice: Subject to any disclaimer, the term of this patent is extended or adjusted under 35 U.S.C. 154(b) by 130 days.

(21) Appl. No.: 13/004,523

(22) Filed: Jan. 11, 2011

(65) Prior Publication Data

US 2011/0266526 A1 Nov. 3, 2011

Related U.S. Application Data

(60) Provisional application No. 61/343,402, filed on Apr. 28, 2010.

(51) Int. Cl.

| | |
|---|---|
| ***H01L 51/54*** | (2006.01) |
| ***C07D 307/77*** | (2006.01) |
| ***C07D 333/50*** | (2006.01) |
| ***C09K 11/06*** | (2006.01) |
| ***H01L 51/00*** | (2006.01) |
| ***H05B 33/20*** | (2006.01) |
| ***H05B 33/22*** | (2006.01) |
| *H01L 51/50* | (2006.01) |

(52) U.S. Cl.

CPC ............ *C09K 11/06* (2013.01); *H01L 51/0054* (2013.01); *H05B 33/20* (2013.01); *H05B 33/22* (2013.01); *C09K 2211/1088* (2013.01); *C09K 2211/1092* (2013.01); *C09K 2211/1096* (2013.01); *H01L 51/0072* (2013.01); *H01L 51/0074* (2013.01); *H01L 51/5012* (2013.01)

USPC ............... 428/690; 549/42; 549/41; 549/456; 549/457

(58) Field of Classification Search

None

See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |
| 5,247,190 | A | 9/1993 | Friend et al. |
| 5,703,436 | A | 12/1997 | Forrest et al. |
| 5,707,745 | A | 1/1998 | Forrest et al. |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — J. L. Yang

(74) *Attorney, Agent, or Firm* — Duane Morris LLP

(57) ABSTRACT

Compounds comprising a triphenylene moiety and a benzo- or dibenzo-moiety are provided. In particular, the benzo- or dibenzo-moiety has a fused substituent. These compounds may be used in organic light emitting devices, particularly in combination with yellow, orange and red emitters, to provide devices with improved properties.

19 Claims, 3 Drawing Sheets

(56) References Cited

U.S. PATENT DOCUMENTS

| | | | |
|---|---|---|---|
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,528,187 B1 | 3/2003 | Okada | |
| 6,687,266 B1 | 2/2004 | Ma et al. | |
| 6,835,469 B2 | 12/2004 | Kwong et al. | |
| 6,921,915 B2 | 7/2005 | Takiguchi et al. | |
| 7,087,321 B2 | 8/2006 | Kwong et al. | |
| 7,090,928 B2 | 8/2006 | Thompson et al. | |
| 7,154,114 B2 | 12/2006 | Brooks et al. | |
| 7,250,226 B2 | 7/2007 | Tokito et al. | |
| 7,279,704 B2 | 10/2007 | Walters et al. | |
| 7,332,232 B2 | 2/2008 | Ma et al. | |
| 7,338,722 B2 | 3/2008 | Thompson et al. | |
| 7,393,599 B2 | 7/2008 | Thompson et al. | |
| 7,396,598 B2 | 7/2008 | Takeuchi et al. | |
| 7,431,968 B1 | 10/2008 | Shtein et al. | |
| 7,445,855 B2 | 11/2008 | Mackenzie et al. | |
| 7,534,505 B2 | 5/2009 | Lin et al. | |
| 2002/0034656 A1 | 3/2002 | Thompson et al. | |
| 2002/0134984 A1 | 9/2002 | Igarashi | |
| 2002/0158242 A1 | 10/2002 | Son et al. | |
| 2003/0136657 A1 | 7/2003 | Eckert et al. | |
| 2003/0152802 A1 | 8/2003 | Tsuboyama et al. | |
| 2003/0162053 A1 | 8/2003 | Marks et al. | |
| 2003/0175553 A1 | 9/2003 | Thompson et al. | |
| 2003/0230980 A1 | 12/2003 | Forrest et al. | |
| 2004/0036077 A1 | 2/2004 | Ise | |
| 2004/0076853 A1* | 4/2004 | Jarikov | 428/690 |
| 2004/0137267 A1 | 7/2004 | Igarashi et al. | |
| 2004/0137268 A1 | 7/2004 | Igarashi et al. | |
| 2004/0174116 A1 | 9/2004 | Lu et al. | |
| 2005/0025993 A1 | 2/2005 | Thompson et al. | |
| 2005/0112407 A1 | 5/2005 | Ogasawara et al. | |
| 2005/0238919 A1 | 10/2005 | Ogasawara | |
| 2005/0244673 A1 | 11/2005 | Satoh et al. | |
| 2005/0260441 A1 | 11/2005 | Thompson et al. | |
| 2005/0260449 A1 | 11/2005 | Walters et al. | |
| 2005/1026044 | 11/2005 | Thompson at al. | |
| 2006/0008670 A1 | 1/2006 | Lin et al. | |
| 2006/0202194 A1 | 9/2006 | Jeong et al. | |
| 2006/0240279 A1 | 10/2006 | Adamovich et al. | |
| 2006/0251923 A1 | 11/2006 | Lin et al. | |
| 2006/0263635 A1 | 11/2006 | Ise | |
| 2006/0280965 A1 | 12/2006 | Kwong et al. | |
| 2006/1028096 | 12/2006 | Kwong at al. | |
| 2007/0190359 A1 | 8/2007 | Knowles et al. | |
| 2007/0278938 A1 | 12/2007 | Yabunouchi et al. | |
| 2008/0015355 A1 | 1/2008 | Schafer et al. | |
| 2008/0018221 A1 | 1/2008 | Egen et al. | |
| 2008/0106190 A1 | 5/2008 | Yabunouchi et al. | |
| 2008/0124572 A1 | 5/2008 | Mizuki et al. | |
| 2008/0220265 A1 | 9/2008 | Xia et al. | |
| 2008/0297033 A1 | 12/2008 | Knowles et al. | |
| 2009/0008605 A1 | 1/2009 | Kawamura et al. | |
| 2009/0009065 A1 | 1/2009 | Nishimura et al. | |
| 2009/0017330 A1 | 1/2009 | Iwakuma et al. | |
| 2009/0030202 A1 | 1/2009 | Iwakuma et al. | |
| 2009/0039776 A1 | 2/2009 | Yamada et al. | |
| 2009/0045730 A1 | 2/2009 | Nishimura et al. | |
| 2009/0045731 A1 | 2/2009 | Nishimura et al. | |
| 2009/0101870 A1 | 4/2009 | Prakash et al. | |
| 2009/0108737 A1 | 4/2009 | Kwong et al. | |
| 2009/0115316 A1 | 5/2009 | Zheng et al. | |
| 2009/0165846 A1 | 7/2009 | Johannes et al. | |
| 2009/0167162 A1 | 7/2009 | Lin et al. | |
| 2009/0179554 A1 | 7/2009 | Kuma et al. | |
| 2010/0237334 A1* | 9/2010 | Ma et al. | 257/40 |

FOREIGN PATENT DOCUMENTS

| | | | |
|---|---|---|---|
| EP | 2034538 | 3/2009 | |
| EP | 2112214 | 10/2009 | |
| EP | 2 213 641 | 8/2010 | |
| JP | 200511610 | 1/2005 | |
| JP | 2007123392 | 5/2007 | |
| JP | 2007254297 | 10/2007 | |
| JP | 2008074939 | 10/2009 | |
| WO | WO 0139234 | 5/2001 | |
| WO | WO 0202714 | 1/2002 | |
| WO | WO 0215645 | 2/2002 | |
| WO | WO 03040257 | 5/2003 | |
| WO | WO 03060956 | 7/2003 | |
| WO | WO 2004093207 | 10/2004 | |
| WO | WO 2004107822 | 12/2004 | |
| WO | WO 2005014551 | 2/2005 | |
| WO | WO 2005019373 | 3/2005 | |
| WO | WO 2005030900 | 4/2005 | |
| WO | WO 2005089025 | 9/2005 | |
| WO | WO 2005123873 | 12/2005 | |
| WO | WO 2006009024 | 1/2006 | |
| WO | WO 2006056418 | 6/2006 | |
| WO | WO 2006072002 | 7/2006 | |
| WO | WO 2006082742 | 8/2006 | |
| WO | WO 2006098120 | 9/2006 | |
| WO | WO 2006100298 | 9/2006 | |
| WO | WO 2006103874 | 10/2006 | |
| WO | WO 2006114966 | 11/2006 | |
| WO | WO 2006/130598 | 12/2006 | |
| WO | WO 2006132173 | 12/2006 | |
| WO | WO 2007002683 | 1/2007 | |
| WO | WO 2007004380 | 1/2007 | |
| WO | WO 2007063754 | 6/2007 | |
| WO | WO 2007063796 | 6/2007 | |
| WO | WO 2008056746 | 5/2008 | |
| WO | WO 2008101842 | 8/2008 | |
| WO | WO 2008132085 | 11/2008 | |
| WO | WO 2009000673 | 12/2008 | |
| WO | WO 2009003898 | 1/2009 | |
| WO | WO 2009008311 | 1/2009 | |
| WO | WO 2009/021107 | 2/2009 | |
| WO | WO 2009/021126 A2 * | 2/2009 | C07D 307/91 |
| WO | WO 2009018009 | 2/2009 | |
| WO | WO 2009050290 | 4/2009 | |
| WO | WO 2009/021126 | 5/2009 | |
| WO | WO 2009021126 | 5/2009 | |
| WO | WO 2009062578 | 5/2009 | |
| WO | WO 2009063833 | 5/2009 | |
| WO | WO 2009066778 | 5/2009 | |
| WO | WO 2009066779 | 5/2009 | |
| WO | WO 2009086028 | 7/2009 | |
| WO | WO 2009100991 | 8/2009 | |
| WO | WO 2010/036765 | 4/2010 | |

OTHER PUBLICATIONS

Baldo et al., "Very high-efficiency green organic light-emitting devices based on electrophosphorescence," Appl. Phys. Lett., vol. 75, No. 3, 4-6 (1999).

Ashe et al., Heteroatom Chemistry, 5(2), 113-19, 1994.

Tominaga et al., Journal of Heterocyclic Chemistry, 18(5), 967-72, Aug. 1981.

Baldwin et al., Journal of Heterocyclic Chemistry, 21(6), 1775-9, 1984.

Buquet et al., Tetrahedron, 37(1), 75-81, 1981.

U.S. Appl. No. 61/343,402, filed Apr. 28, 2010.

The International Search Report corresponding to the PCT//US2011/034081 application.

Kuwabara, Yoshiyuki et al., "Thermally Stable Multilayered Organic Electroluminescent Devices Using Novel Starburst Molecules, 4,4',4"-Tri(*N*-carbazolyl)triphenylamine (TCTA) and 4,4',4"-Tris(3-methylphenylphenyl-amino)triphenylamine (*m*-MTDATA), as Hole-Transport Materials," *Adv. Mater,* 6(9):677-679 (1994).

Paulose, Betty Marie Jennifer S. et al., "First Examples of Alkenyl Pyridines as Organic Ligands for Phosphorescent Iridium Complexes," *Adv. Mater.,* 16(22):2003-2007 (2004).

(56) References Cited

OTHER PUBLICATIONS

Tung, Yung-Liang et al., "Organic Light-Emitting Diodes Based on Charge-Neutral $Ru^{II}$ PHosphorescent Emitters," Adv. Mater., 17(8):1059-1064 (2005).
Huang, Jinsong et al., "Highly Efficient Red-Emission Polymer Phosphorescent Light-Emitting Diodes Based on Two Novel Tris(1-phenylisoquinolinato-C2,*N*)iridium(III) Derivatives," *Adv. Mater.*, 19:739-743 (2007).
Wong, Wai-Yeung, "Multifunctional Iridium Complexes Based on Carbazole Modules as Highly Efficient Electrophosphors," *Angew. Chem. Int. Ed.*, 45:7800-7803 (2006).
Tang, C.W. and VanSlyke, S.A., "Organic Electroluminescent Diodes," *Appl. Phys. Lett.*, 51(12):913-915 (1987).
Adachi, Chihaya et al., "Organic Electroluminescent Device Having a Hole Conductor as an Emitting Layer," *Appl. Phys. Lett.*, 55(15):1489-1491 (1989).
Ma, Yuguang et al., "Triplet Luminescent Dinuclear-Gold(*I*) Complex-Based Light-Emitting Diodes with Low Turn-On voltage," *Appl. Phys. Lett.*, 74(10):1361-1363 (1999).
Gao, Zhiqiang et al., "Bright-Blue Electroluminescence From a Silyl-Substituted ter-(phenylene-vinylene) derivative," *Appl. Phys. Lett.*, 74(6):865-867 (1999).
Lee, Chang-Lyoul et al., "Polymer Phosphorescent Light-Emitting Devices Doped with Tris(2-phenylpyridine) Iridium as a Triplet Emitter," *Appl. Phys. Lett.*, 77(15):2280-2282 (2000).
Hung, L.S. et al., "Anode Modification in Organic Light-Emitting Diodes by Low-Frequency Plasma Polymerization of $CHF_3$," *Appl. Phys. Lett.*, 78(5):673-675 (2001).
Ikai, Masamichi and Tokito, Shizuo, "Highly Efficient Phosphorescence From Organic Light-Emitting Devices with an Exciton-Block Layer," *Appl. Phys. Lett.*, 79(2):156-158 (2001).
Wang, Y. et al., "Highly Efficient Electroluminescent Materials Based on Fluorinated Organometallic Iridium Compounds," *Appl. Phys. Lett.*, 79(4):449-451 (2001).
Kwong, Raymond C. et al., "High Operational Stability of Electrophosphorescent Devices," *Appl. Phys. Lett.*, 81(1):162-164 (2002).
Holmes, R.J. et al., "Blue Organic Electrophosphorescence Using Exothermic Host-Guest Energy Transfer," *Appl. Phys. Lett.*, 82(15):2422-2424 (2003).
Sotoyama, Wataru et al., "Efficient Organic LIght-Emitting Diodes with Phosphorescent Platinum Complexes Containing N^C^N-Coordinating Tridentate Ligand,",*Appl. Phys. Lett.*, 86:153505-1-153505-3 (2005).
Okumoto, Kenji et al., "Green Fluorescent Organic Light-Emitting Device with External Quantum Efficiency of Nearly 10%," *Appl. Phys. Lett.*, 89:063504-1-063504-3 (2006).
Kanno, Hiroshi et al., "Highly Efficient and Stable Red Phosphorescent Organic Light-Emitting Device Using bis[2-(2-benzothiazoyl)phenolato]zinc(II) as host material," *Appl. Phys. Lett.*, 90:123509-1-123509-3 (2007).
Aonuma, Masaki et al., "Material Design of Hole Transport Materials Capable of Thick-Film Formation in Organic Light Emitting Diodes," *Appl. Phys. Lett.*, 90:183503-1-183503-3 (2007).
Sun, Yiru and Forrest, Stephen R., "High-Efficiency White Organic Light Emitting Devices with Three Separate Phosphorescent Emission Layers," *Appl. Phys. Lett.*, 91:263503-1-263503-3 (2007).
Adachi, Chihaya et al., "High-Efficiency Red Electrophosphorescence Devices," *Appl. Phys. Lett.*, 78(11):1622-1624 (2001).
Wong, Keith Man-Chung et al., A Novel Class of Phosphorescent Gold(III) Alkynyl-Based Organic Light-Emitting Devices with Tunable Colour, *Chem. Commun.*, 2906-2908 (2005).
Hamada, Yuji et al., "High Luminance in Organic Electroluminescent Devices with Bis(10-hydroxybenzo[h]quinolinato)beryllium as an Emitter," *Chem. Lett.*, 905-906 (1993).
Nishida, Jun-ichi et al., "Preparation, Characterization, and Electroluminescence Characteristics of α-Diimine-type Platinum(II) Complexes with Perfluorinated Phenyl Groups as Ligands," *Chem. Lett.*, 34(4):592-593 (2005).
Mi, Bao-Xiu et al., "Thermally Stable Hole-Transporting Material for Organic Light-Emitting Diode: an Isoindole Derivative," *Chem. Mater.*, 15(16):3148-3151 (2003).
Huang, Wei-Sheng et al., "Highly Phosphorescent Bis-Cyclometalated Iridium Complexes Containing Benzoimidazole-Based Ligands," *Chem. Mater.*, 16(12):2480-2488 (2004).
Niu, Yu-Hua et al., "Highly Efficient Electrophosphorescent Devices with Saturated Red Emission from a Neutral Osmium Complex," *Chem. Mater.*, 17(13):3532-3536 (2005).
Lo, Shih-Chun et al., "Blue Phosphorescence from Iridium(III) Complexes at Room Temperature," *Chem. Mater.*, 18(21):5119-5129 (2006).
Takizawa, Shin-ya et al., "Phosphorescent Iridium Complexes Based on 2-Phenylimidazo[1,2-α]pyridine Ligands: Tuning of Emission Color toward the Blue Region and Application to Polymer Light-Emitting Devices," *Inorg. Chem.*, 46(10):4308-4319 (2007).
Lamansky, Sergey et al., "Synthesis and Characterization of Phosphorescent Cyclometalated Iridium Complexes," *Inorg. Chem.*, 40(7):1704-1711 (2001).
Ranjan, Sudhir et al., "Realizing Green Phosphorescent Light-Emitting Materials from Rhenium(I) Pyrazolato Diimine Complexes," *Inorg. Chem.*, 42(4):1248-1255 (2003).
Noda, Tetsuya and Shirota,Yasuhiko, "5,5'-Bis(dimesitylbory1)-2,2'-bithiophene and 5,5''-Bis(dimesitylboryl)-2,2':5',2''-terthiophene as a Novel Family of Electron-Transporting Amorphous Molecular Materials," *J. Am. Chem. Soc.*, 120 (37):9714-9715 (1998).
Sakamoto, Youichi et al., "Synthesis, Characterization, and Electron-Transport Property of Perfluorinated Phenylene Dendrimers," *J. Am. Chem. Soc.*, 122(8):1832-1833 (2000).
Adachi, Chihaya et al., "Nearly 100% Internal Phosphorescence Efficiency in an Organic Light Emitting Device," *J. Appl. Phys.*, 90(10):5048-5051 (2001).
Shirota, Yasuhiko et al., "Starburst Molecules Based on π-Electron Systems as Materials for Organic Electroluminescent Devices," *Journal of Luminescence*, 72-74:985-991 (1997).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).
Kido, Junji et al., 1,2,4-Triazole Derivative as an Electron Transport Layer in Organic Electroluminescent Devices, *Jpn. J. Appl. Phys.*, 32:L917-L920 (1993).
Van Slyke, S. A. et al., "Organic Electroluminescent Devices with Improved Stability," *Appl. Phys. Lett.*, 69(15 ):2160-2162 (1996).
Guo, Tzung-Fang et al., "Highly Efficient Electrophosphorescent Polymer Light-Emitting Devices," *Organic Electronics*, 1:15-20 (2000).
Palilis, Leonidas C., "High Efficiency Molecular Organic Light-Emitting Diodes Based on Silole Derivatives and Their Exciplexes," *Organic Electronics*, 4:113-121 (2003).
Ikeda, Hisao et al., "P-185: Low-Drive-Voltage OLEDs with a Buffer Layer Having Molybdenum Oxide," *SID Symposium Digest*, 37:923-926 (2006).
T. Östergård et al., "Langmuir-Blodgett Light-Emitting Diodes of Poly(3-Hexylthiophene): Electro-Optical Characteristics Related to Structure," *Synthetic Metals*, 87:171-177 (1997).
Hu, Nan-Xing et al., "Novel High $T_g$ Hole-Transport Molecules Based on Indolo[3,2-*b*]carbazoles for Organic Light-Emitting Devices," *Synthetic Metals*, 111-112:421-424 (2000).
Salbeck, J. et al., "Low Molecular Organic Glasses for Blue Electroluminescence," *Synthetic Metals*, 91:209-215 (1997).

* cited by examiner

Formula 2

Formula 3

Formula 4

TRIPHENYLENE-BENZOFURAN/BENZOTHIOPHENE/BENZOSELENOPHENE COMPOUNDS WITH SUBSTITUENTS JOINING TO FORM FUSED RINGS

This application claims priority to U.S. Provisional Application Ser. No. 61/343,402, filed Apr. 28, 2010, the disclosure of which is herein expressly incorporated by reference in its entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs). More specifically, the present invention relates to phosphorescent materials comprising a triphenylene moiety and a benzofuran, dibenzofuran, benzothiophene, dibenzothiophene, benzoselenophene or dibenzoselenophene moiety. These materials may provide devices having improved performance.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the structure:

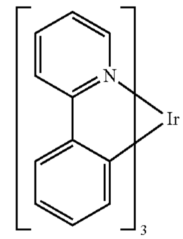

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

Compounds comprising a triphenylene moiety and a benzo- or dibenzo-furan, benzo- or dibenzo-thiophene, or benzo- or dibenzo-selenophene moiety with fused substituents are provided. The compounds comprise the formula:

Formula I

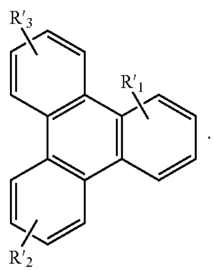

$R'_1$, $R'_2$, and $R'_3$ are independently selected from the group consisting of hydrogen, deuterium, alkyl, alkoxy, amino, alkenyl, alkynyl, arylkyl, aryl, and heteroaryl. Each of $R'_1$, $R'_2$, and $R'_3$ may represent mono, di, tri, or tetra substituents. The compound further comprises a benzofuran, benzothiophene, benzoselenophene, dibenzofuran, dibenzothiophene, or dibenzoselenophene moiety further comprising an additional aromatic or heteroaromatic ring fused to a benzo ring of the benzofuran, benzothiophene, benzoselenophene, dibenzofuran, dibenzothiophene, or dibenzoselenophene moiety.

In one aspect, the aromatic or heteroaromatic ring is a 6-membered carbocyclic or heterocyclic. In another aspect, the aromatic ring is a benzene ring.

In one aspect, the compound is selected from the group consisting of

Formula 2

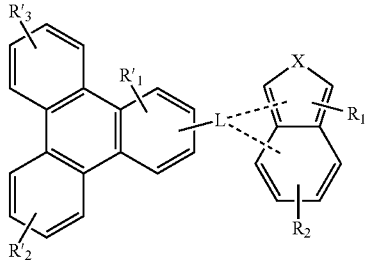

-continued

Formula 3

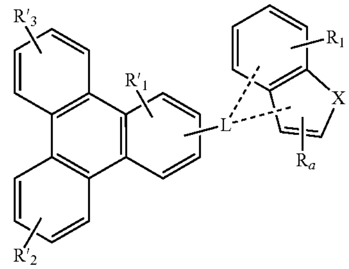

Formula 4

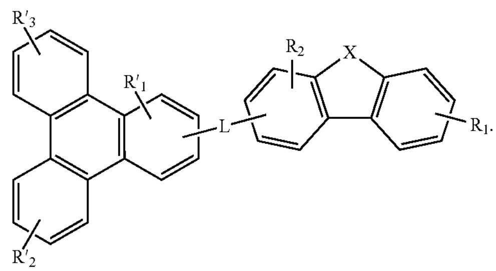

X is O, S or Se. In one aspect, X is S. In another aspect, X is O. $R_1$, $R_2$, and $R_a$ are independently selected from hydrogen, deuterium, alkyl, alkoxy, amino, alkenyl, alkynyl, arylkyl, aryl, and heteroaryl. Each of $R_1$ and $R_2$ may represent mono, di, tri or tetra substituents. At least two substituents of $R_1$ or $R_2$ are joined to form a fused ring. $R_1$ represents mono or di substituents which cannot fuse to form a benzo ring. L represents a spacer or a direct connection to the benzofuran, dibenzofuran, benzothiophene, dibenzothiophene, benzoselenophene or benzoselenophene moiety with additional fused rings.

Preferably, the compound has the formula:

Formula 4

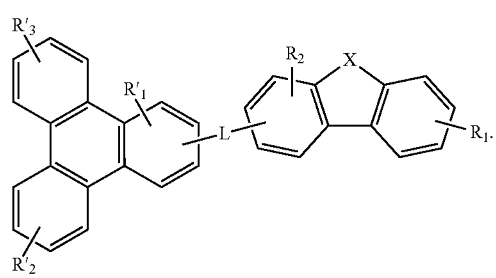

In one aspect, L is a direct connection. In another aspect, L is a spacer having the formula:

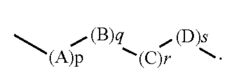

A, B, C and D are independently selected from the group consisting of:

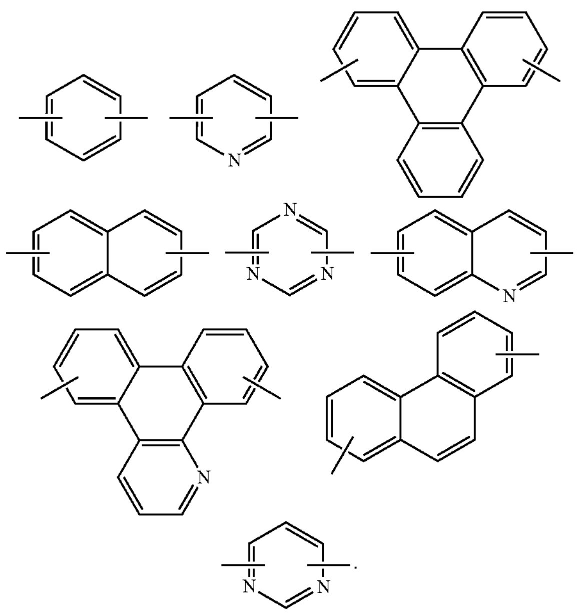

A, B, C and D are optionally further substituted with $R_a$. Each of p, q, r and s are 0, 1, 2, 3, or 4. p+q+r+s is at least 1. Preferably, L is phenyl.

In one aspect, the benzofuran, dibenzofuran, benzothiophene, dibenzothiophene, benzoselenophene, or dibenzoselenophene moiety with additional fused rings is selected from the group consisting of:

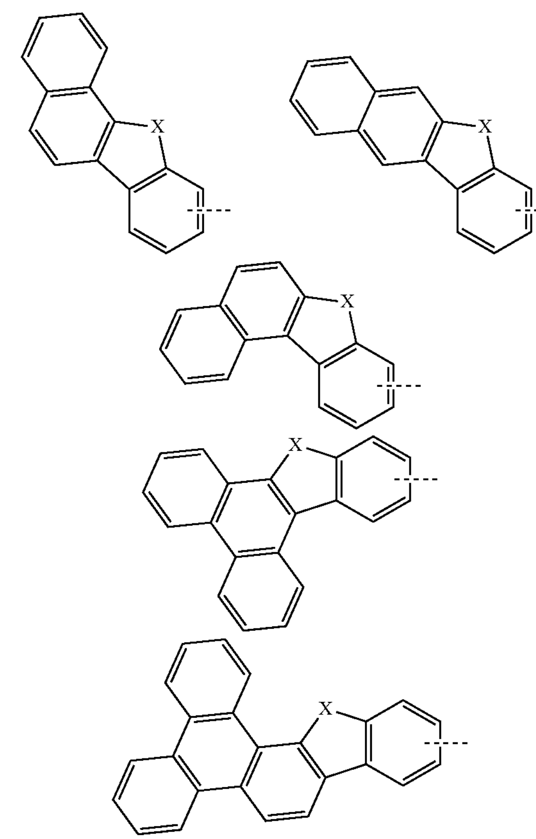

-continued

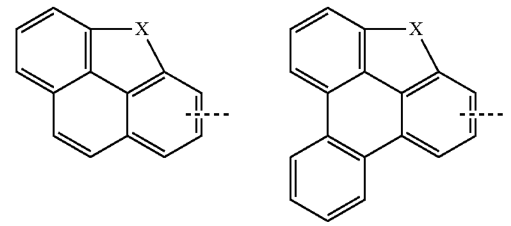

Examples of the compounds are provided, and include compounds selected from the group consisting of Formula 4-1 through Formula 4-28.

X is O, S or Se. $R_1$, $R_2$, $R_3$, $R_4$, $R_5$, $R'_1$, $R'_2$, and $R'_3$ are independently selected from the group consisting of hydrogen, deuterium, alkyl, alkoxy, amino, alkenyl, alkynyl, arylkyl, aryl, and heteroaryl. Each of $R_1$, $R_2$, $R_3$, $R_4$, $R_5$, $R'_1$, $R'_2$, and $R'_3$ may represent mono, di, tri or tetra substituents. L is a spacer or a direct linkage.

Specific examples of the compounds provided, include compounds selected from the group consisting of Compound 1-Compound 69.

X is O, S, or Se.

Additionally, a first device comprising an organic light emitting device is provided. The organic light emitting device further comprises an anode, a cathode, and an organic layer, disposed between the anode and the cathode. The organic layer comprises a compound comprising the formula:

Formula I

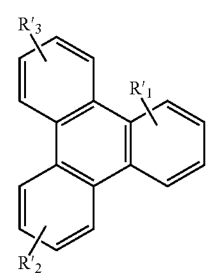

$R'_1$, $R'_2$, and $R'_3$ are independently selected from the group consisting of hydrogen, deuterium, alkyl, alkoxy, amino, alkenyl, alkynyl, arylkyl, aryl, and heteroaryl. Each of $R'_1$, $R'_2$, and $R'_3$ may represent mono, di, tri, or tetra substituents. The compound further comprises a benzofuran, benzothiophene, benzoselenophene, dibenzofuran, dibenzothiophene, or dibenzoselenophene moiety further comprising an additional aromatic or heteroaromatic ring fused to a benzo ring of the benzofuran, benzothiophene, benzoselenophene, dibenzofuran, dibenzothiophene, or dibenzoselenophene moiety.

In one aspect, the compound is selected from the group consisting of:

Formula 2

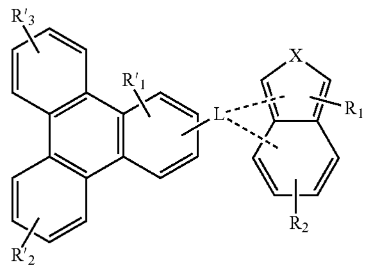

Formula 3

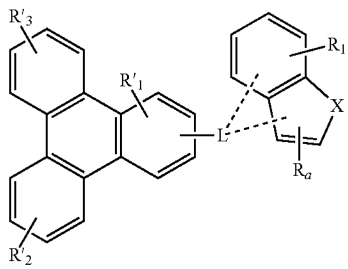

Formula 4

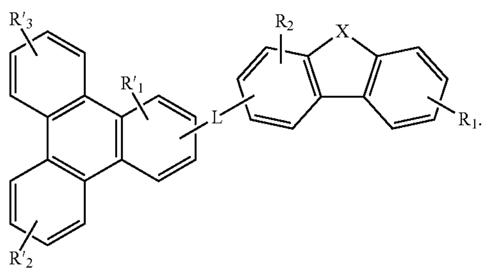

X is O, S or Se. $R_1$, $R_2$, and $R_a$ are independently selected from hydrogen, deuterium, alkyl, alkoxy, amino, alkenyl, alkynyl, arylkyl, aryl, and heteroaryl. Each of $R_1$ and $R_2$ may represent mono, di, tri or tetra substituents. At least two substituents of $R_1$ or $R_2$ are joined to form a fused ring. $R_a$ represents mono or di substituents which cannot fuse to form a benzo ring. L represents a spacer or a direct connection to the benzofuran, benzothiophene, or benzoselenophene moiety with additional fused rings.

In one aspect, the organic layer is an emissive layer and the compound having Formula I is the host. In another aspect, the organic layer further comprises an emissive compound. In yet another aspect, the emissive compound is a transition metal complex having at least one ligand selected from the group consisting of:

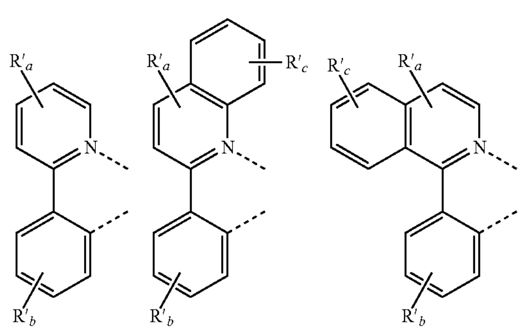

-continued

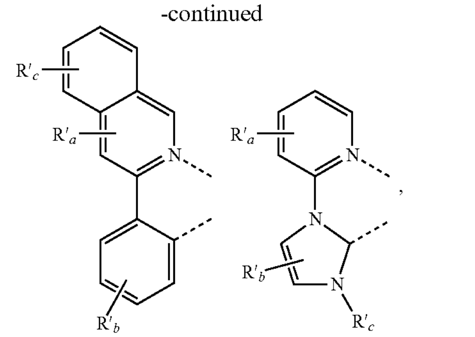

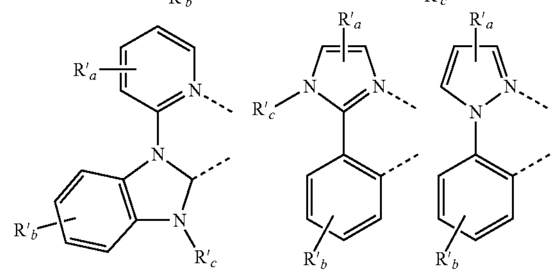

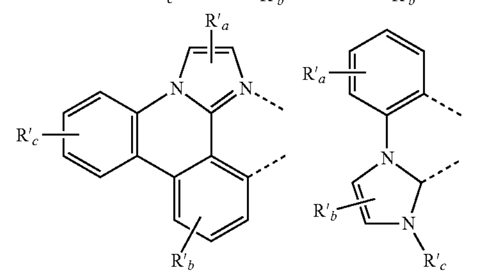

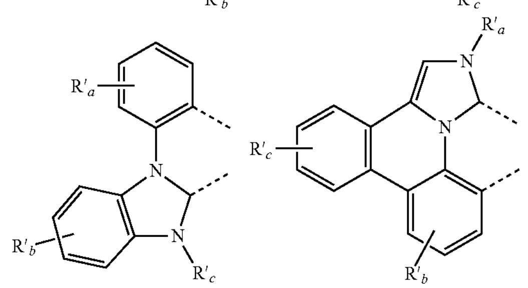

Each of $R'_1$, $R'_b$ and $R'_c$ may represent mono, di, tri, or tetra substituents. Each of $R'_a$, $R'_b$ and $R'_c$ are independently selected from a group consisting of hydrogen, deuterium, alkyl, heteroalkyl, aryl, or heteroaryl. Two adjacent substituents may form into a ring.

In another aspect, the device comprises a second organic layer that is non-emissive, and the compound comprising Formula I is a non-emissive material in the second organic layer.

In one aspect, the first device is an organic light emitting device. In another aspect, the first device is a consumer product.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
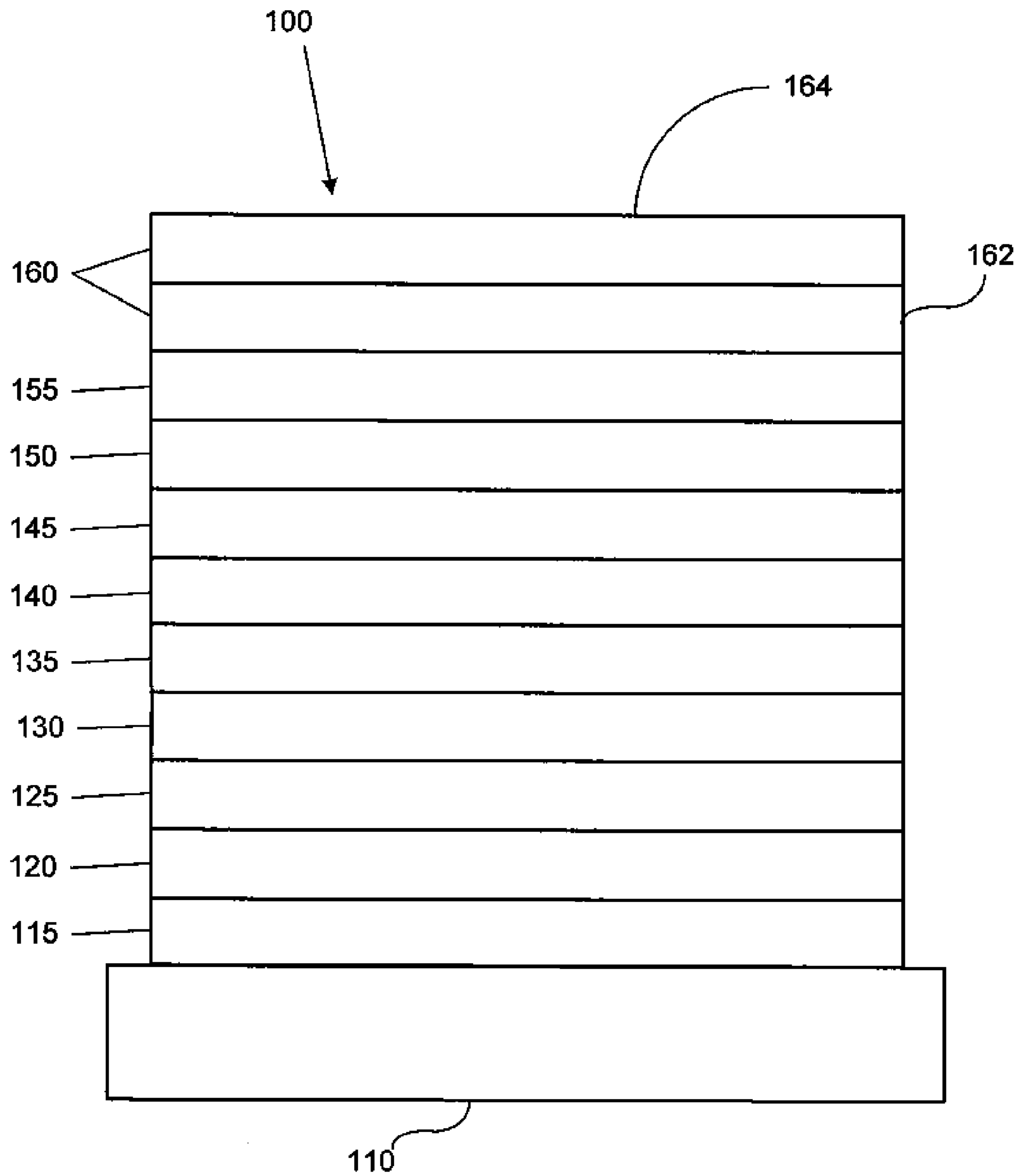
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
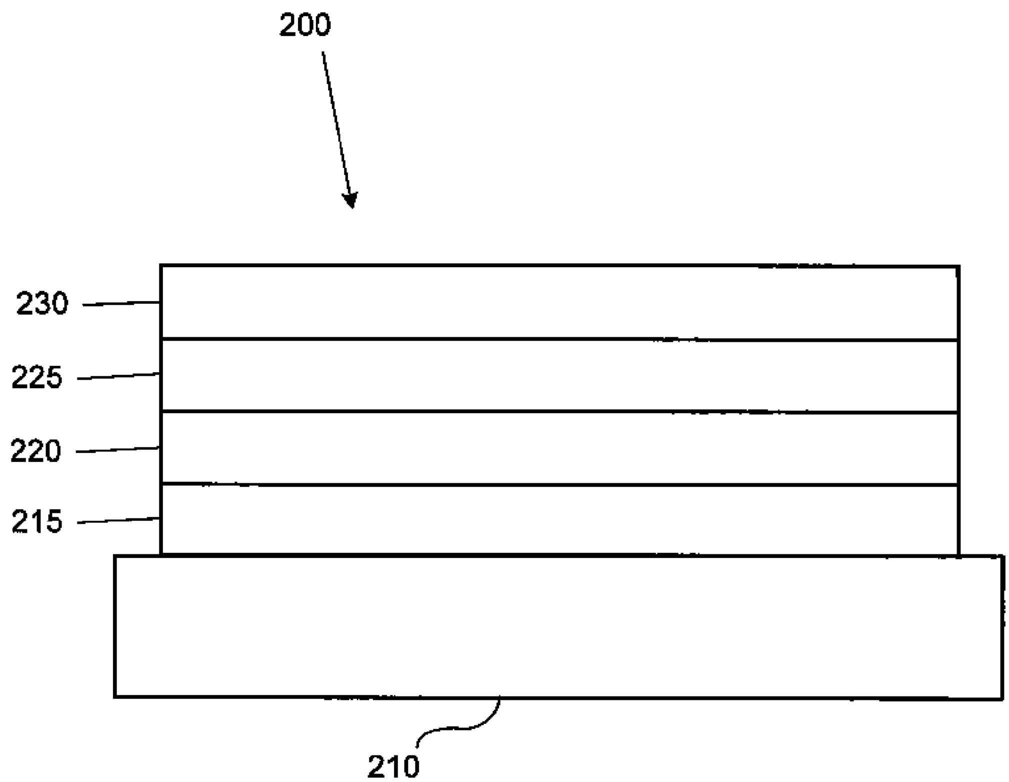
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Compounds are provided, comprising a triphenylene-containing benzo-fused furan, thiophene or selenophene. Triphenylene is a polyaromatic hydrocarbon with high triplet energy, yet high π-conjugation and a relatively small energy difference between the first singlet and first triplet levels. This suggests that triphenylene has relatively easily accessible HOMO and LUMO levels compared to other aromatic compounds with similar triplet energy (e.g., biphenyl). The advantage of using triphenylene and its derivatives as hosts is that it can accommodate red, green and even blue phosphorescent dopants to give high efficiency without energy quenching. Triphenylene hosts may be used to provide high efficiency and stability PHOLEDs. See Kwong and Alleyene, Triphenylene Hosts in Phosphorescent Light Emitting Diodes, US 2006/0280965, which is herein expressly incorporated by reference in its entirety.

Benzo-fused thiophenes may be used as hole transporting organic conductors. In addition, the triplet energies of benzothiophenes, namely dibenzo[b,d]thiophene (referred to herein as "dibenzothiophene"), benzo[b]thiophene and benzo[c]thiophene are relatively high.

Compounds having a combination of benzo-fused thiophenes and triphenylene may be beneficially used as hosts in PHOLEDs. More specifically, benzo-fused thiophenes are typically more hole transporting than electron transporting, while triphenylene is more electron transporting than hole transporting. Therefore, combining these two moieties in one molecule may offer improved charge balance, which may improve device performance in terms of lifetime, efficiency and low voltage.

Different chemical linkage of the two moieties can be used to tune the properties of the resulting compound to make it the most appropriate for a particular phosphorescent emitter, device architecture, and/or fabrication-process. For example, m-phenylene linkage is expected to result in higher triplet energy and higher solubility whereas p-phenylene linkage is expected to result in lower triplet energy and lower solubility.

Similar to the characterization of benzo-fused thiophenes, benzo-fused furans are also typically hole transporting materials having relatively high triplet energy. Examples of benzo-fused furans include benzofuran and dibenzofuran. Therefore, a material containing both triphenylene and benzofuran may be advantageously used as host or hole blocking material in PHOLED. A compound containing both of these two groups may offer improved electron stabilization which may improve device stability and efficiency by lowering the voltage. The properties of the triphenylene containing benzofuran compounds may be tuned as necessary by using different chemical linkages to link the triphenylene and the benzofuran.

It has been reported that organic light emitting devices containing compounds with a triphenylene moiety and a benzofuran, benzothiophene, or benzoselenophene moiety provide good performance and stability. See, e.g., WO2009021126 and WO2010036765. Devices incorporating triphenylene-benzofuran/benzothiophene/benzoselenophene with additional fused rings may also show good performance and stability, particularly if the fused rings are aromatic or heteroaromatic rings, because the aromatic fused rings increase the conjugation of the compound, leading to more extended π-electron delocalization and stabilization of charge in the oxidized or reduced state of the molecule.

Figure 3:
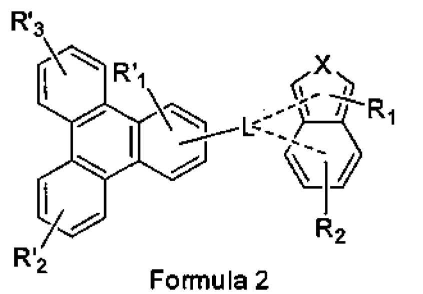
FIG. 3 shows compounds comprising a triphenylene moiety and a benzo- or dibenzo-moiety further substituted with a fused substituent.
Figure 3:
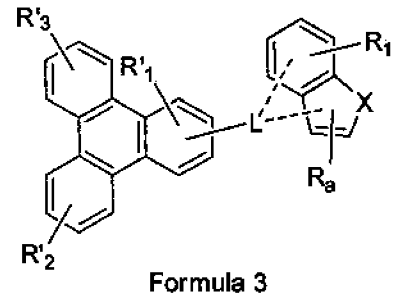
Figure 3:
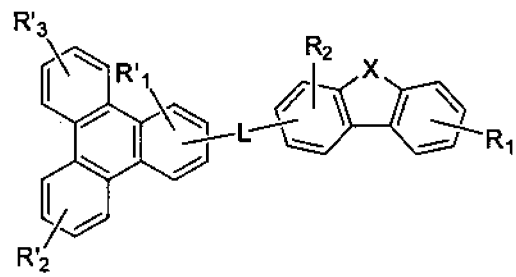

Compounds comprising a triphenylene moiety and a benzo- or dibenzo-furan, benzo- or dibenzo-thiophene, or benzo- or dibenzo-selenophene moiety with fused substituents are provided (illustrated in FIG. 3). The compounds comprise the formula:

Formula I

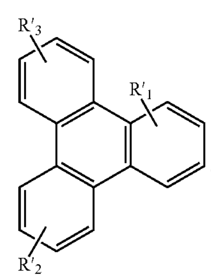

$R'_1$, $R'_2$, and $R'_3$ are independently selected from the group consisting of hydrogen, deuterium, alkyl, alkoxy, amino, alkenyl, alkynyl, arylkyl, aryl, and heteroaryl. Each of $R'_1$, $R'_2$, and $R'_3$ may represent mono, di, tri, or tetra substituents. The compound further comprises a benzofuran, benzothiophene, benzoselenophene, dibenzofuran, dibenzothiophene, or dibenzoselenophene moiety further comprising an additional aromatic or heteroaromatic ring fused to a benzo ring of the benzofuran, benzothiophene, benzoselenophene, dibenzofuran, dibenzothiophene, or dibenzoselenophene moiety.

In one aspect, the aromatic or heteroaromatic ring is a 6-membered carbocyclic or heterocyclic. In another aspect, the aromatic ring is a benzene ring.

In one aspect, the compound is selected from the group consisting of:

Formula 2

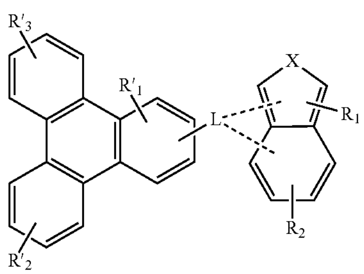

Formula 3

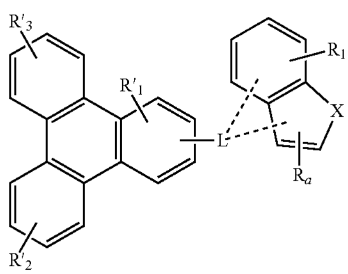

Formula 4

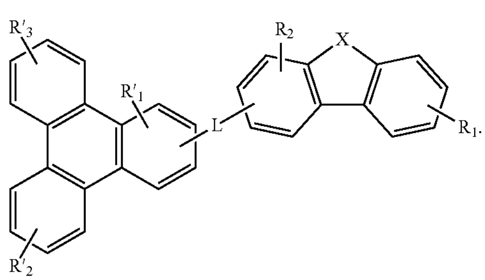

X is O, S or Se. In one aspect, X is S. In another aspect, X is O. $R_1$, $R_2$, and $R_a$ are independently selected from hydrogen, deuterium, alkyl, alkoxy, amino, alkenyl, alkynyl, arylkyl, aryl, and heteroaryl. Each of $R_1$ and $R_2$ may represent mono, di, tri or tetra substituents. At least two substituents of $R_1$ or $R_2$ are joined to form a fused ring. $R_a$ represents mono or di substituents which cannot fuse to form a benzo ring. L represents a spacer or a direct connection to the benzofuran, benzothiophene, or benzoselenophene moiety with additional fused rings.

Preferably, the compound has the formula:

Formula 4

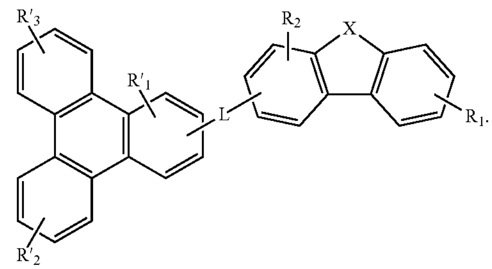

In one aspect, L is a direct connection. In another aspect, L is a spacer having the formula:

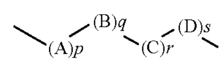

A, B, C and D are independently selected from the group consisting of:

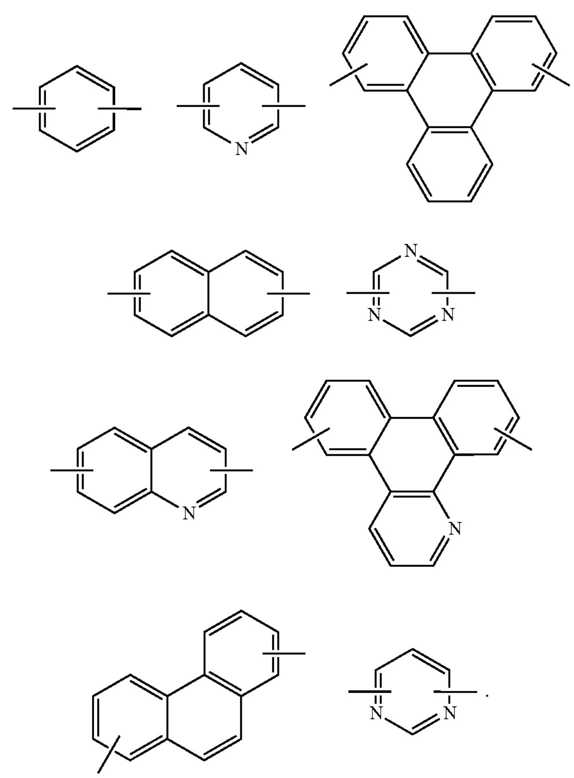

A, B, C and D are optionally further substituted with $R_a$. Each of p, q, r and s are 0, 1, 2, 3, or 4. p+q+r+s is at least 1. Preferably, L is phenyl.

In one aspect, the benzofuran, benzothiophene, or benzoselenophene moiety with additional fused rings is selected from the group consisting of:

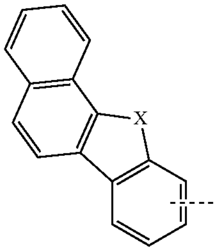
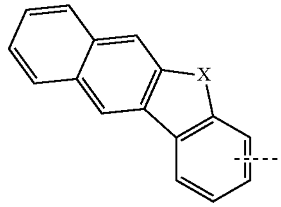
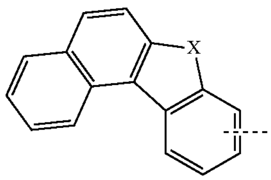
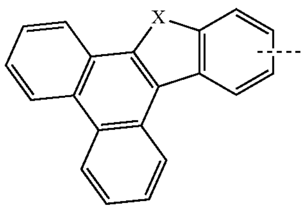
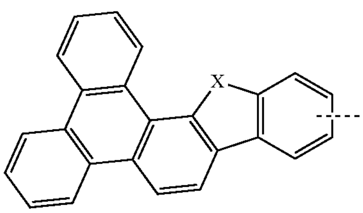
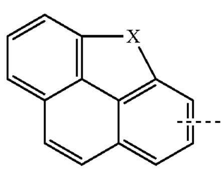
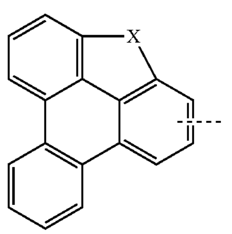
Examples of the compounds are provided, and include compounds selected from the group consisting of:
Formula 4-1
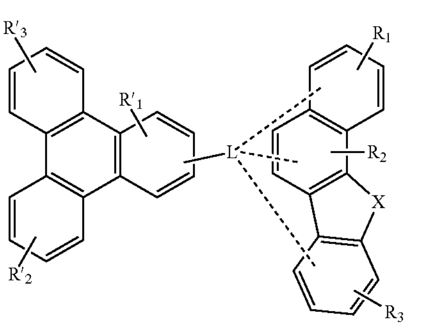
-continued
Formula 4-2
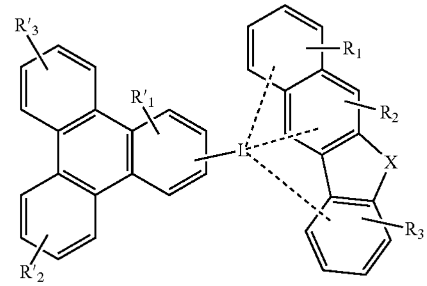
Formula 4-3
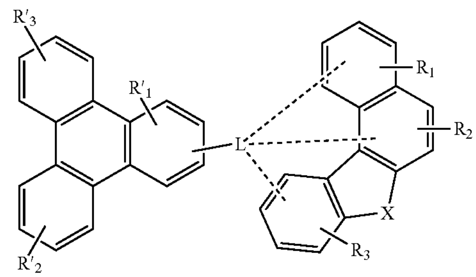
Formula 4-4
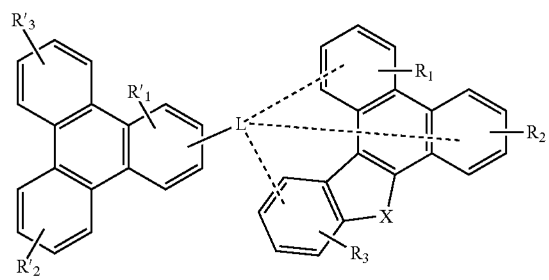
Formula 4-5
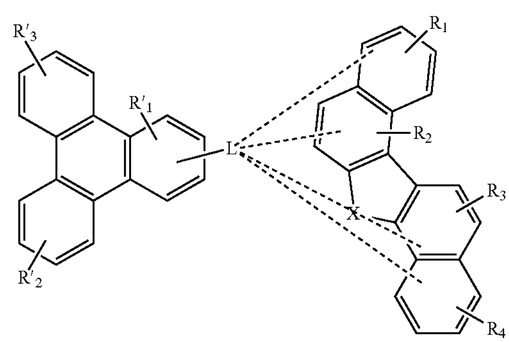
Fromula 4-6
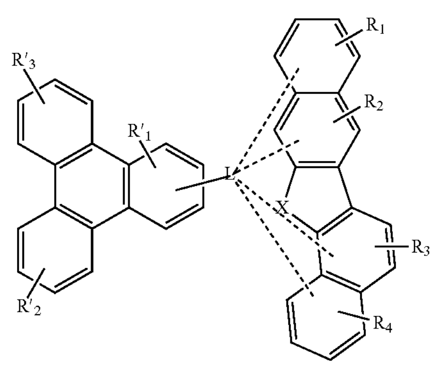

-continued
Formula 4-7
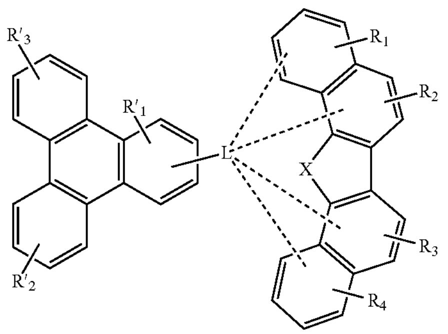
Formula 4-8
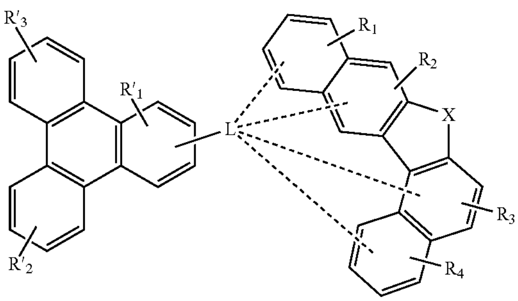
Formula 4-9
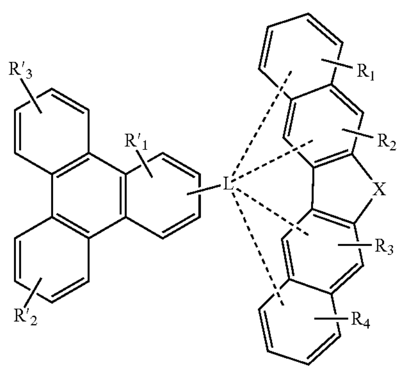
Formula 4-10
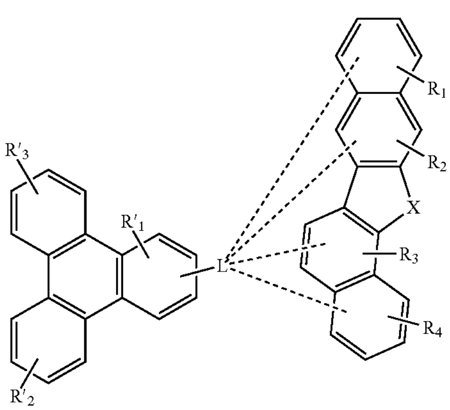
-continued
Formula 4-11
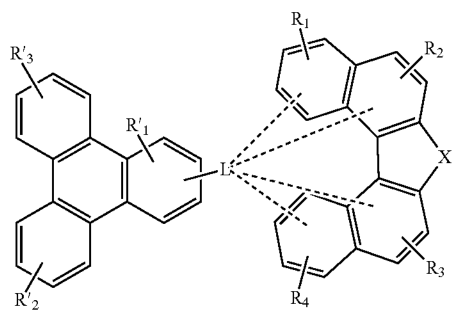
Formula 4-12
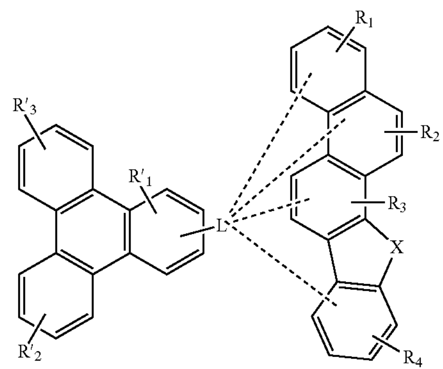
Formula 4-13
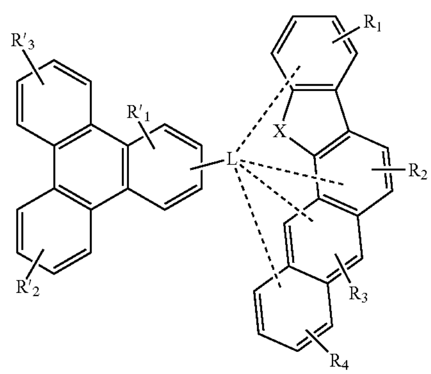
Formula 4-14
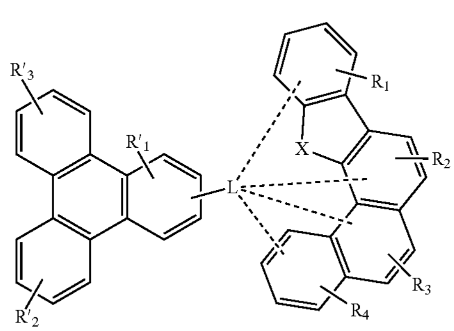

-continued
Formula 4-15
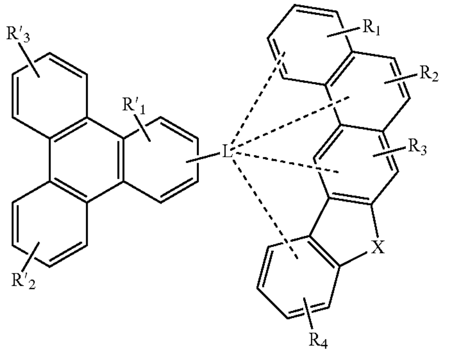
Formula 4-16
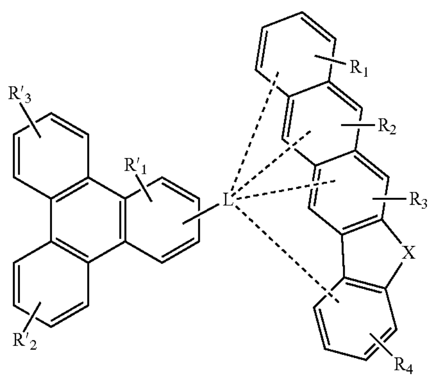
Formula 4-17
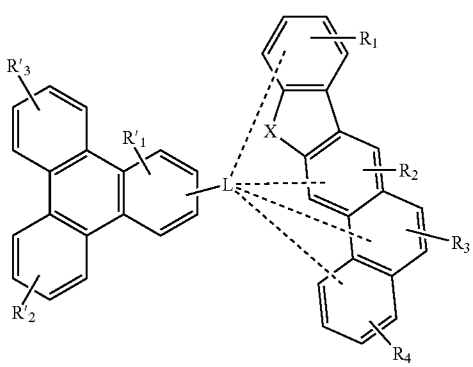
Formula 4-18
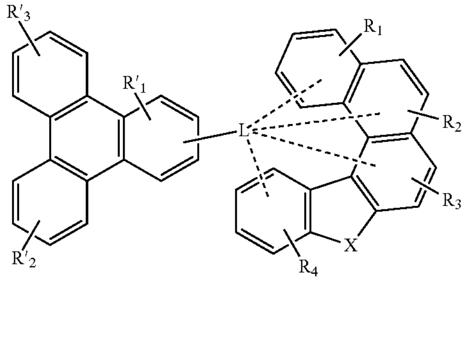
-continued
Formula 4-19
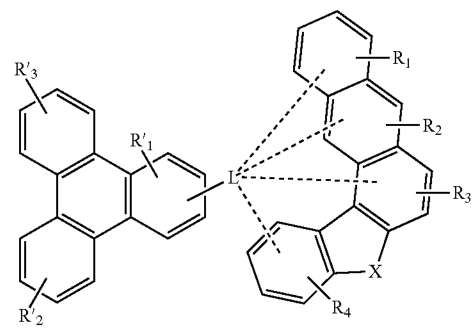
Formula 4-20
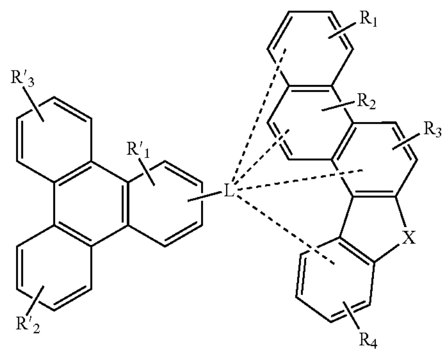
Formula 4-21
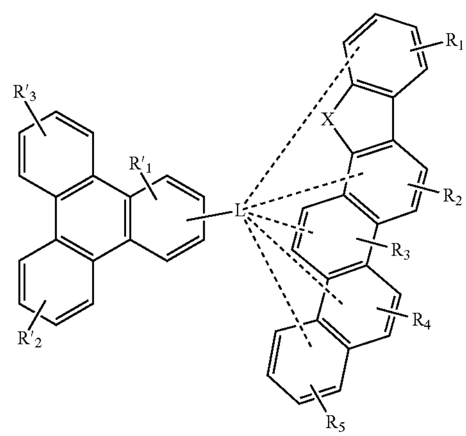
Formula 4-22
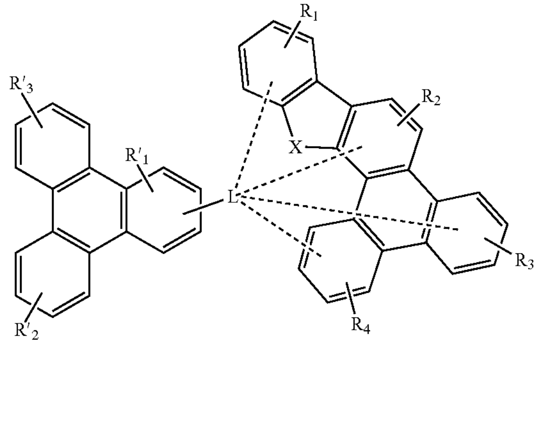

-continued

Formula 4-23

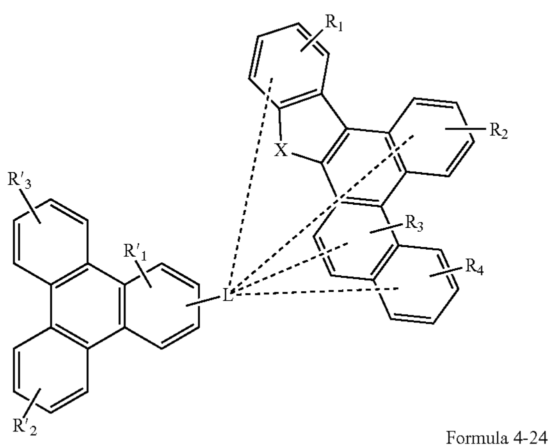

Formula 4-24

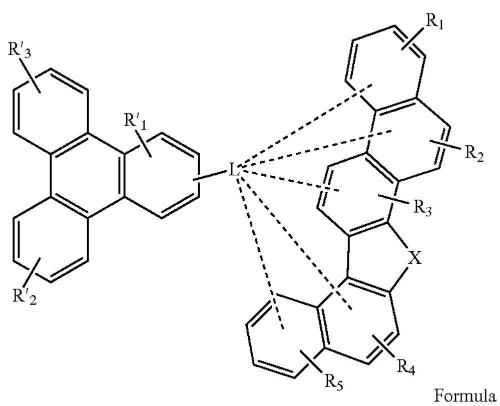

Formula 4-25

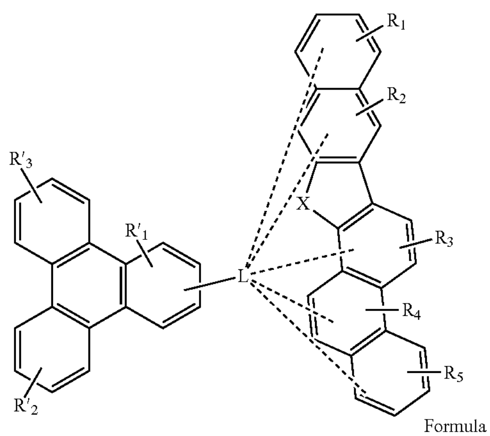

Formula 4-26

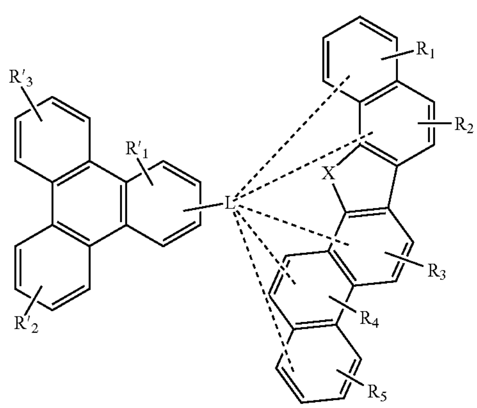

-continued

Formula 4-27

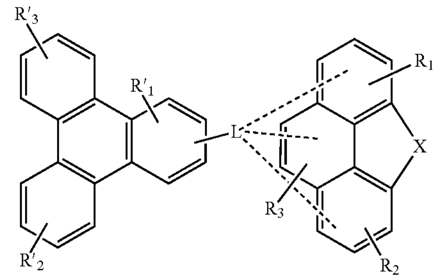

Formula 4-28

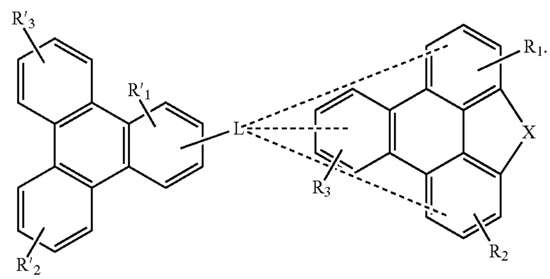

X is O, S or Se. $R_1$, $R_2$, $R_3$, $R_4$, $R_5$, $R'_1$, $R'_2$, and $R'_3$ are independently selected from the group consisting of hydrogen, deuterium, alkyl, alkoxy, amino, alkenyl, alkynyl, arylkyl, aryl, and heteroaryl. Each of $R_1$, $R_2$, $R_3$, $R_4$, $R_5$, $R'_1$, $R'_2$, and $R'_3$ may represent mono, di, tri or tetra substituents. L is a spacer or a direct linkage.

Specific examples of the compounds provided, include compounds selected from the group consisting of:

Compound 1

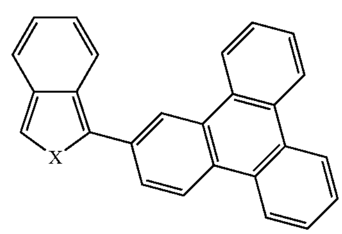

Compound 2

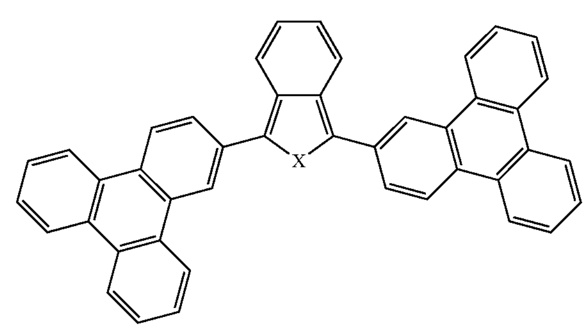

-continued
Compound 3
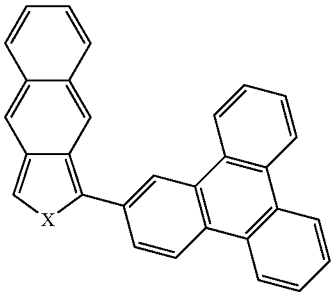
Compound 4
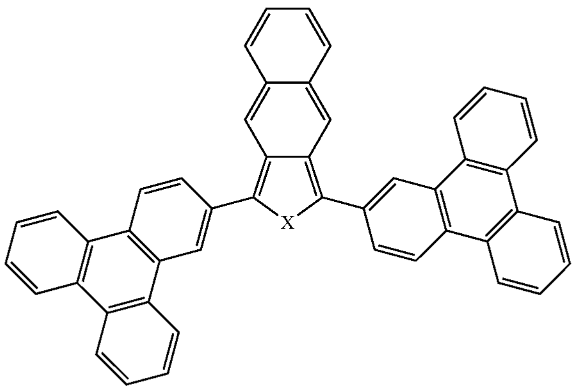
Compound 5
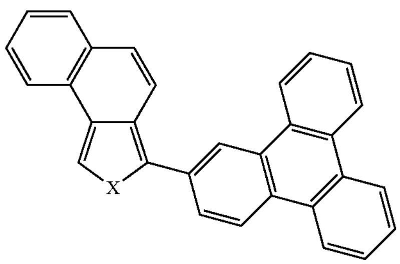
Compound 6
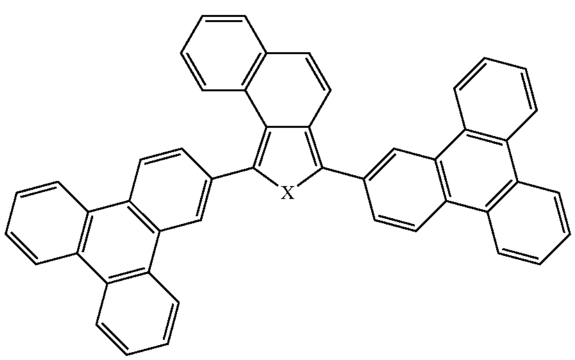
Compound 7
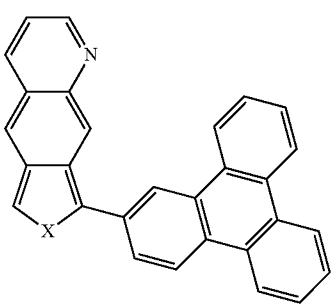
-continued
Compound 8
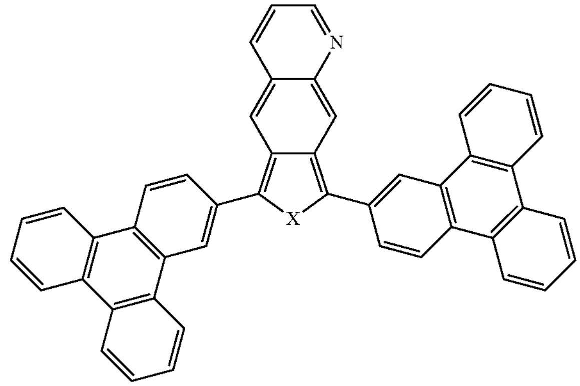
Compound 9
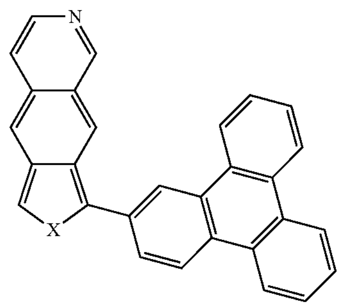
Compound 10
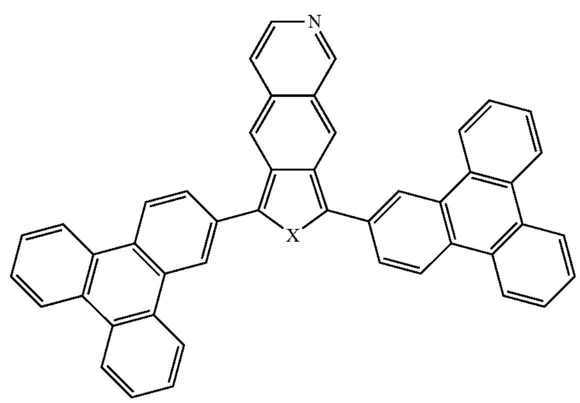
Compound 11
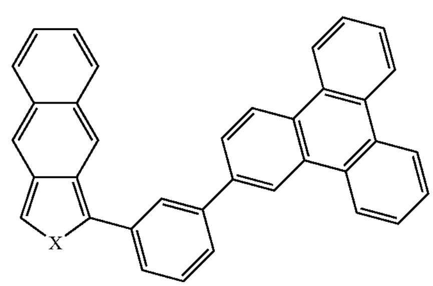

-continued
Compound 12
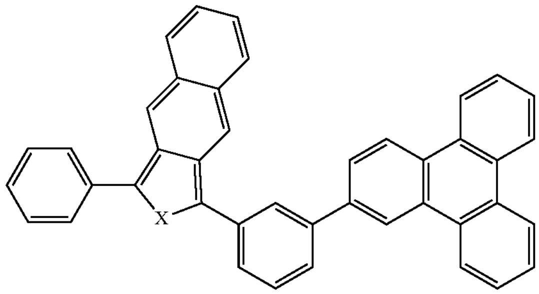
Compound 13
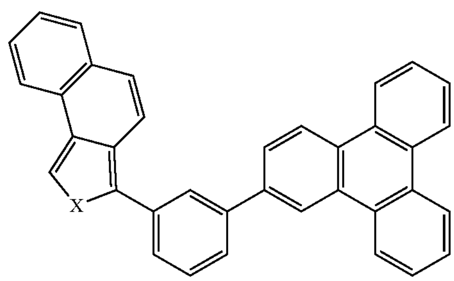
Compound 14
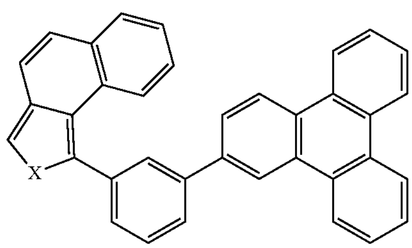
Compound15
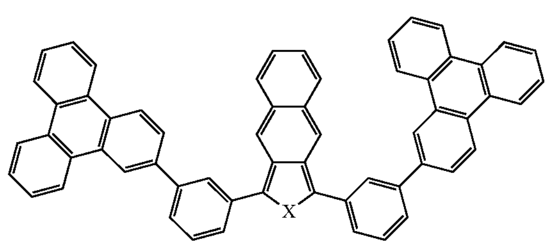
Compound 16
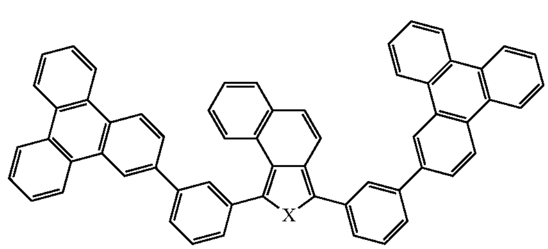
-continued
Compound 17
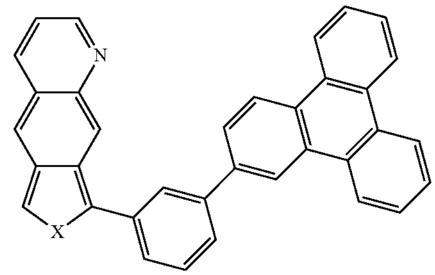
Compound 18
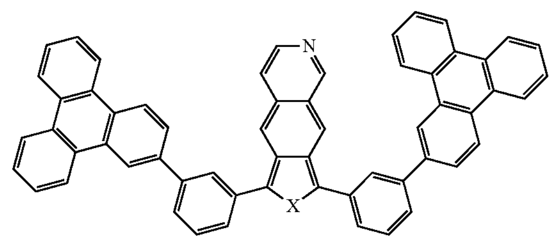
Compound 19
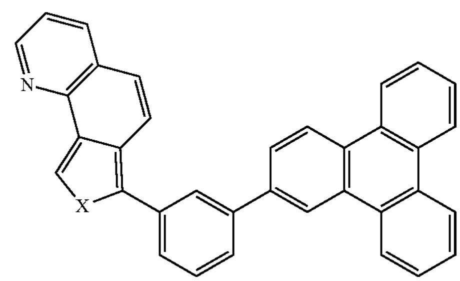
Compound 20
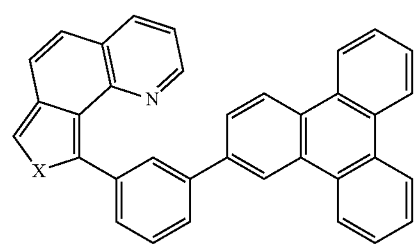
Compound 21
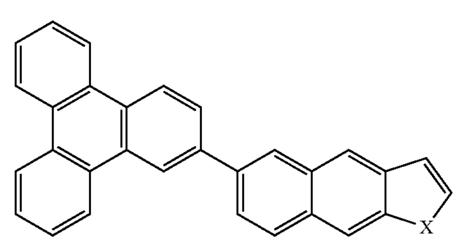

-continued
Compound 22
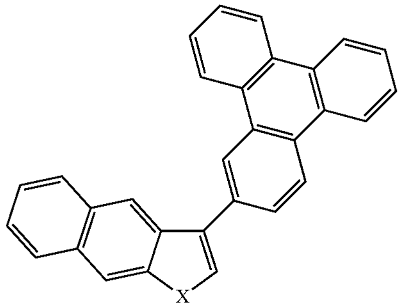
Compound 23
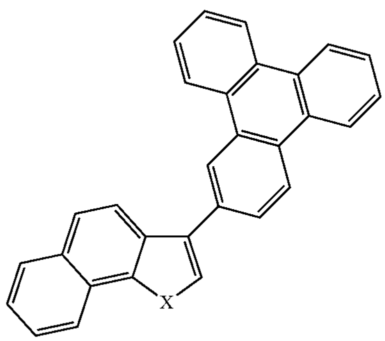
Compound 24
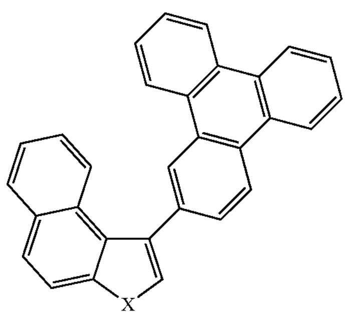
Compound 25
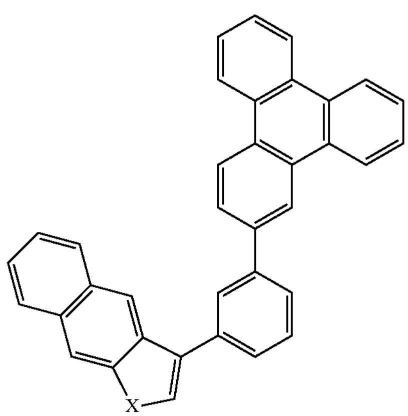
-continued
Compound 26
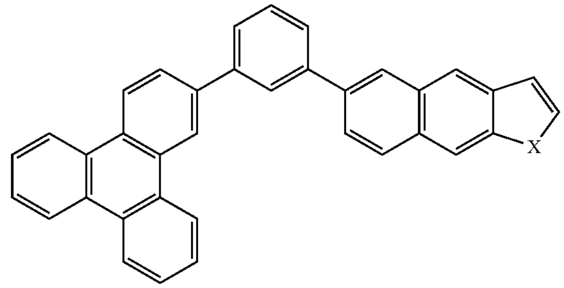
Compound 27
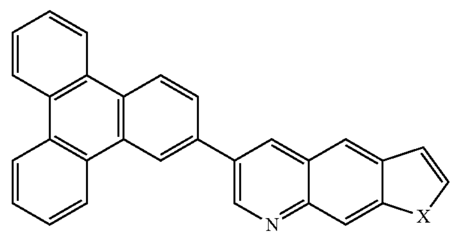
Compound 28
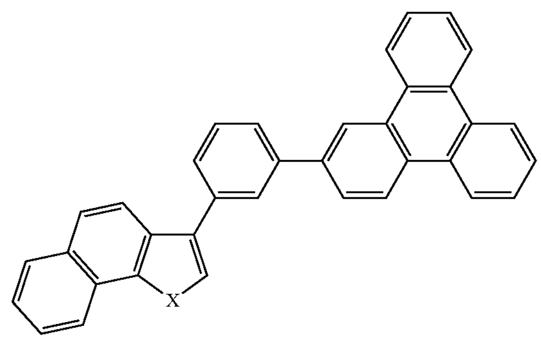
Compound 29
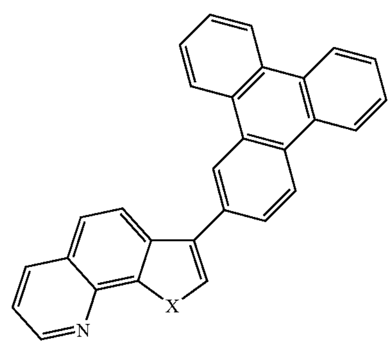
Compound 30
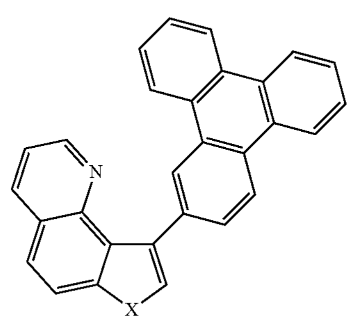

Compound 31
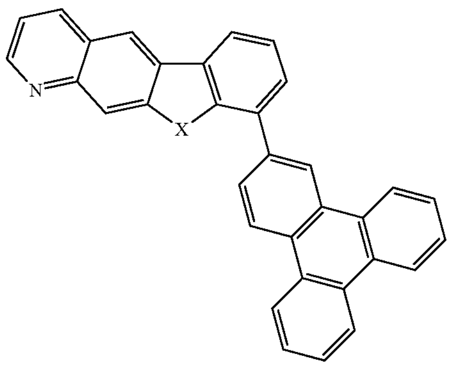
Compound 32
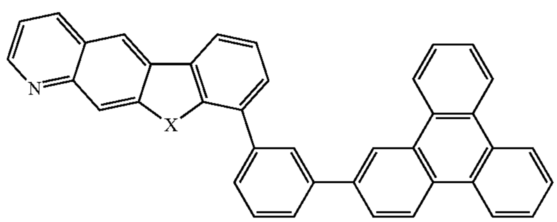
Compound 33
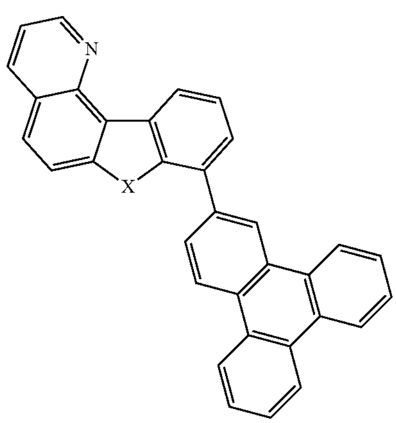
Compound 34
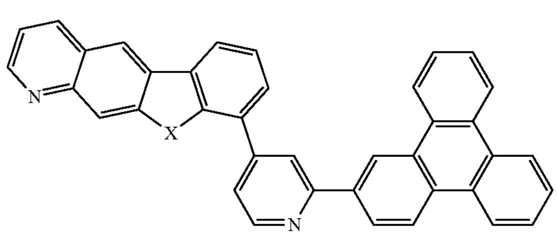
Compound 35
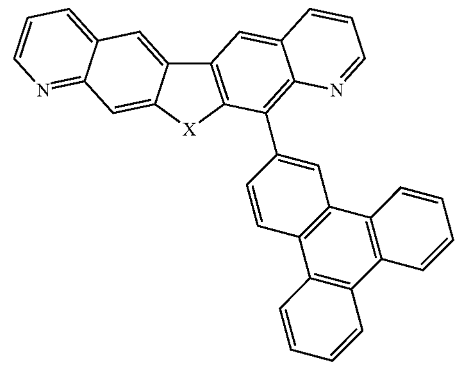
Compound 36
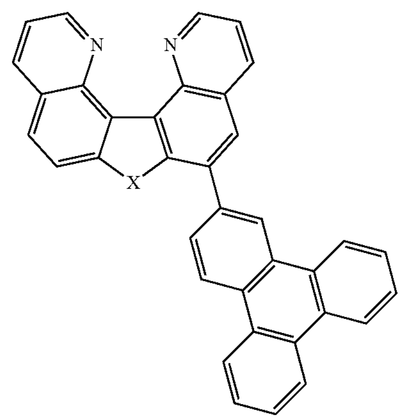
Compound 37
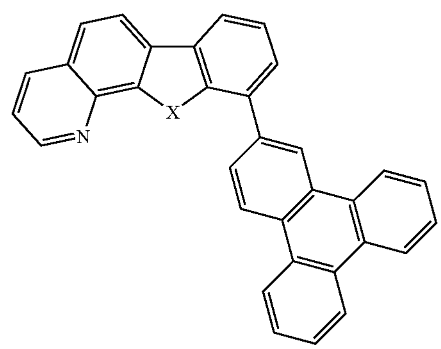
Compound 38
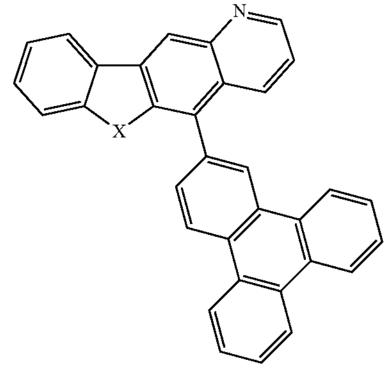

-continued
Compound 39
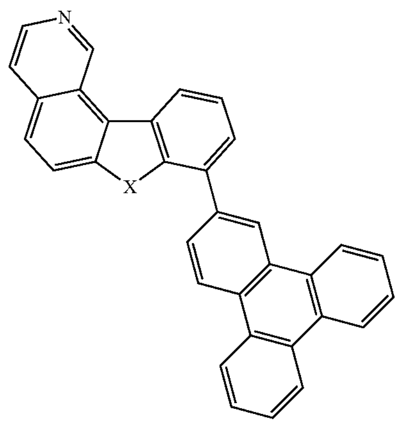
Compound 40
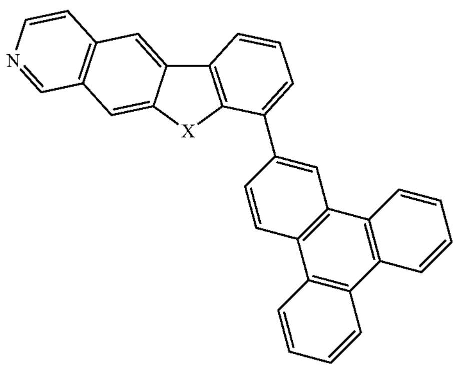
Compound 41
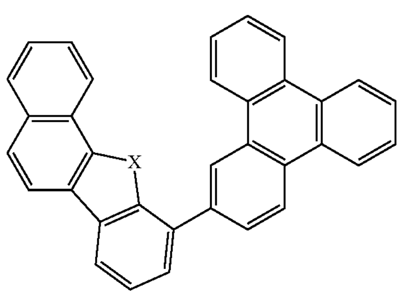
Compound 42
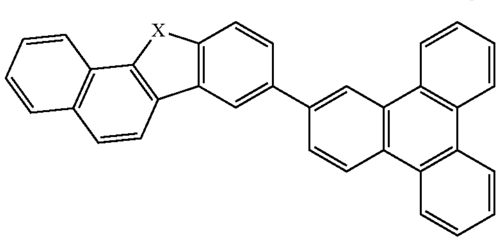
-continued
Compound 43
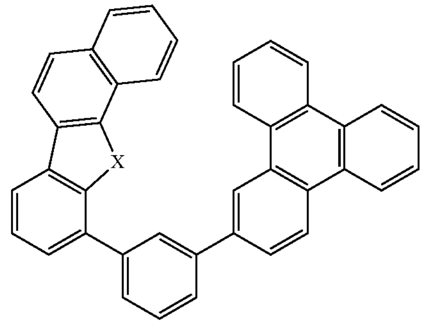
Compound 44
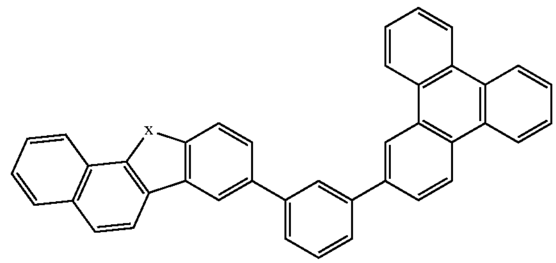
Compound 45
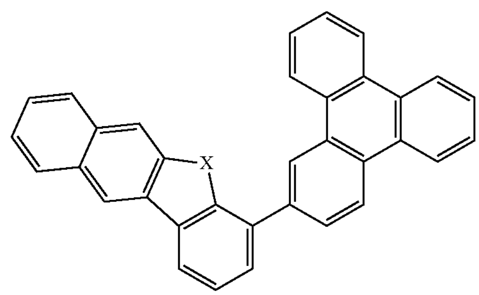
Compound 46
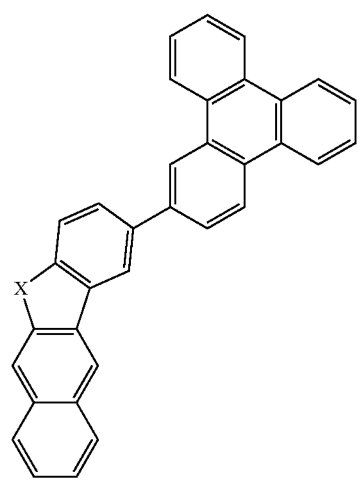

Compound 47
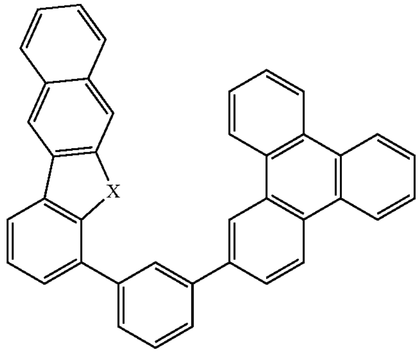
Compound 48
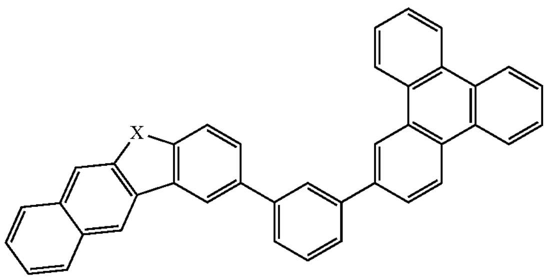
Compound 49
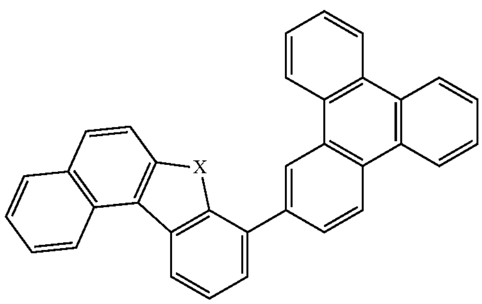
Compound 50
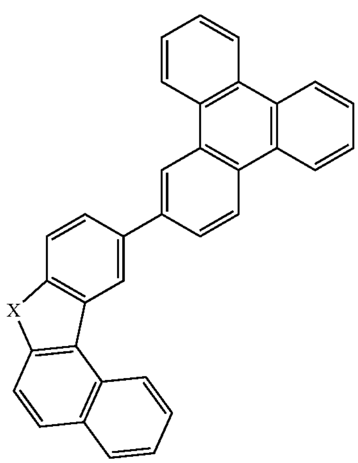
Compound 51
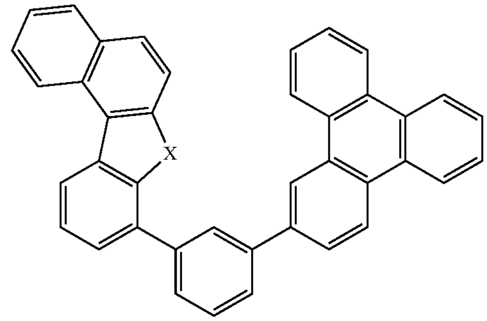
Compound 52
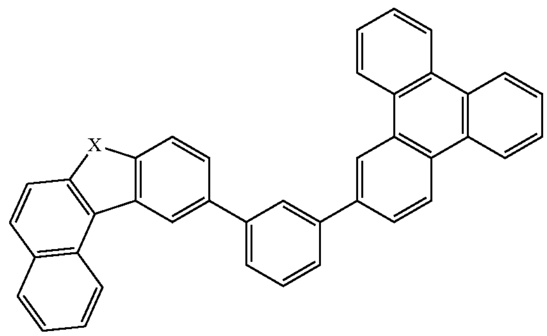
Compound 53
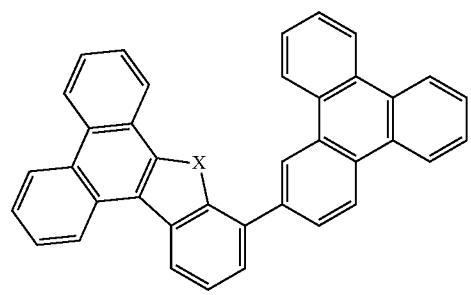
Compound 54
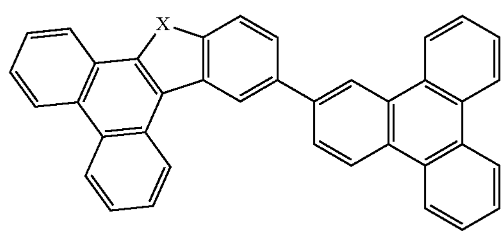
Compound 55
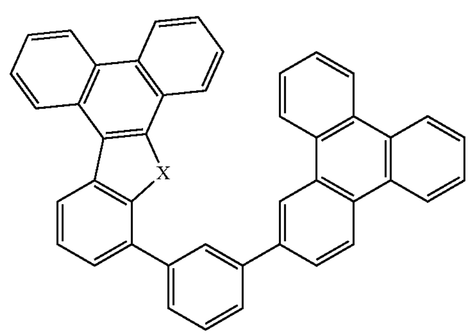

Compound 56
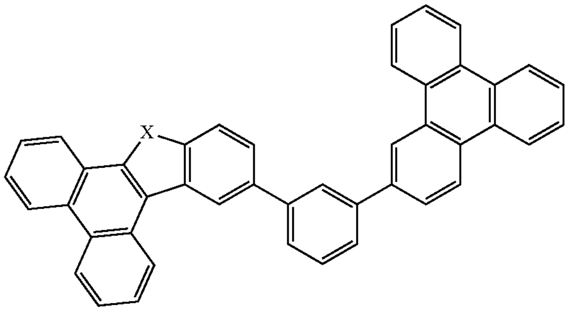
Compound 57
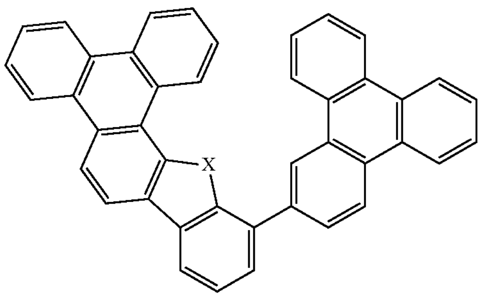
Compound 58
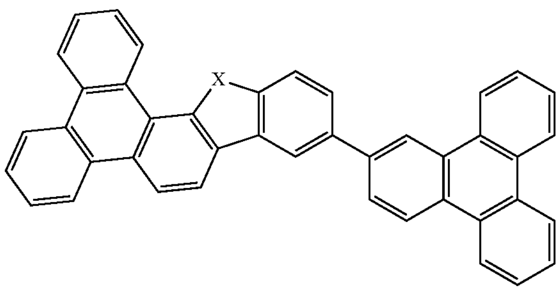
Compound 59
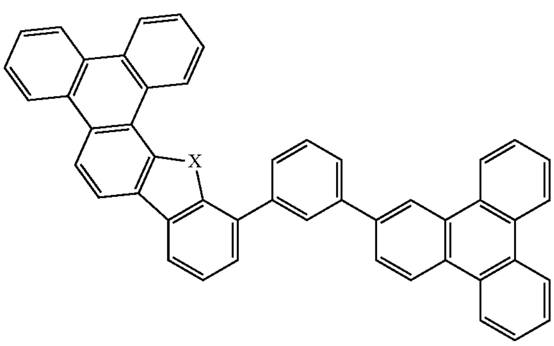
Coumpound 60
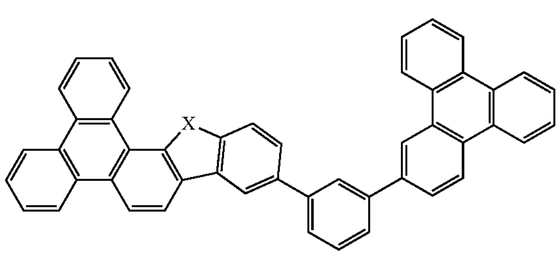
Compound 61
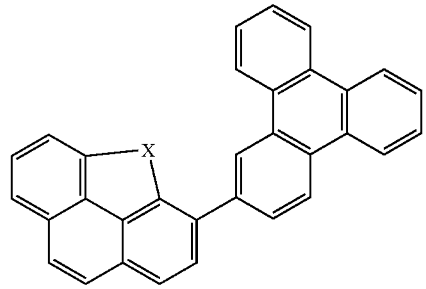
Compound 62
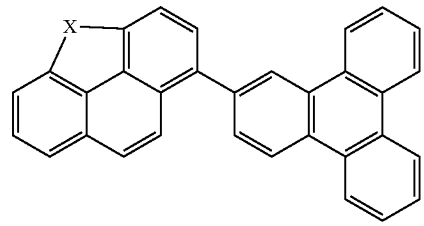
Compound 63
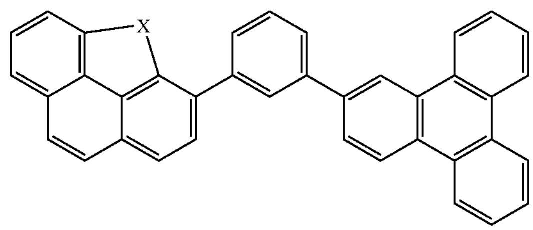
Compound 64
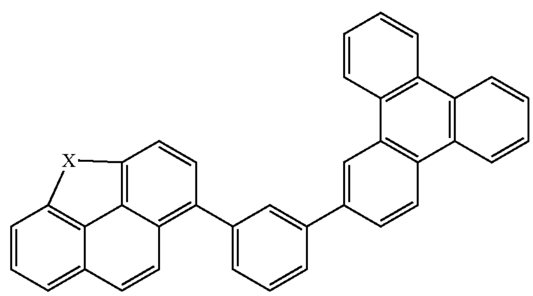
Compound 65
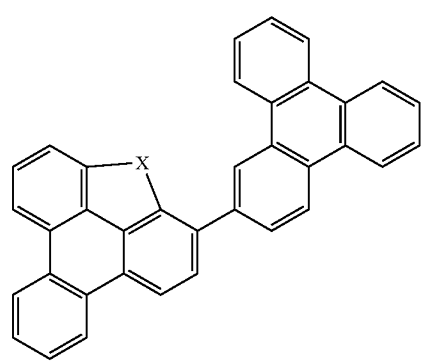

-continued

Compound 66

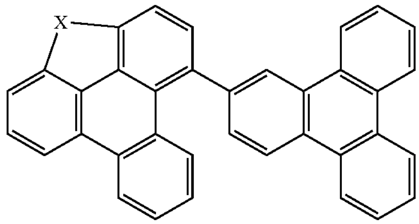

Compound 67

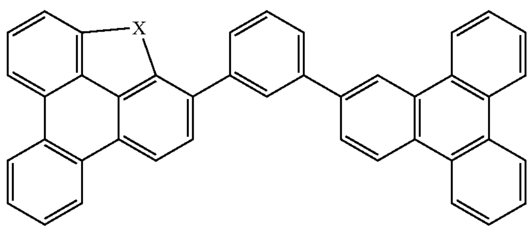

Compound 68

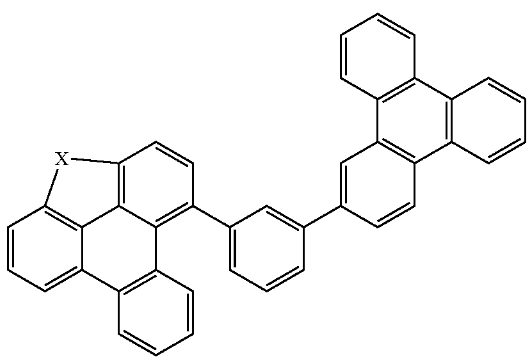

Compound 69

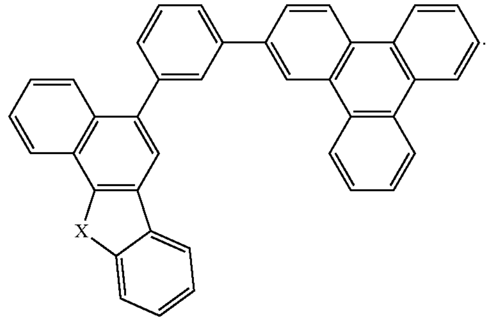

X is O, S, or Se.

Additionally, a first device comprising an organic light emitting device is provided. The organic light emitting device further comprises an anode, a cathode, and an organic layer, disposed between the anode and the cathode. The organic layer comprises a compound comprising the formula:

Formula I

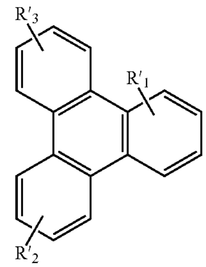

$R'_1$, $R'_2$, and $R'_3$ are independently selected from the group consisting of hydrogen, deuterium, alkyl, alkoxy, amino, alkenyl, alkynyl, arylkyl, aryl, and heteroaryl. Each of $R'_1$, $R'_2$, and $R'_3$ may represent mono, di, tri, or tetra substituents. The compound further comprises a benzofuran, benzothiophene, benzoselenophene, dibenzofuran, dibenzothiophene, or dibenzoselenophene moiety further comprising an additional aromatic or heteroaromatic ring fused to a benzo ring of the benzofuran, benzothiophene, benzoselenophene, dibenzofuran, dibenzothiophene, or dibenzoselenophene moiety.

In one aspect, the compound is selected from the group consisting of:

Formula 2

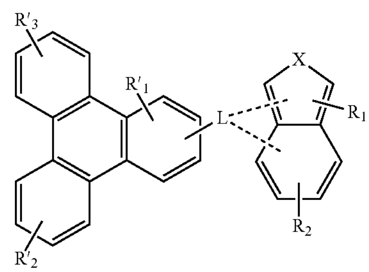

Formula 3

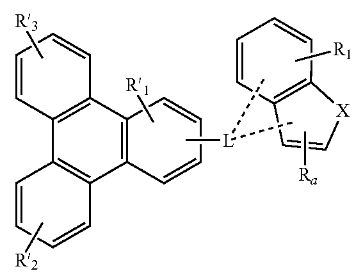

Formula 4

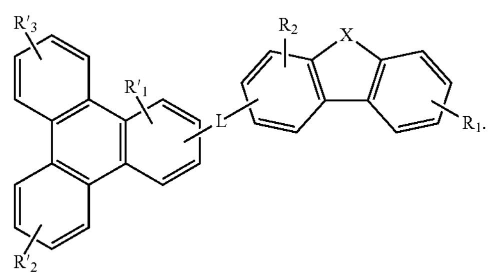

X is O, S or Se. $R_1$, $R_2$, and $R_a$ are independently selected from hydrogen, deuterium, alkyl, alkoxy, amino, alkenyl, alkynyl, arylkyl, aryl, and heteroaryl. Each of $R_1$ and $R_2$ may represent mono, di, tri or tetra substituents. At least two substituents of $R_1$ or $R_2$ are joined to form a fused ring. $R_a$ represents mono or di substituents which cannot fuse to form a benzo ring. L represents a spacer or a direct connection to the benzofuran, dibenzofuran, benzothiophene, dibenzothiophene, benzoselenophene or dibenzoselenophene moiety with additional fused rings.

In one aspect, the organic layer is an emissive layer and the compound comprising Formula I is the host. In another aspect, the organic layer further comprises an emissive compound. In yet another aspect, the emissive compound is a transition metal complex having at least one ligand selected from the group consisting of:

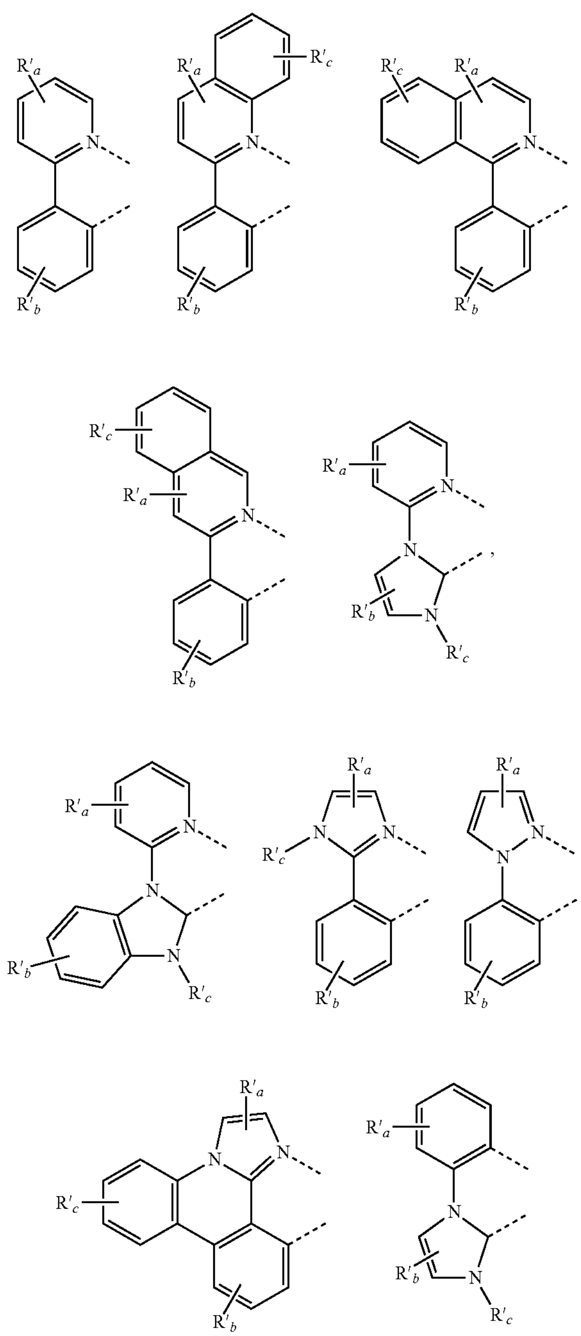

-continued

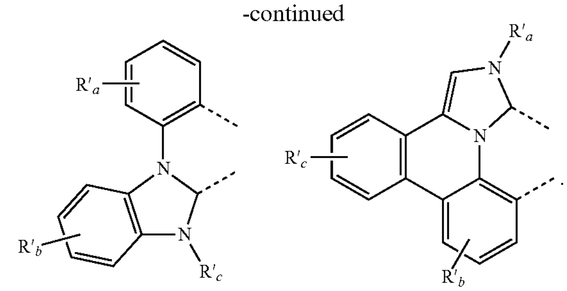

Each of $R'_a$, $R'_b$ and $R'_c$ may represent mono, di, tri, or tetra substituents. Each of $R'_a$, $R'_b$ and $R'_c$ are independently selected from a group consisting of hydrogen, deuterium, alkyl, heteroalkyl, aryl, or heteroaryl. Two adjacent substituents may form into a ring.

In another aspect, the device comprises a second organic layer that is non-emissive, and the compound comprising Formula I is a non-emissive material in the second organic layer.

In one aspect, the first device is an organic light emitting device. In another aspect, the first device is a consumer product.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in embodiments of the present invention is not particularly limited, and any compound may be used as long as the compound is typically used as a hole injecting/transporting material. Examples of the material include, but are not limited to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and slime derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but are not limited to the following general structures:

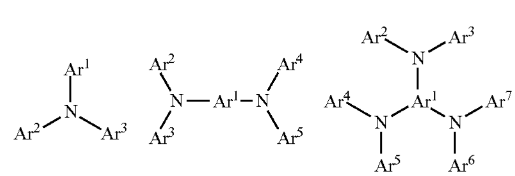

-continued

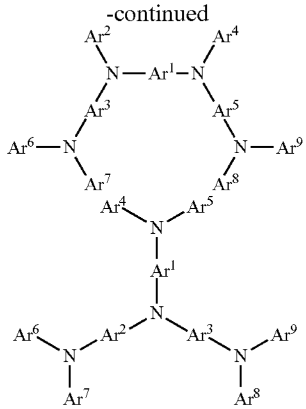

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, alkyl, alkoxy, amino, alkenyl, alkynyl, arylalkyl, heteroalkyl, aryl and heteroaryl.

In one aspect, $Ar^1$ to $Ar^9$ is independently selected from the group consisting of:

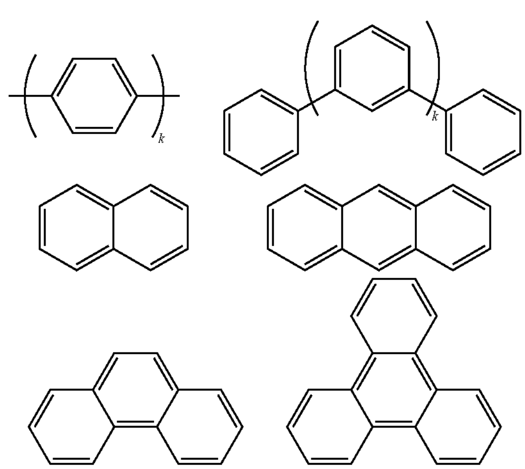

-continued

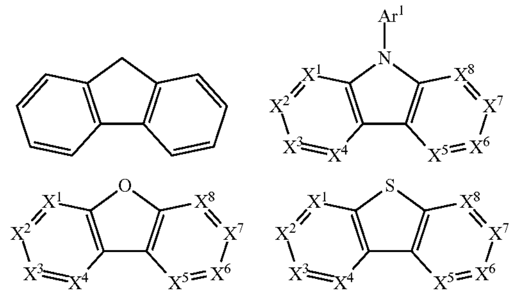

k is an integer from 1 to 20; $X^1$ to $X^8$ is CH or N; $Ar^1$ has the same group defined above.

Examples of metal complexes used in HIL or HTL include, but not limit to the following general formula:

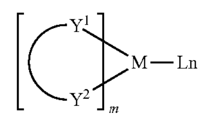

M is a metal, having an atomic weight greater than 40; ($Y^1$-$Y^2$) is a bidentate ligand, $Y^1$ and $Y^2$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, ($Y^1$-$Y^2$) is a 2-phenylpyridine derivative.

In another aspect, ($Y^1$-$Y^2$) is a carbene ligand.

In another aspect, M is selected from Ir, Pt, Os, and Zn.

In a further aspect, the metal complex has a smallest oxidation potential in solution vs. $Fc^+/Fc$ couple less than about 0.6 V.

Host:

The light emitting layer of the organic EL device in some embodiments of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant.

Examples of metal complexes used as host are preferred to have the following general formula:

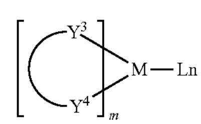

M is a metal; ($Y^3$-$Y^4$) is a bidentate ligand, $Y^3$ and $Y^4$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, the metal complexes are:

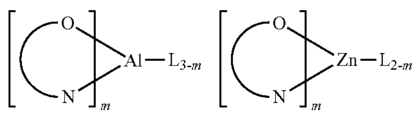

(O—N) is a bidentate ligand, having metal coordinated to atoms O and N.

In another aspect, M is selected from Ir and Pt.

In a further aspect, ($Y^3$-$Y^4$) is a carbene ligand.

Examples of organic compounds used as hosts are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, alkyl, alkoxy, amino, alkenyl, alkynyl, arylalkyl, heteroalkyl, aryl and heteroaryl.

In one aspect, the host compound contains at least one of the following groups in the molecule:

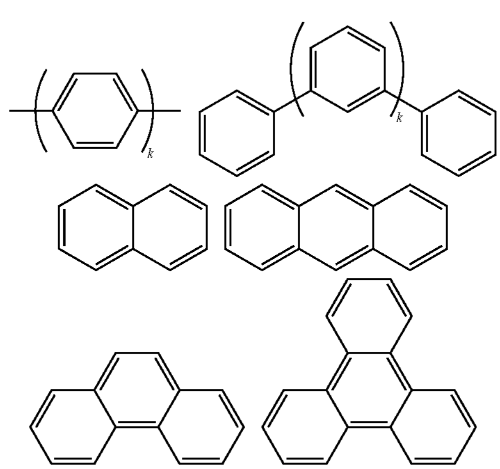

-continued

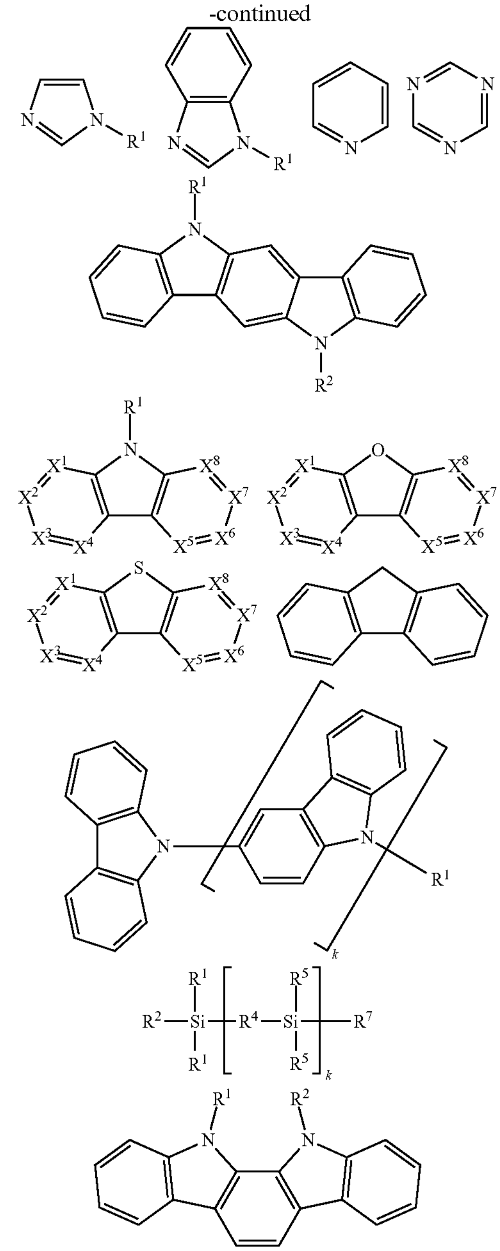

$R^1$ to $R^7$ is independently selected from the group consisting of hydrogen, deuterium, alkyl, alkoxy, amino, alkenyl, alkynyl, arylalkyl, heteroalkyl, aryl and heteroaryl, when it is aryl or heteroaryl, it has the similar definition as Ar's mentioned above.

k is an integer from 0 to 20.

$X^1$ to $X^8$ is selected from CH or N.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, the compound used in HBL contains the same molecule used as host described above.

In another aspect, the compound used in HBL contains at least one of the following groups in the molecule:

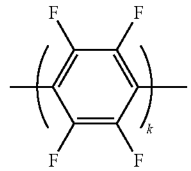
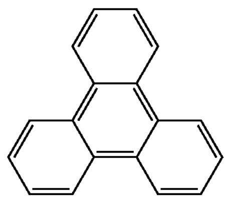
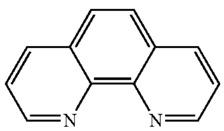
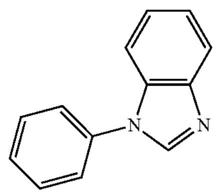
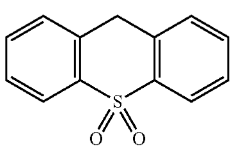
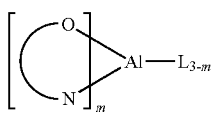

k is an integer from 0 to 20; L is an ancillary ligand, m is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, the compound used in ETL contains at least one of the following groups in the molecule:

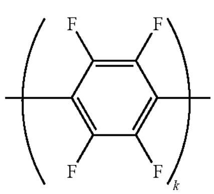
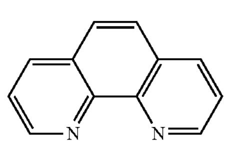
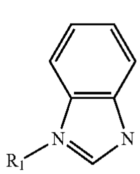
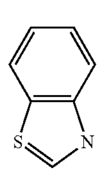
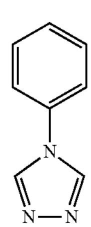
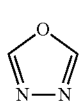

-continued

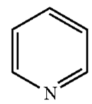
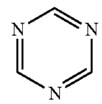
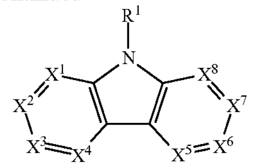
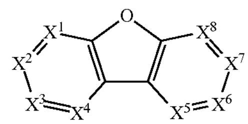
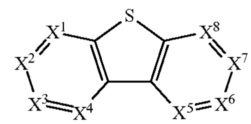
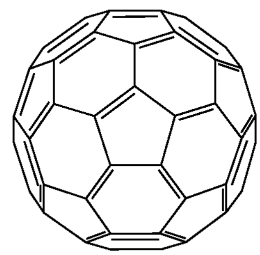
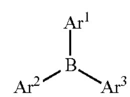

$R^1$ is selected from the group consisting of hydrogen, deuterium, alkyl, alkoxy, amino, alkenyl, alkynyl, arylalkyl, heteroalkyl, aryl and heteroaryl, when it is aryl or heteroaryl, it has the similar definition as Ar's mentioned above.

$Ar^1$ to $Ar^3$ has the similar definition as Ar's mentioned above.

k is an integer from 0 to 20.

$X^1$ to $X^8$ is selected from CH or N.

In another aspect, the metal complexes used in ETL contains, but not are limited to the following general formula:

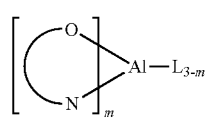
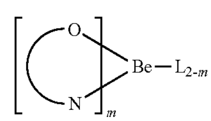
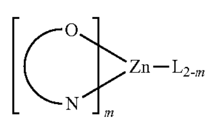
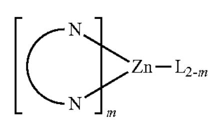

(O—N) or (N—N) is a bidentate ligand, having metal coordinated to atoms O, N or N, N; L is an ancillary ligand; m is an integer value from 1 to the maximum number of ligands that may be attached to the metal.

In any above-mentioned compounds used in each layer of OLED device, the hydrogen atoms can be partially or fully deuterated.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 1 below. Table 1 lists non-limiting classes of materials, non-limiting examples of compounds for each class, and references that disclose the materials.

TABLE 1

| MATERIAL | EXAMPLES OF MATERIAL | PUBLICATIONS |
| --- | --- | --- |
| | Hole injection materials | |
| Phthalocyanine and porphyrin compounds | 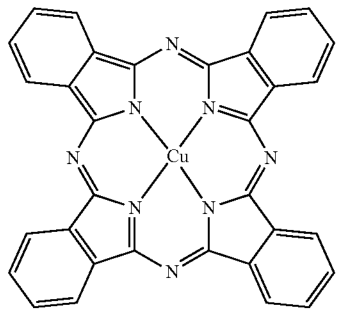 | Appl. Phys. Lett. 69, 2160 (1996) |
| Starburst triarylamines | 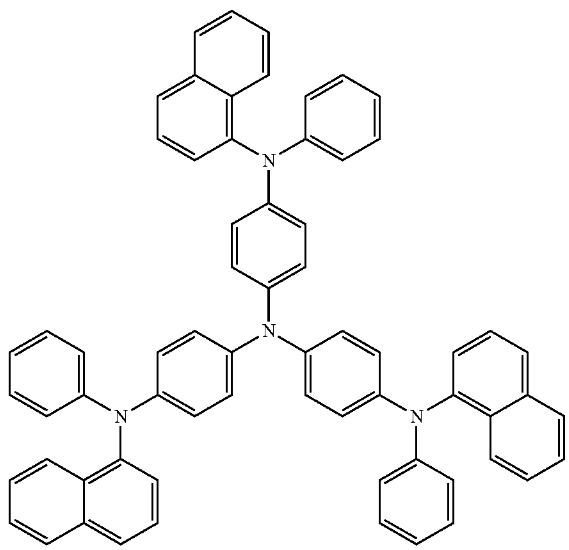 [SMILES: c1ccc(N(c2ccc(N(c3ccc(N(c4ccccc4)c4cccc5ccccc45)cc3)c3ccc(N(c4ccccc4)c4cccc5ccccc45)cc3)cc2)c2cccc3ccccc23)cc1] | J. Lumin. 72-74, 985 (1997) |
| $CF_x$ Fluorohydro-carbon polymer | $-[CH_xF_y]_n-$ | Appl. Phys. Lett. 78, 673 (2001) |
| Conducting poly-mers (e.g., PEDOT:PSS, polyaniline, polythiophene) | 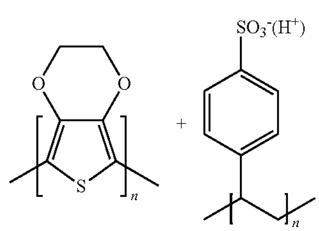 | Synth. Met. 87, 171 (1997) WO2007002683 |
| Phosphonic acid and sliane SAMs | 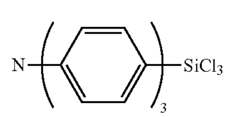 | US20030162053 |
| Triarylamine or polythiophene polymers with conductivity dopants | 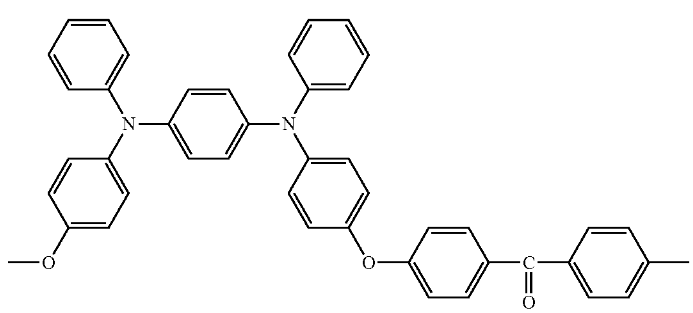 and | EA01725079A1 |

TABLE 1-continued
| MATERIAL | EXAMPLES OF MATERIAL | PUBLICATIONS |
|---|---|---|
| | 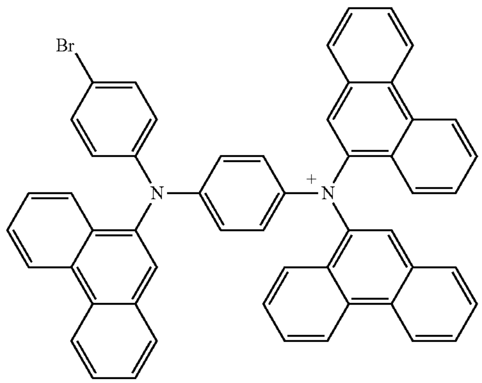 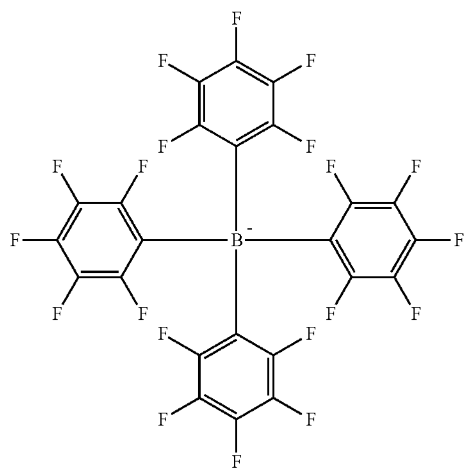 | |
| Arylamines complexed with metal oxides such as molybdenum and tungsten oxides | 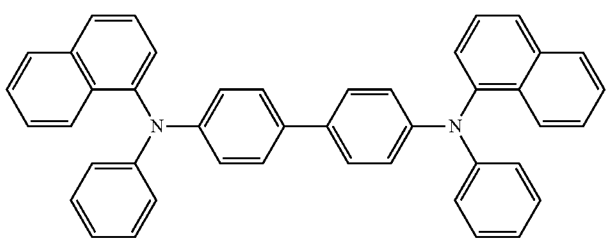 + $MoO_x$ | SID Symposium Digest, 37, 923 (2006) WO2009018009 |
| p-type semiconducting organic complexes | 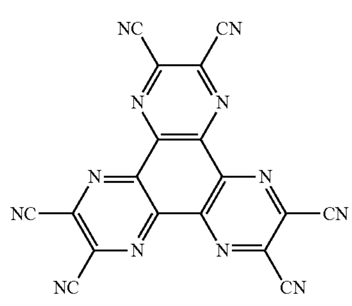 [SMILES: N#Cc1nc2c3nc(C#N)c(C#N)nc3c3nc(C#N)c(C#N)nc3c2nc1C#N] | US20020158242 |

TABLE 1-continued
| MATERIAL | EXAMPLES OF MATERIAL | PUBLICATIONS |
|---|---|---|
| Metal organometallic complexes | 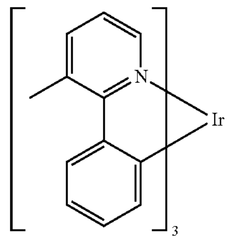 | US20060240279 |
| Cross-linkable compounds | 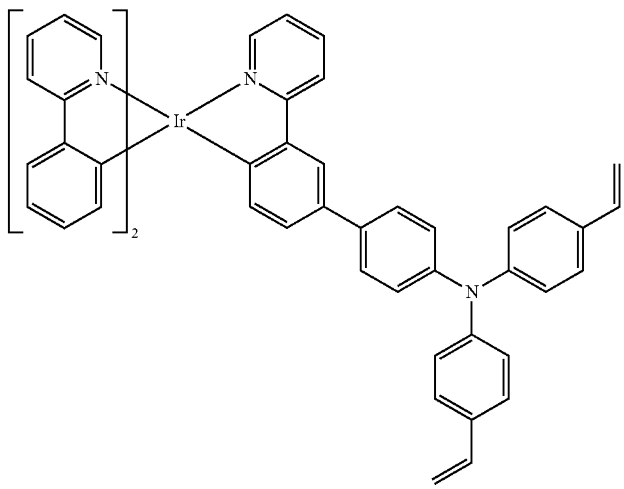 | US20080220265 |
| Hole transporting materials | | |
| Triarylamines (e.g., TPD, α-NPD) | 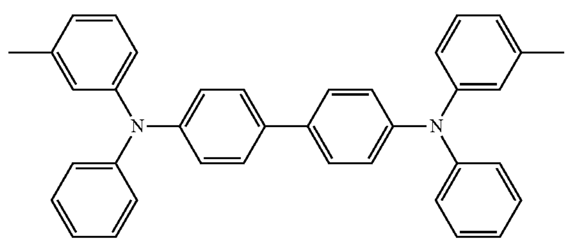 | Appl. Phys. Lett. 51, 913 (1987) |
| | 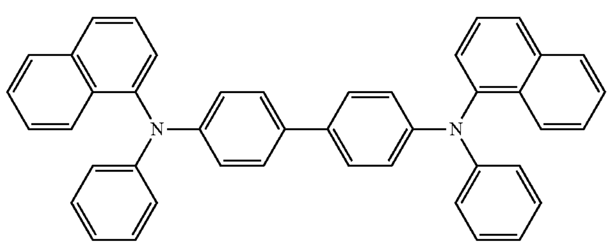 [SMILES: c1ccc(N(c2ccc(-c3ccc(N(c4ccccc4)c4cccc5ccccc45)cc3)cc2)c2cccc3ccccc23)cc1] | US5061569 |

TABLE 1-continued
| MATERIAL | EXAMPLES OF MATERIAL | PUBLICATIONS |
|---|---|---|
| | 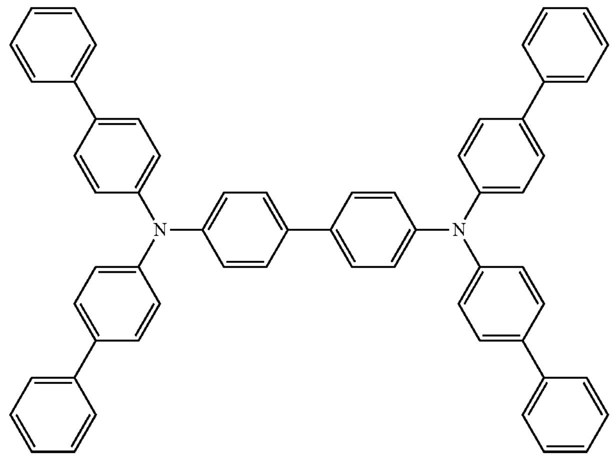 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |
| | 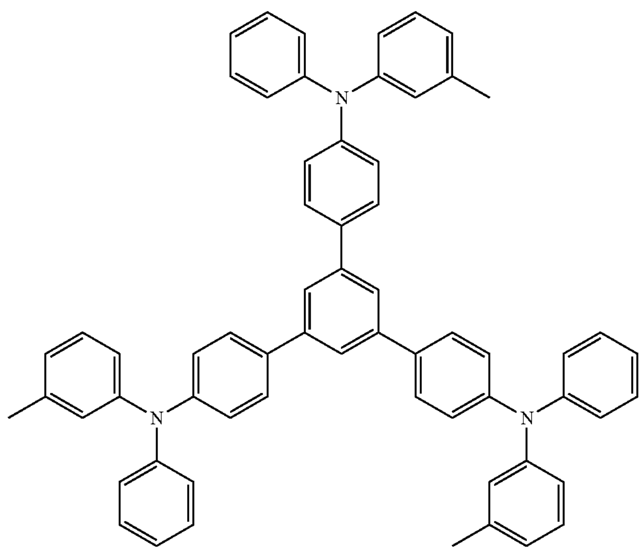 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |
| | 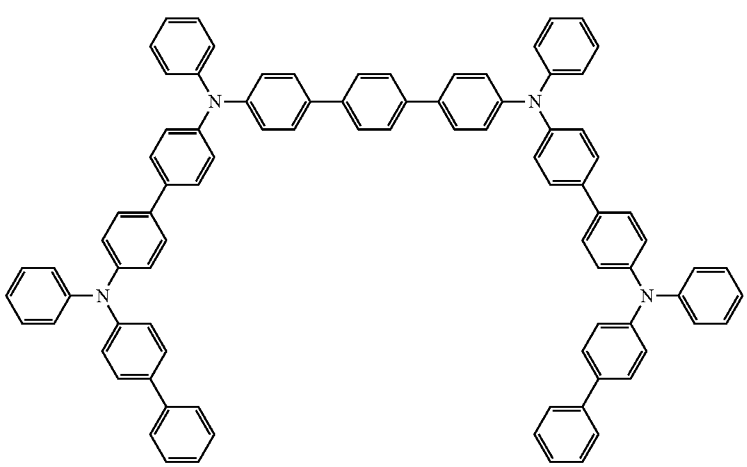 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |

TABLE 1-continued
| MATERIAL | EXAMPLES OF MATERIAL | PUBLICATIONS |
|---|---|---|
| | 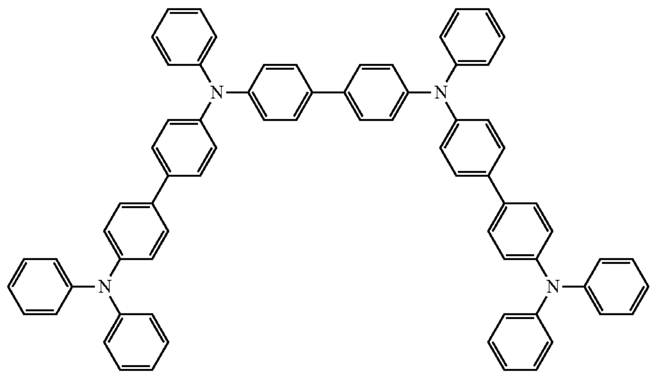 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1] | Appl. Phys. Lett. 90, 183503 (2007) |
| Triarylamine on spirofluorene core | 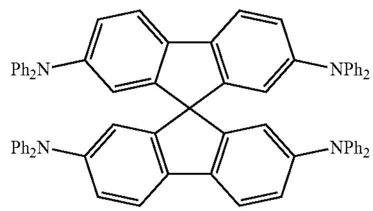 | Synth. Met. 91, 209 (1997) |
| Arylamine carbazole compounds | 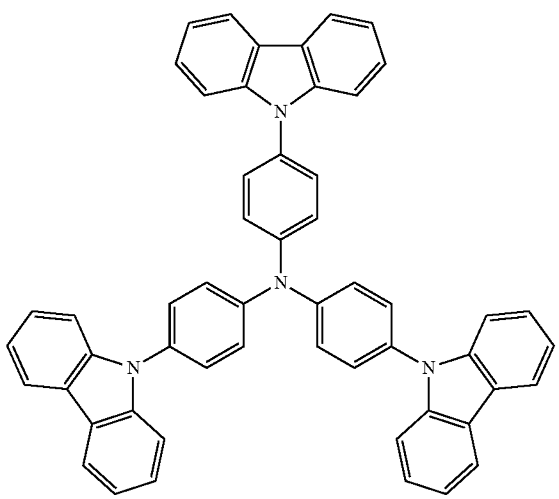 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1] | Adv. Mater. 6, 677 (1994), US20080124572 |
| Triarylamine with (di)benzothiophene/(di) benzofuran | 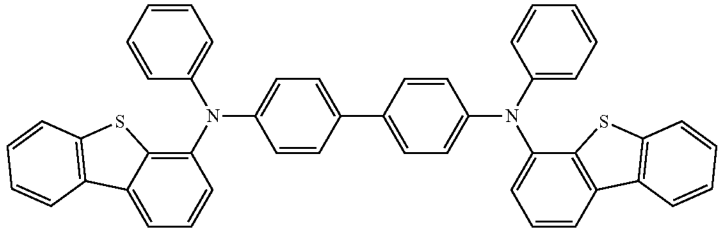 [SMILES: c1ccc(N(c2ccc(-c3ccc(N(c4ccccc4)c4cccc5c4sc4ccccc45)cc3)cc2)c2cccc3c2sc2ccccc23)cc1] | US20070278938, US20080106190 |

TABLE 1-continued
| MATERIAL | EXAMPLES OF MATERIAL | PUBLICATIONS |
|---|---|---|
| Indolocar-bazoles | 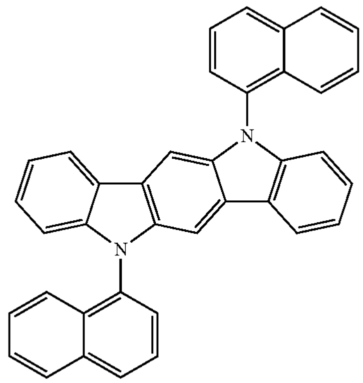 [SMILES: c1ccc2c(-n3c4ccccc4c4cc5c(cc43)c3ccccc3n5-c3cccc4ccccc34)cccc2c1] | Synth. Met. 111, 421 (2000) |
| Isoindole compounds | 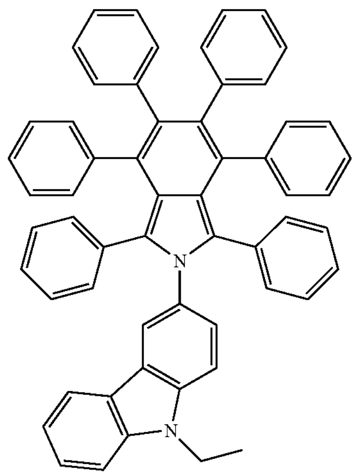 [SMILES: CCn1c2ccccc2c2cc(-n3c(-c4ccccc4)c4c(-c5ccccc5)c(-c5ccccc5)c(-c5ccccc5)c(-c5ccccc5)c4c3-c3ccccc3)ccc21] | Chem. Mater. 15, 3148 (2003) |
| Metal carbene complexes | 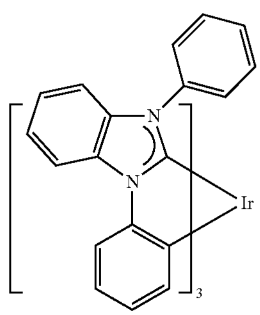 | US20080018221 |
| Phosphorescent OLED host materials Red hosts | | |
| Arylcar-bazoles | 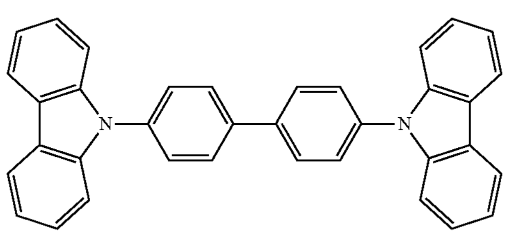 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |

TABLE 1-continued
| MATERIAL | EXAMPLES OF MATERIAL | PUBLICATIONS |
|---|---|---|
| Metal 8-hydroxyquinolates (e.g., $Alq_3$, BAlq) | 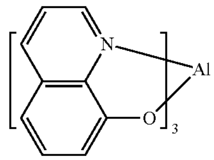 | Nature 395, 151 (1998) |
| | 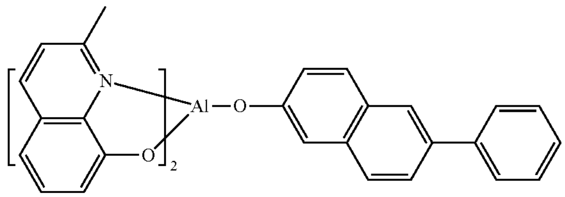 | US20060202194 |
| | 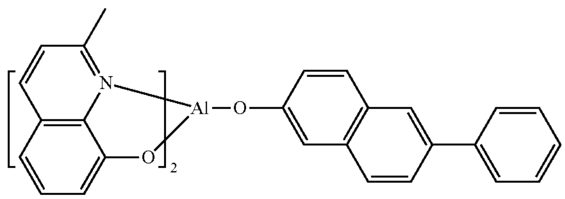 | WO2005014551 |
| | 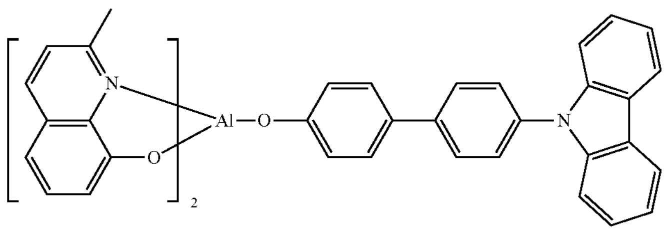 | WO2006072002 |
| Metal phenoxybenzothiazole compounds | 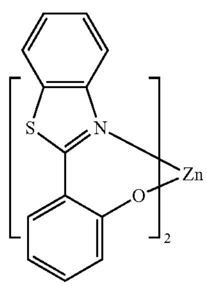 | Appl. Phys. Lett. 90, 123509 (2007) |
| Conjugated oligomers and polymers (e.g., polyfluorene) | 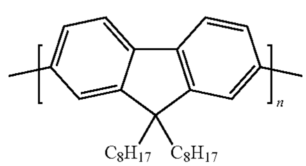 | Org. Electron. 1, 15 (2000) |
| Aromatic fused rings | 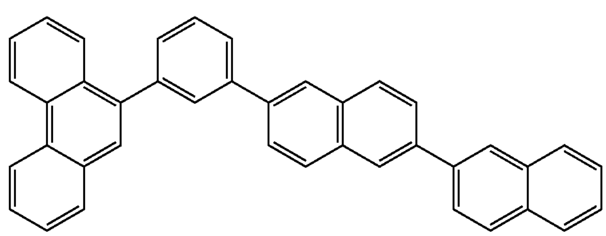 [SMILES: c1cc(-c2ccc3cc(-c4ccc5ccccc5c4)ccc3c2)cc(-c2cc3ccccc3c3ccccc23)c1] | WO2009066779, WO2009066778, WO2009063833, US20090045731, US20090045730, WO2009008311, US20090008605, US20090009065 |

TABLE 1-continued
| MATERIAL | EXAMPLES OF MATERIAL | PUBLICATIONS |
|---|---|---|
| Zinc complexes | 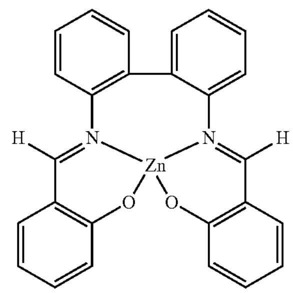 | WO2009062578 |
| | Green hosts | |
| Arylcarbazoles | 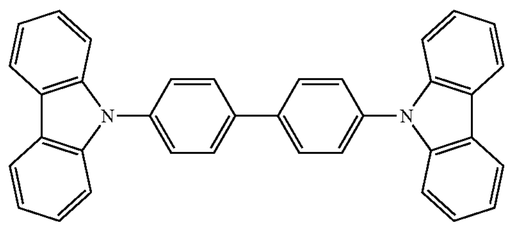 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| | 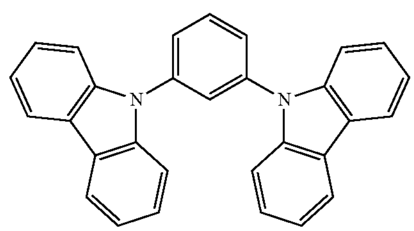 [SMILES: c1cc(-n2c3ccccc3c3ccccc32)cc(-n2c3ccccc3c3ccccc32)c1] | US20030175553 |
| | 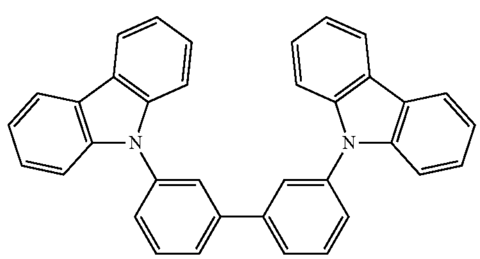 [SMILES: c1cc(-c2cccc(-n3c4ccccc4c4ccccc43)c2)cc(-n2c3ccccc3c3ccccc32)c1] | WO2001039234 |
| Aryltriphenylene compounds | 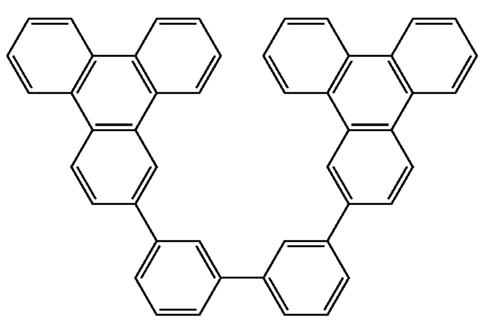 [SMILES: c1cc(-c2cccc(-c3ccc4c5ccccc5c5ccccc5c4c3)c2)cc(-c2ccc3c4ccccc4c4ccccc4c3c2)c1] | US20060280965 |

TABLE 1-continued
| MATERIAL | EXAMPLES OF MATERIAL | PUBLICATIONS |
|---|---|---|
| | 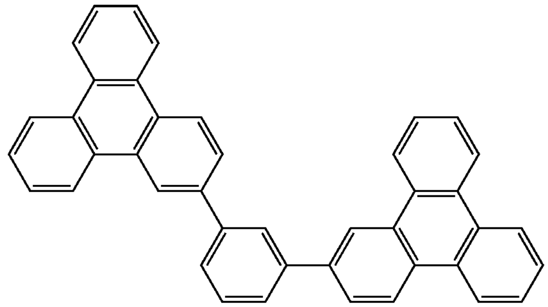 [SMILES: c1cc(-c2ccc3c4ccccc4c4ccccc4c3c2)cc(-c2ccc3c4ccccc4c4ccccc4c3c2)c1] | US20060280965 |
| | 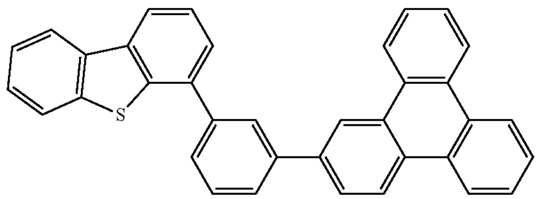 [SMILES: c1cc(-c2ccc3c4ccccc4c4ccccc4c3c2)cc(-c2cccc3c2sc2ccccc23)c1] | WP2009021126 |
| Donor acceptor type molecules | 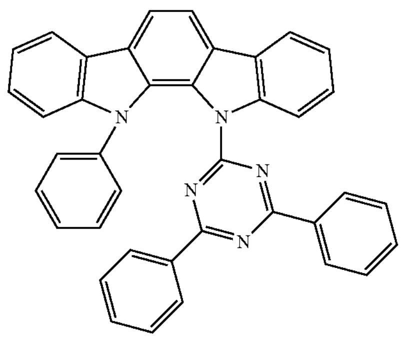 [SMILES: c1ccc(-c2nc(-c3ccccc3)nc(-n3c4ccccc4c4ccc5c6ccccc6n(-c6ccccc6)c5c43)n2)cc1] | WO2008056746 |
| Aza-car-bazole/ DBT/DBF | 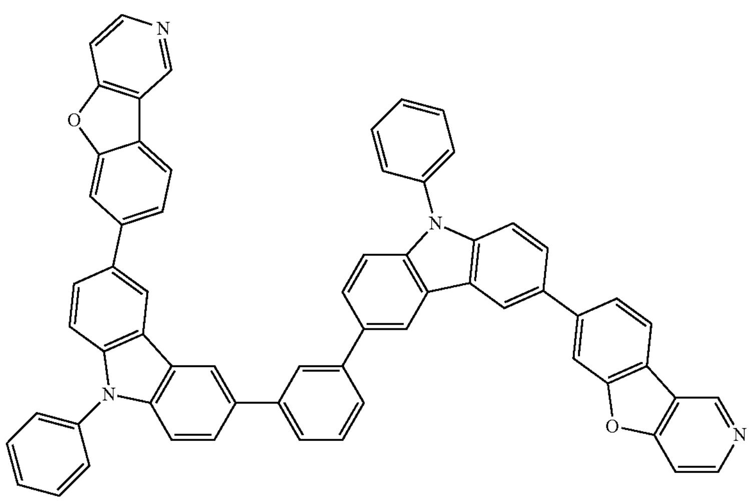 [SMILES: c1ccc(-n2c3ccc(-c4cccc(-c5ccc6c(c5)c5cc(-c7ccc8c(c7)oc7ccncc78)ccc5n6-c5ccccc5)c4)cc3c3cc(-c4ccc5c(c4)oc4ccncc45)ccc32)cc1] | JP2008074939 |
| Polymers (e.g., PVK) | 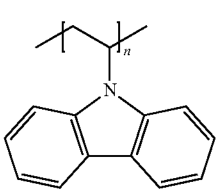 | Appl. Phys. Lett. 77, 2280 (2000) |

TABLE 1-continued
| MATERIAL | EXAMPLES OF MATERIAL | PUBLICATIONS |
| --- | --- | --- |
| Spirofluor-ene com-pounds | 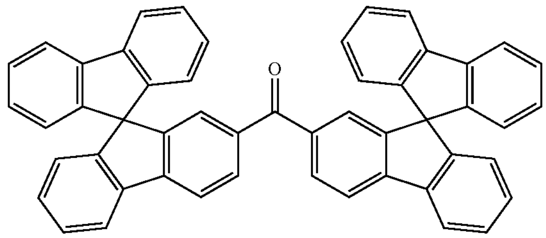 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |
| Metal phenoxy-benzooxazole compounds | 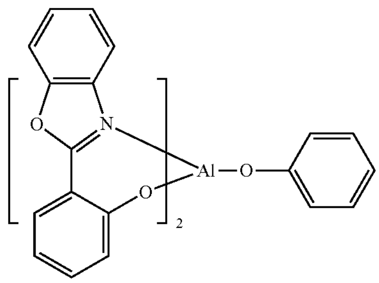 | WO2005089025 |
| | 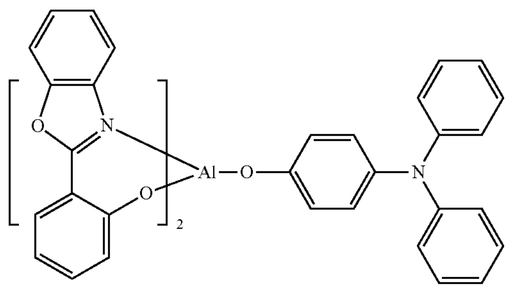 | WO20066132173 |
| | 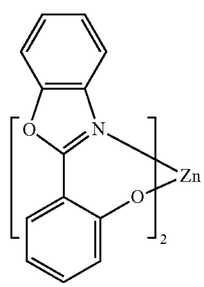 | JP200511610 |
| Spirofluor-ene-carbazole compounds | 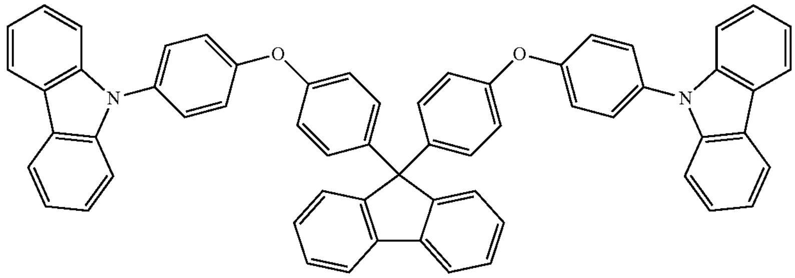 [SMILES: c1ccc2c(c1)-c1ccccc1C2(c1ccc(Oc2ccc(-n3c4ccccc4c4ccccc43)cc2)cc1)c1ccc(Oc2ccc(-n3c4ccccc4c4ccccc43)cc2)cc1] | JP2007254297 |

TABLE 1-continued
| MATERIAL | EXAMPLES OF MATERIAL | PUBLICATIONS |
|---|---|---|
| | 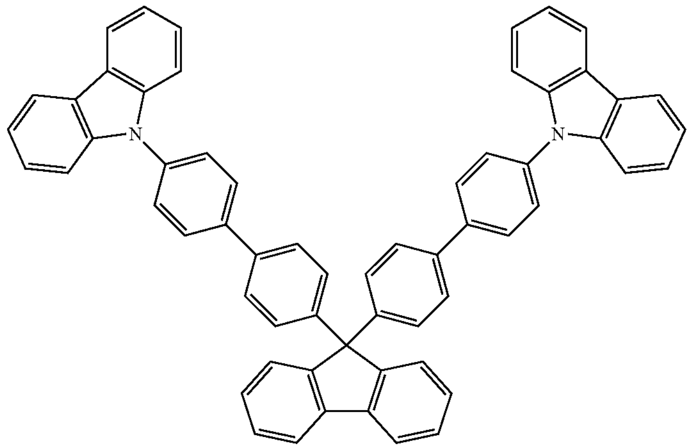 [SMILES: c1ccc2c(c1)-c1ccccc1C2(c1ccc(-c2ccc(-n3c4ccccc4c4ccccc43)cc2)cc1)c1ccc(-c2ccc(-n3c4ccccc4c4ccccc43)cc2)cc1] | JP2007254297 |
| Indolo-cabazoles | 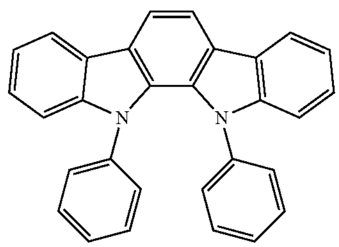 [SMILES: c1ccc(-n2c3ccccc3c3ccc4c5ccccc5n(-c5ccccc5)c4c32)cc1] | WO2007063796 |
| | 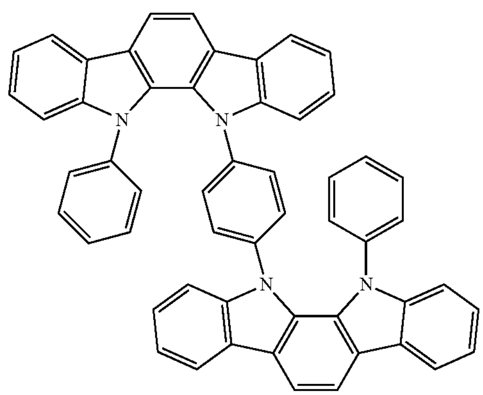 [SMILES: c1ccc(-n2c3ccccc3c3ccc4c5ccccc5n(-c5ccc(-n6c7ccccc7c7ccc8c9ccccc9n(-c9ccccc9)c8c76)cc5)c4c32)cc1] | WO2007063754 |
| 5-member ring electron deficient heterocycles (e.g., triazole, oxadiazole) | 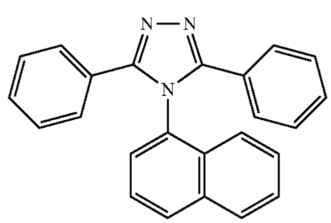 [SMILES: c1ccc(-c2nnc(-c3ccccc3)n2-c2cccc3ccccc23)cc1] | J. Appl. Phys. 90, 5048 (2001) |
| | 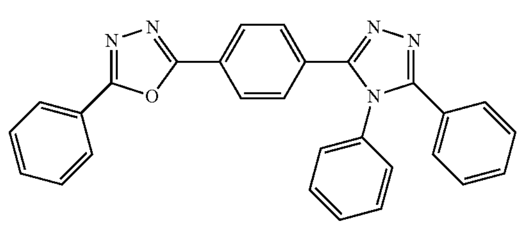 [SMILES: c1ccc(-c2nnc(-c3ccc(-c4nnc(-c5ccccc5)n4-c4ccccc4)cc3)o2)cc1] | WO2004107822 |

TABLE 1-continued
| MATERIAL | EXAMPLES OF MATERIAL | PUBLICATIONS |
|---|---|---|
| Tetraphenylene complexes | 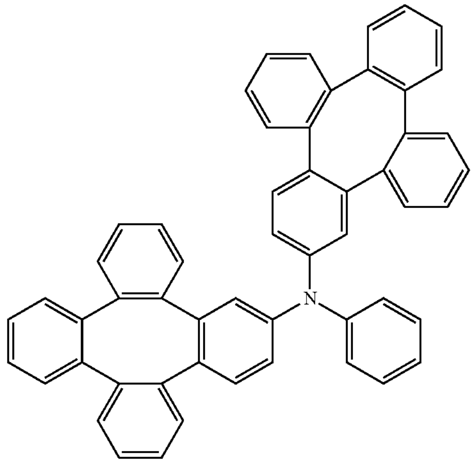 [SMILES: c1ccc(N(c2ccc3c(c2)-c2ccccc2-c2ccccc2-c2ccccc2-3)c2ccc3c(c2)-c2ccccc2-c2ccccc2-c2ccccc2-3)cc1] | US20050112407 |
| Metal phenoxypyridine compounds | 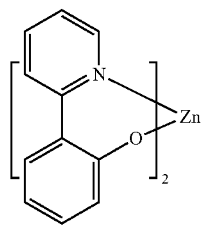 | WO2005030900 |
| Metal coordination complexes (e.g., Zn, Al, with N^N ligands) | 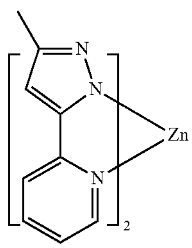 | US20040137268, US20040137267 |
| | Blue hosts | |
| Arylcarbazoles | 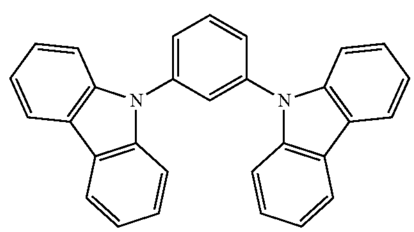 [SMILES: c1cc(-n2c3ccccc3c3ccccc32)cc(-n2c3ccccc3c3ccccc32)c1] | Appl. Phys. Lett, 82, 2422 (2003) |
| | 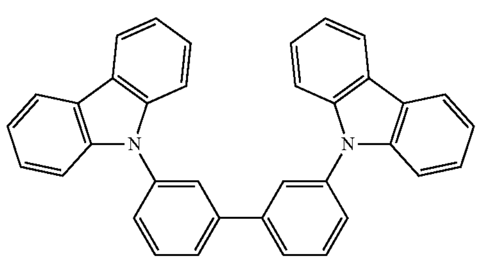 [SMILES: c1cc(-c2cccc(-n3c4ccccc4c4ccccc43)c2)cc(-n2c3ccccc3c3ccccc32)c1] | US20070190359 |

TABLE 1-continued
| MATERIAL | EXAMPLES OF MATERIAL | PUBLICATIONS |
|---|---|---|
| Dibenzo-thiophene/ Diben-zofuran-carbazole compounds | 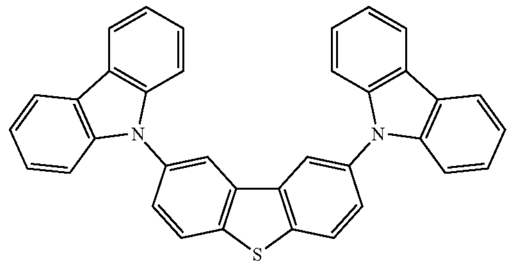 [SMILES: c1ccc2c(c1)c1ccccc1n2-c1ccc2sc3ccc(-n4c5ccccc5c5ccccc54)cc3c2c1] | WO20066114966, US20090167162 |
| | 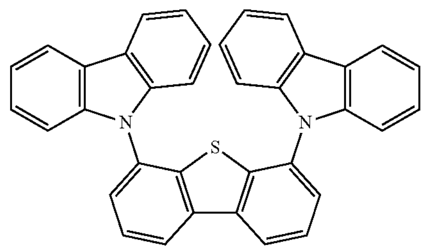 [SMILES: c1cc(-n2c3ccccc3c3ccccc32)c2sc3c(-n4c5ccccc5c5ccccc54)cccc3c2c1] | US20090167162 |
| | 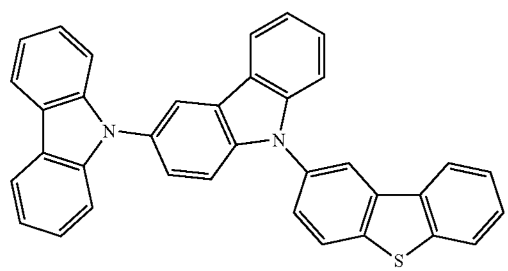 [SMILES: c1ccc2c(c1)sc1ccc(-n3c4ccccc4c4cc(-n5c6ccccc6c6ccccc65)ccc43)cc12] | WO2009086028 |
| | 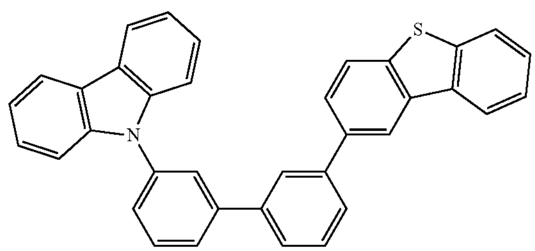 [SMILES: c1cc(-c2cccc(-n3c4ccccc4c4ccccc43)c2)cc(-c2ccc3sc4ccccc4c3c2)c1] | US20090030202, US20090017330 |
| Silicon aryl compounds | 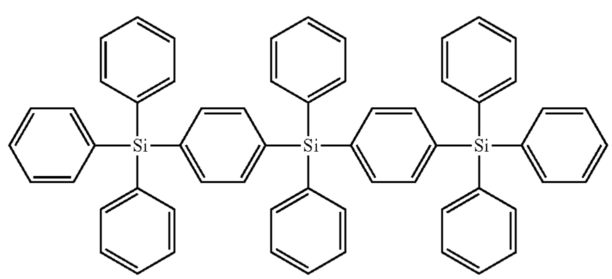 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 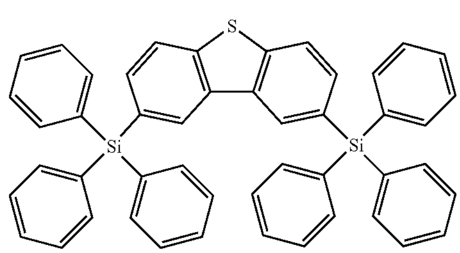 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |

TABLE 1-continued
| MATERIAL | EXAMPLES OF MATERIAL | PUBLICATIONS |
|---|---|---|
| Silicon/ Germanium aryl compounds | 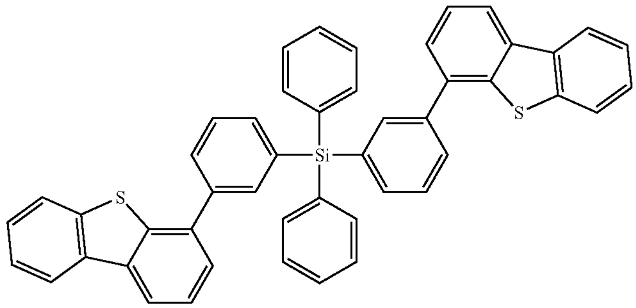 [SMILES: c1ccc([Si](c2ccccc2)(c2cccc(-c3cccc4c3sc3ccccc34)c2)c2cccc(-c3cccc4c3sc3ccccc34)c2)cc1] | WP2034538A |
| Aryl benzoyl ester | 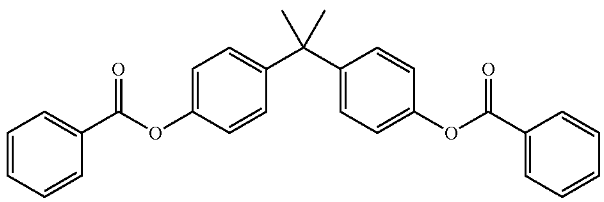 [SMILES: CC(C)(c1ccc(OC(=O)c2ccccc2)cc1)c1ccc(OC(=O)c2ccccc2)cc1] | WO2006100298 |
| High triplet metal organometallic complex | 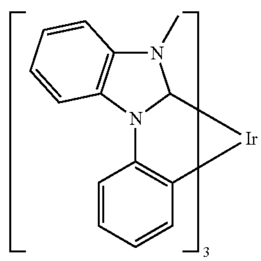 | US7154114 |
| | Phosphorescent dopants<br>Red dopants | |
| Heavy metal prophyrins (e.g., PtOEP) | 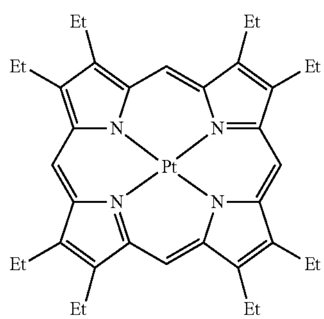 | Nature 395, 151 (1998) |
| Iridium(III) organometallic complexes | 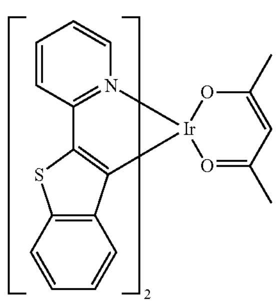 | Appl. Phys. Lett. 78, 1622 (2001) |

TABLE 1-continued
| MATERIAL | EXAMPLES OF MATERIAL | PUBLICATIONS |
| --- | --- | --- |
| | 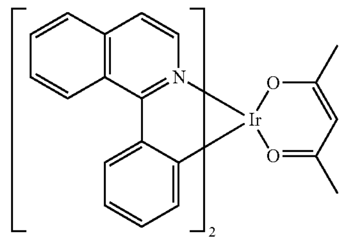 | US2006835469 |
| | 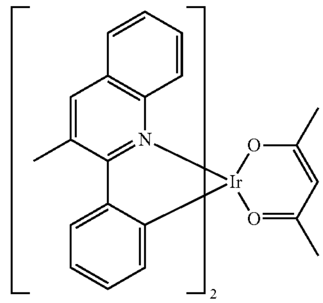 | US2006835469 |
| | 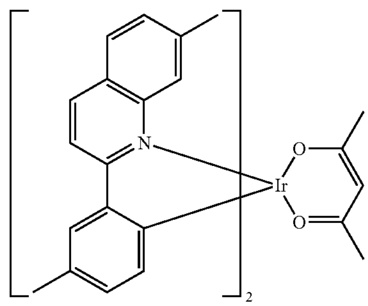 | US20060202194 |
| | 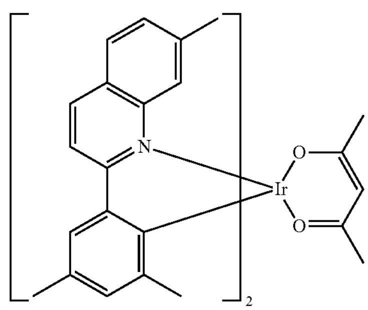 | US20060202194 |
| | 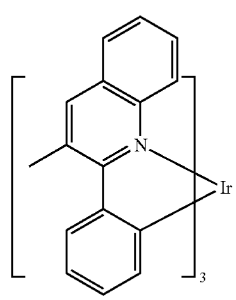 | US20070087321 |

TABLE 1-continued
| MATERIAL | EXAMPLES OF MATERIAL | PUBLICATIONS |
| --- | --- | --- |
| | 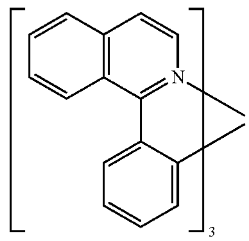 | US20070087321 |
| | 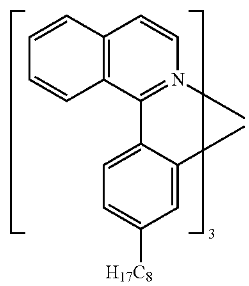 | Adv. Mater. 19, 739 (2007) |
| | 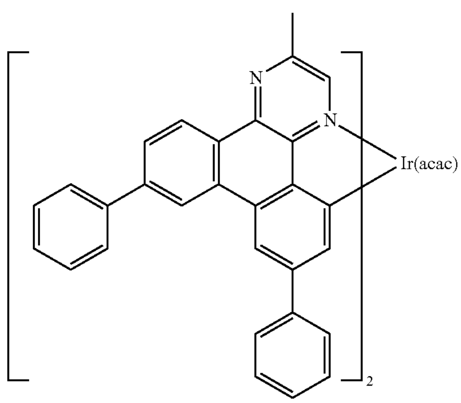 | WO2009100991 |
| | 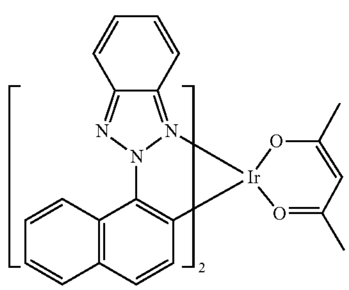 | WO2008101842 |
| Platinum(II) organo-metallic complexes | 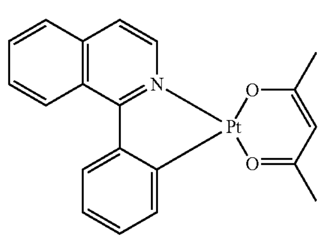 | WO2003040257 |

TABLE 1-continued
| MATERIAL | EXAMPLES OF MATERIAL | PUBLICATIONS |
|---|---|---|
| Osminum(III) complexes | 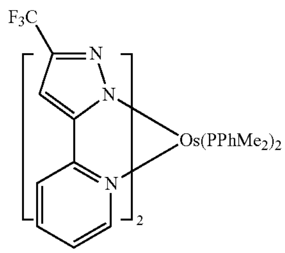 | Chem. Mater. 17, 3532 (2005) |
| Ruthenium(II) complexes | 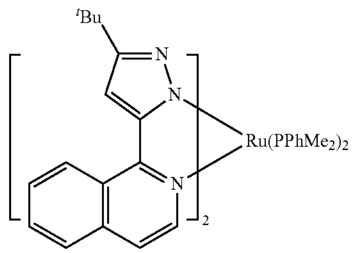 | Adv. Mater. 17, 1059 (2005) |
| Rhenium (I), (II), and (III) complexes | 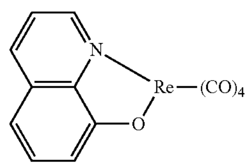 | US20050244673 |
| | Green dopants | |
| Iridium(III) organometallic complexes | 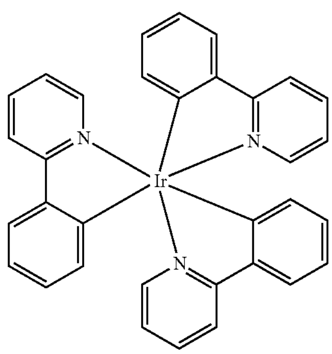 and its derivatives | Inorg. Chem. 40, 1704 (2001) |
| | 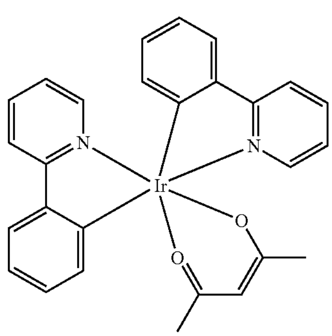 | US20020034656 |

TABLE 1-continued
| MATERIAL | EXAMPLES OF MATERIAL | PUBLICATIONS |
|---|---|---|
| | 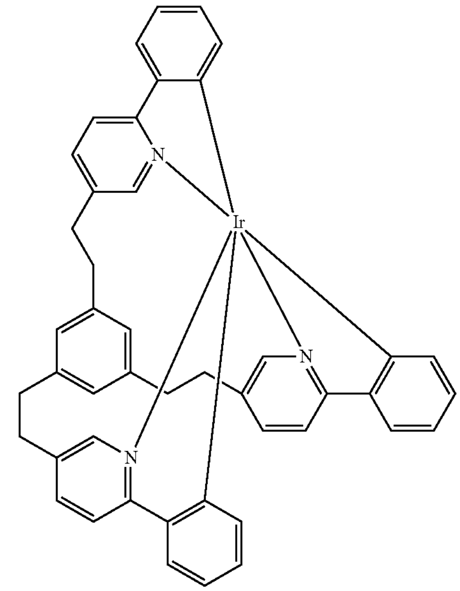 | US7332232 |
| | 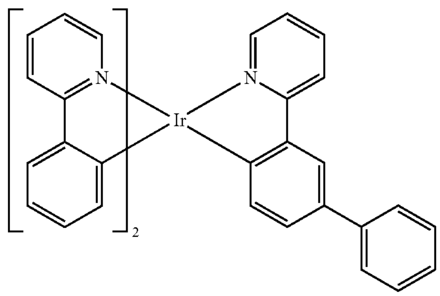 | US20090108737 |
| | 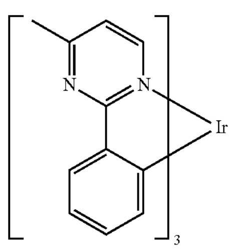 | US20090039776 |
| | 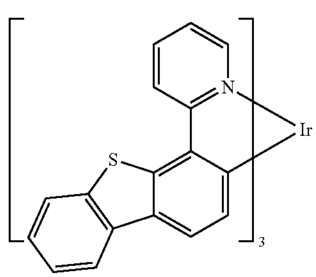 | US6921915 |

TABLE 1-continued
| MATERIAL | EXAMPLES OF MATERIAL | PUBLICATIONS |
|---|---|---|
| | 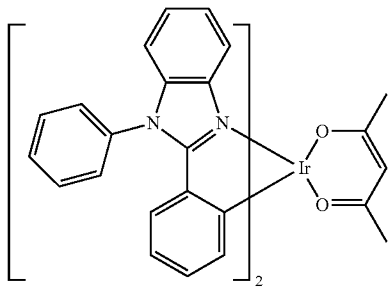 | US6687266 |
| | 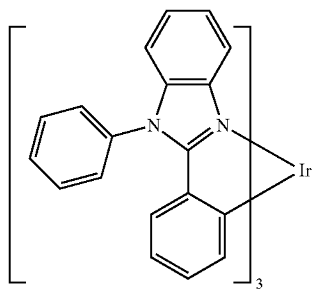 | Chem. Mater. 16, 2480 (2004) |
| | 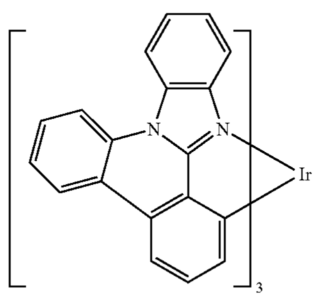 | US20070190359 |
| | 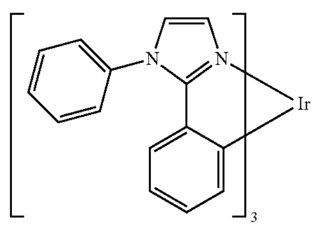 | US20060008670 JP2007123392 |
| | 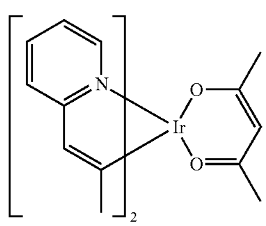 | Adv. Mater. 16, 2003 (2004) |

TABLE 1-continued
| MATERIAL | EXAMPLES OF MATERIAL | PUBLICATIONS |
|---|---|---|
| | 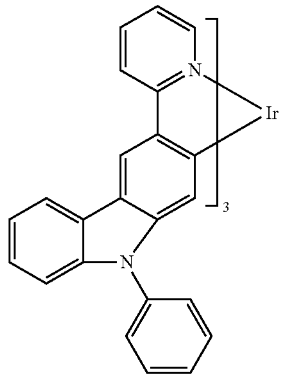 | Angew. Chem. Int. Ed. 2006, 45, 7800 |
| | 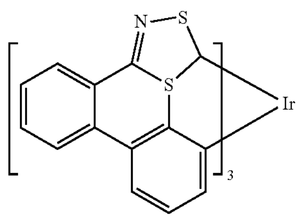 | WO2009050290 |
| | 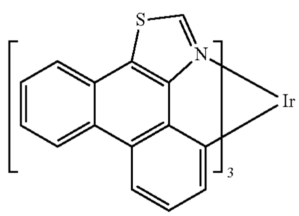 | US20090165846 |
| | 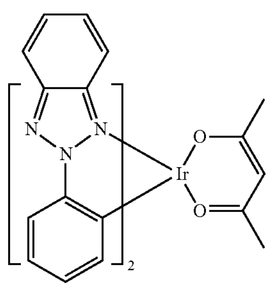 | US20080015355 |
| Monomer for polymeric metal organometallic compounds | 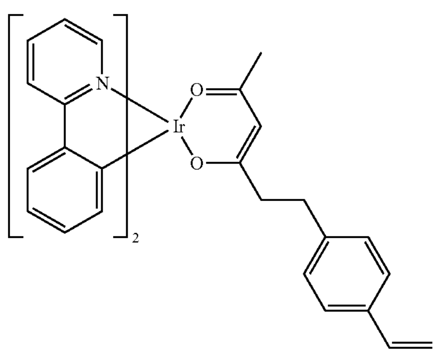 | US7250226, US7396598 |

TABLE 1-continued
| MATERIAL | EXAMPLES OF MATERIAL | PUBLICATIONS |
|---|---|---|
| Pt(II) organometallic complexes, including polydentated ligands | 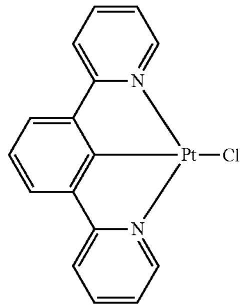 | Appl. Phys. Lett. 86, 153505 (2005) |
| | 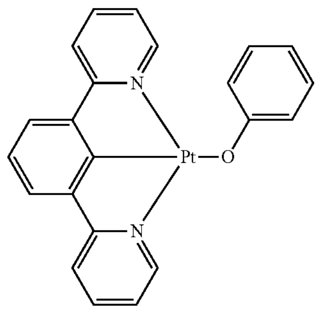 | Appl. Phys. Lett. 86, 153505 (2005) |
| | 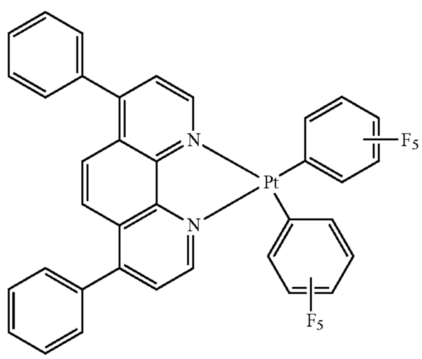 | Chem. Lett. 34, 592 (2005) |
| | 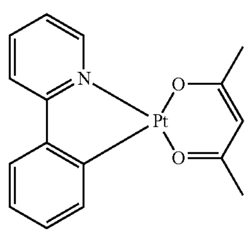 | WO2002015645 |
| | 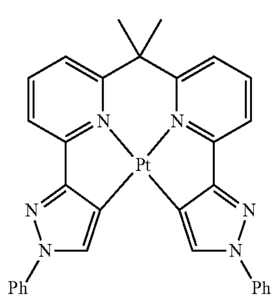 | US20060263635 |

TABLE 1-continued
| MATERIAL | EXAMPLES OF MATERIAL | PUBLICATIONS |
|---|---|---|
| Cu complexes | 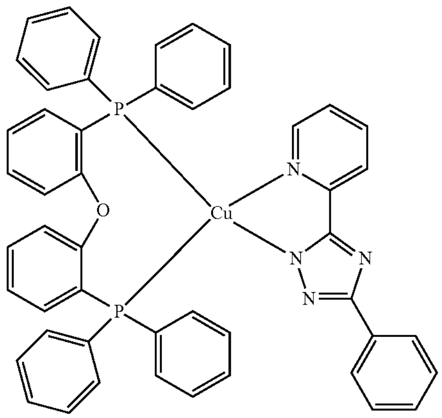 | WO2009000673 |
| Gold complexes | 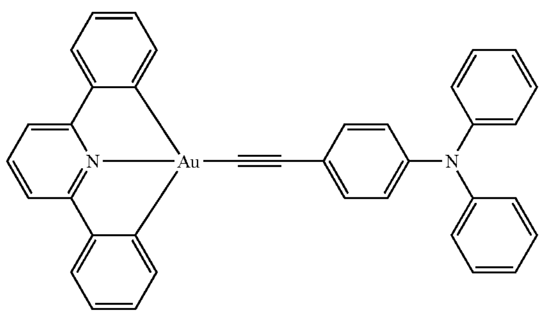 | Chem. Commun. 2906 (2005) |
| Rhenium(III) complexes | 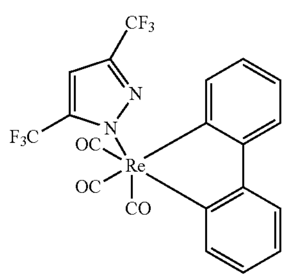 | Inorg. Chem. 42, 1248 (2003) |
| Deuterated organometallic complexes | 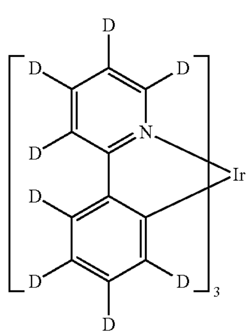 | US20030138657 |

TABLE 1-continued
| MATERIAL | EXAMPLES OF MATERIAL | PUBLICATIONS |
|---|---|---|
| Organometallic complexes with two or more metal centers | 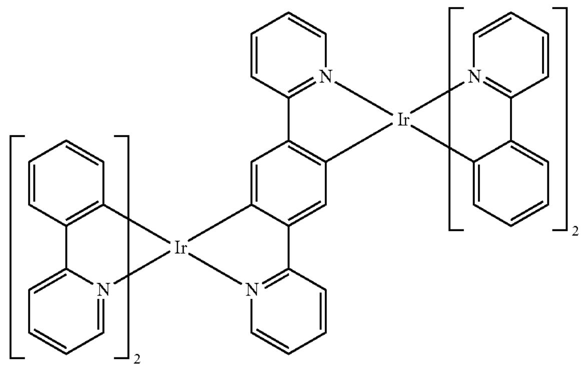 | US20030152802 |
| | 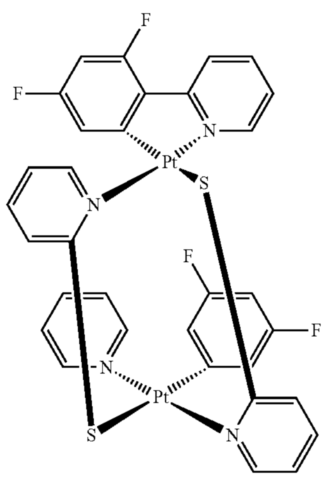 | US7090928 |
| | Blue dopants | |
| Iridium(III) organometallic complexes | 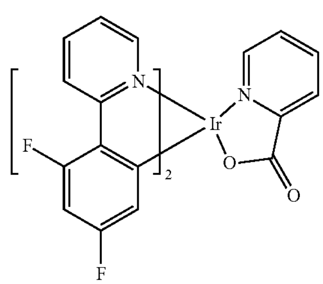 | WO2002002714 |
| | 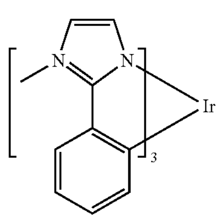 | WO2006009024 |
| | 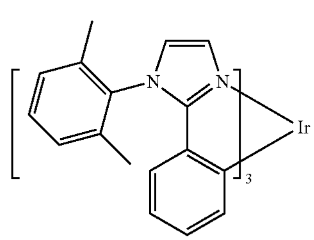 | US20060251923 |

TABLE 1-continued
| MATERIAL | EXAMPLES OF MATERIAL | PUBLICATIONS |
|---|---|---|
| | 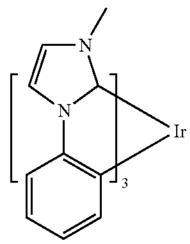 | US7393599, WO2006056418, US20050260441, WO2005019373 |
| | 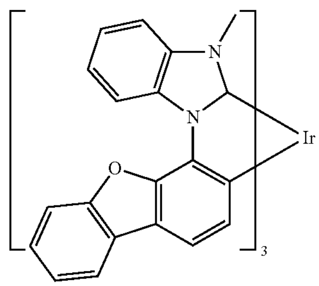 | US7534505 |
| | 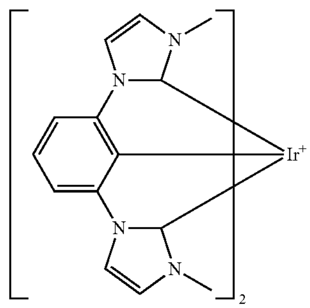 | US7445855 |
| | 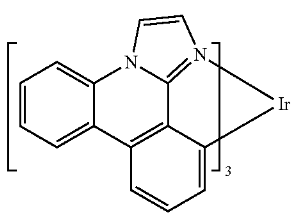 | US20070190359, US20080297033 |
| | 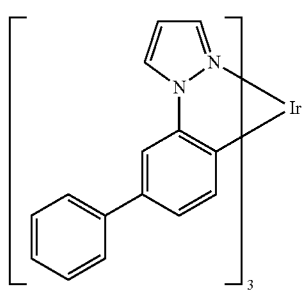 | US7338722 |
| | 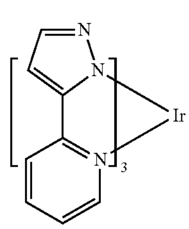 | US20020134984 |

TABLE 1-continued
| MATERIAL | EXAMPLES OF MATERIAL | PUBLICATIONS |
| --- | --- | --- |
| | 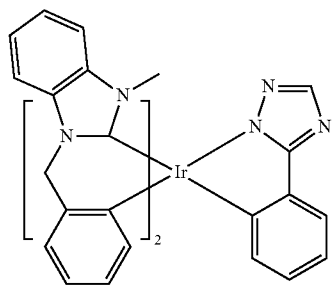 | Angew. Chem. Int. Ed. 47, 1 (2008) |
| | 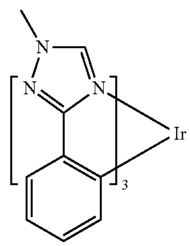 | Chem. Mater. 18, 5119 (2006) |
| | 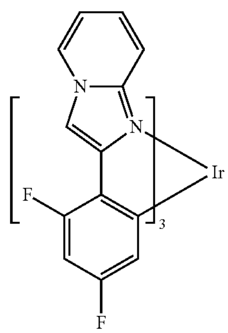 | Inorg. Chem. 46, 4308 (2007) |
| | 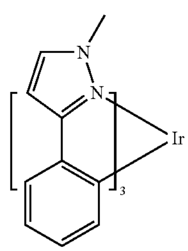 | WO2005123873 |
| | 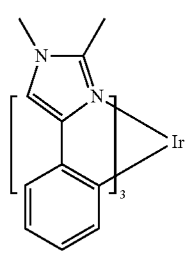 | WO2005123873 |
| | 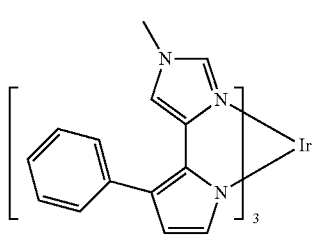 | WO2007004380 |

TABLE 1-continued
| MATERIAL | EXAMPLES OF MATERIAL | PUBLICATIONS |
| --- | --- | --- |
| | 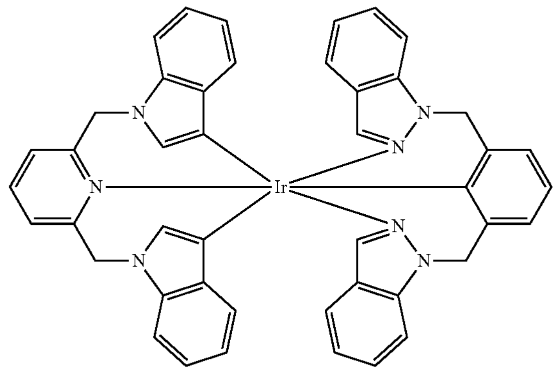 | WO2006082742 |
| Osmium(II) complexes | 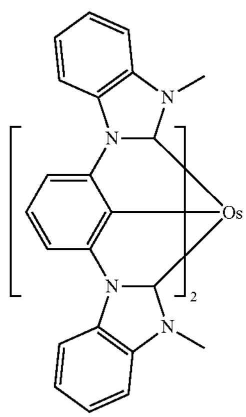 | US7279704 |
| | 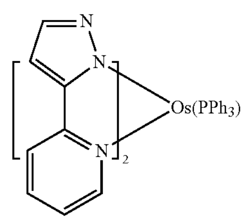 | Organometallics 23, 3745 (2004) |
| Gold complexes | 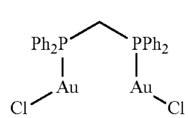 | Appl. Phys. Lett. 74, 1361 (1999) |
| Platinum(II) complexes | 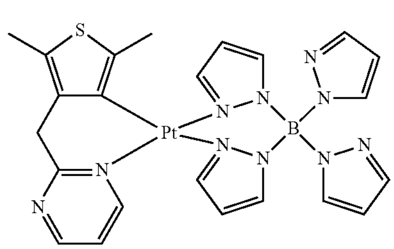 | WO2006098120, WO2006103874 |

TABLE 1-continued
| MATERIAL | EXAMPLES OF MATERIAL | PUBLICATIONS |
|---|---|---|
| | Exciton/hole blocking layer materials | |
| Bathocuprine compounds (e.g., BCP, BPhen) | 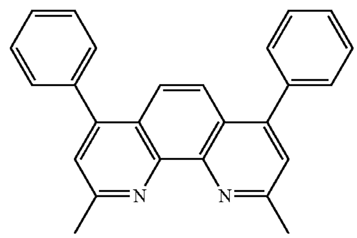 [SMILES: Cc1cc(-c2ccccc2)c2ccc3c(-c4ccccc4)cc(C)nc3c2n1] | Appl. Phys. Lett. 75, 4 (1999) |
| | 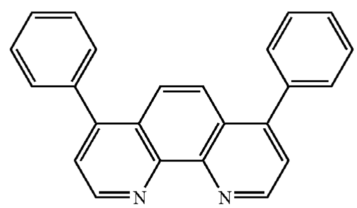 [SMILES: c1ccc(-c2ccnc3c2ccc2c(-c4ccccc4)ccnc23)cc1] | Appl. Phys. Lett. 79, 449 (2001) |
| Metal 8-hydroxyquinolates (e.g., BAlq) | 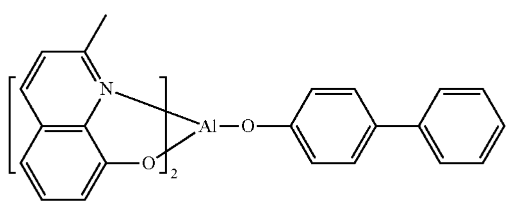 | Appl. Phys. Lett. 81, 162 (2002) |
| 5-member ring electron deficient heterocycles such as triazole, oxadiazole, imidazole, benzoimidazole | 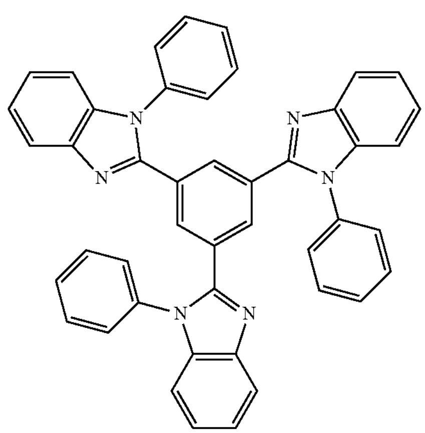 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |

TABLE 1-continued
| MATERIAL | EXAMPLES OF MATERIAL | PUBLICATIONS |
|---|---|---|
| Triphenylene compounds | 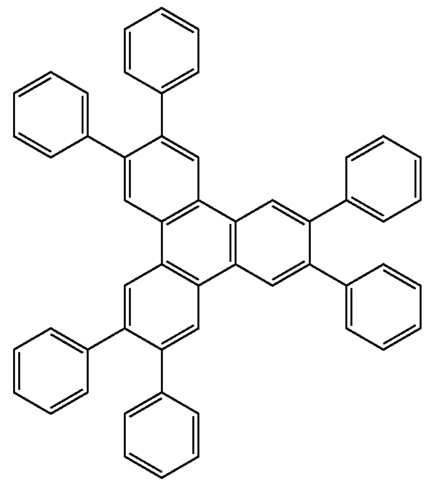 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |
| Fluorinated aromatic compounds | 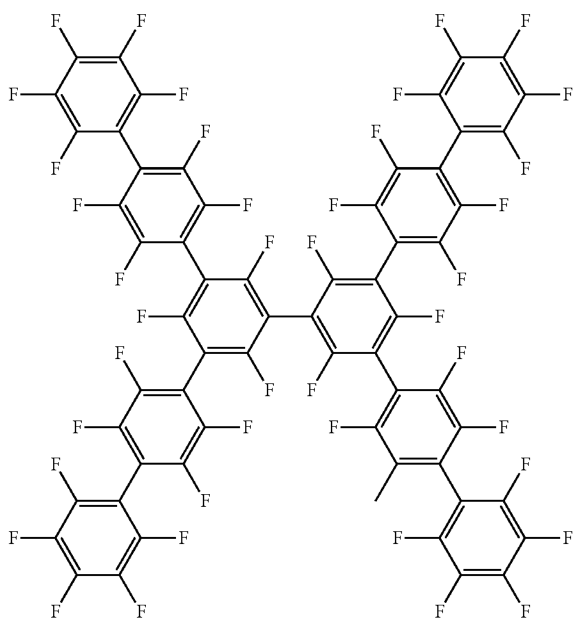 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |
| Phenothiazine-S-oxide | 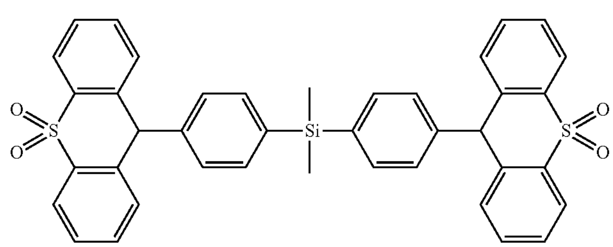 [SMILES: C[Si](C)(c1ccc(C2c3ccccc3S(=O)(=O)c3ccccc32)cc1)c1ccc(C2c3ccccc3S(=O)(=O)c3ccccc32)cc1] | WO2008132085 |

TABLE 1-continued
| MATERIAL | EXAMPLES OF MATERIAL | PUBLICATIONS |
|---|---|---|
| | Electron transporting materials | |
| Anthracene-benzomidazole compounds | 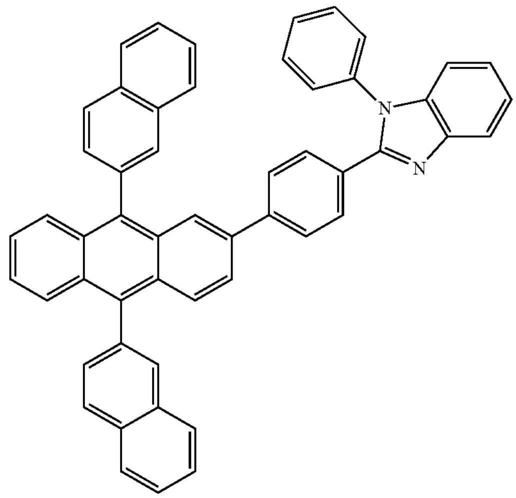 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | WO2003060956 |
| | 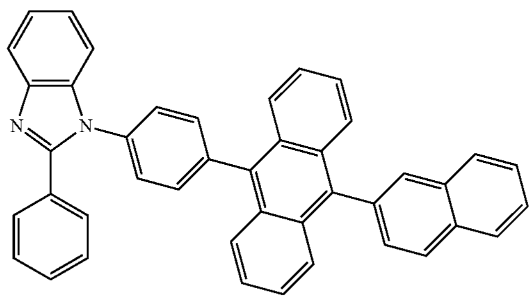 [SMILES: c1ccc(-c2nc3ccccc3n2-c2ccc(-c3c4ccccc4c(-c4ccc5ccccc5c4)c4ccccc34)cc2)cc1] | US20090179554 |
| Aza triphenylene derivatives | 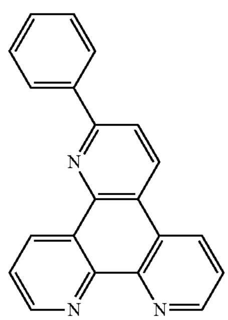 [SMILES: c1ccc(-c2ccc3c4cccnc4c4ncccc4c3n2)cc1] | US20090115316 |
| Anthracene-benzothiazole compounds | 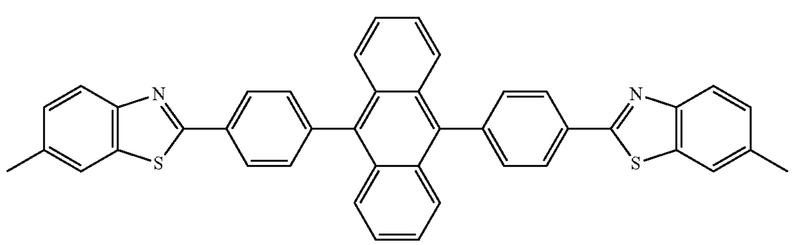 | Appl. Phys. Lett. 89, 063504 (2006) |
| Metal 8-hydroxyquinolates (e.g., $Alq_3$, $Zrq_4$) | 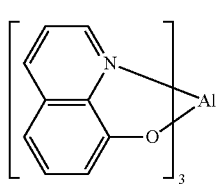 | Appl. Phys. Lett. 51, 913 (1987) US7230107 |

TABLE 1-continued
| MATERIAL | EXAMPLES OF MATERIAL | PUBLICATIONS |
|---|---|---|
| Metal hydroxy-benoquin-olates | 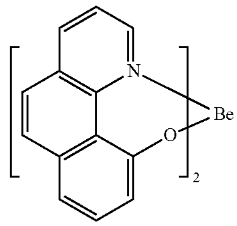 | Chem. Lett. 5, 905 (1993) |
| Batho-cuprine compounds such as BCP, BPhen, etc | 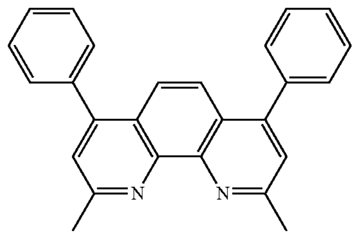 [SMILES: Cc1cc(-c2ccccc2)c2ccc3c(-c4ccccc4)cc(C)nc3c2n1] | Appl. Phys. Lett. 91, 263503 (2007) |
| | 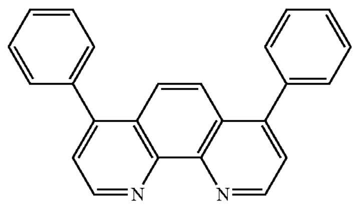 [SMILES: c1ccc(-c2ccnc3c2ccc2c(-c4ccccc4)ccnc23)cc1] | Appl. Phys. Lett. 79, 449 (2001) |
| 5-member ring electron deficient heterocycles (e.g., triazole, oxadiazole, imidazole, benzoimi-dazole) | 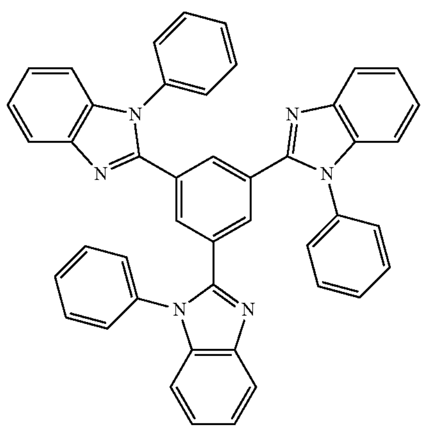 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 74, 865 (1999) |
| | 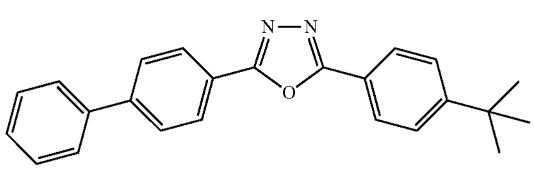 [SMILES: CC(C)(C)c1ccc(-c2nnc(-c3ccc(-c4ccccc4)cc3)o2)cc1] | Appl. Phys. Lett. 55, 1489 (1989) |
| | 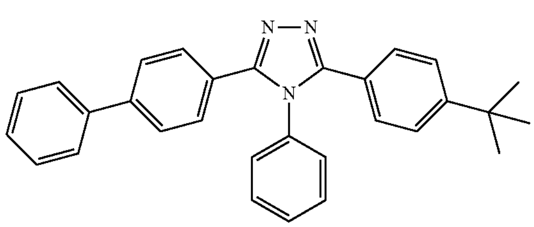 [SMILES: CC(C)(C)c1ccc(-c2nnc(-c3ccc(-c4ccccc4)cc3)n2-c2ccccc2)cc1] | Jpn. J. Apply. Phys. 32, L917 (1993) |

TABLE 1-continued
| MATERIAL | EXAMPLES OF MATERIAL | PUBLICATIONS |
|---|---|---|
| Silole compounds | 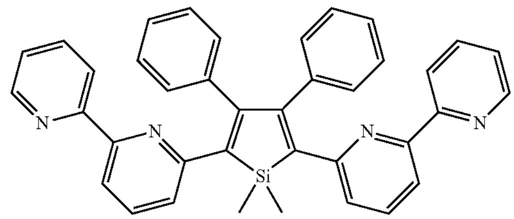 [SMILES: C[Si]1(C)C(c2cccc(-c3ccccn3)n2)=C(c2ccccc2)C(c2ccccc2)=C1c1cccc(-c2ccccn2)n1] | Org. Electron. 4, 113 (2003) |
| Aryl-borane compounds | 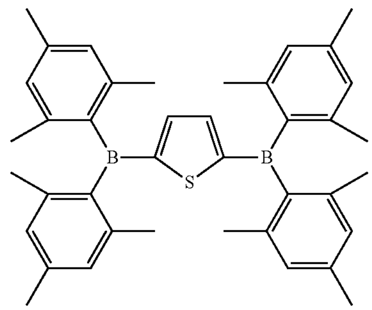 | J. Am. Chem. Soc. 120, 9714 (1998) |
| Fluor-inated aro-matic compounds | 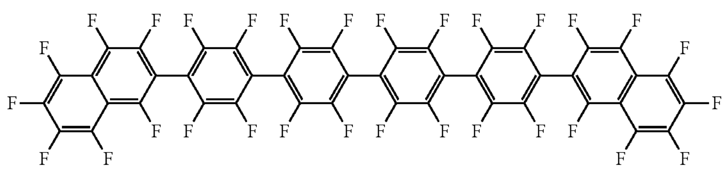 [SMILES: Fc1c(F)c(-c2c(F)c(F)c(-c3c(F)c(F)c4c(F)c(F)c(F)c(F)c4c3F)c(F)c2F)c(F)c(F)c1-c1c(F)c(F)c(-c2c(F)c(F)c(-c3c(F)c(F)c4c(F)c(F)c(F)c(F)c4c3F)c(F)c2F)c(F)c1F] | J. Am. Chem. Soc. 122, 1832 (2000) |
| Fullerene (e.g., C60) | 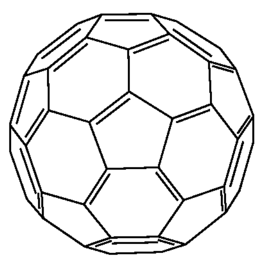 | US20090101870 |
| Triazine complexes | 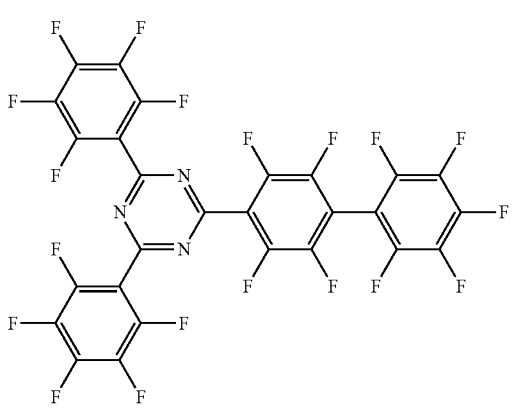 [SMILES: Fc1c(F)c(F)c(-c2nc(-c3c(F)c(F)c(F)c(F)c3F)nc(-c3c(F)c(F)c(-c4c(F)c(F)c(F)c(F)c4F)c(F)c3F)n2)c(F)c1F] | US20040036077 |

TABLE 1-continued

| MATERIAL | EXAMPLES OF MATERIAL | PUBLICATIONS |
| --- | --- | --- |
| Zn (N^N) complexes | 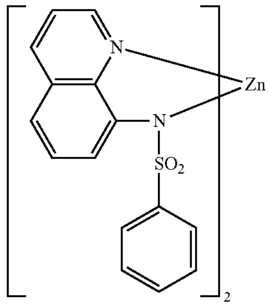 | US6528187 |

EXPERIMENTAL

Compound Examples

Example 1

Synthesis of 5-(3-(triphenylen-2-yl)phenyl)benzo[b]naphtho[2,1-d]thiophene (or Compound 69S)

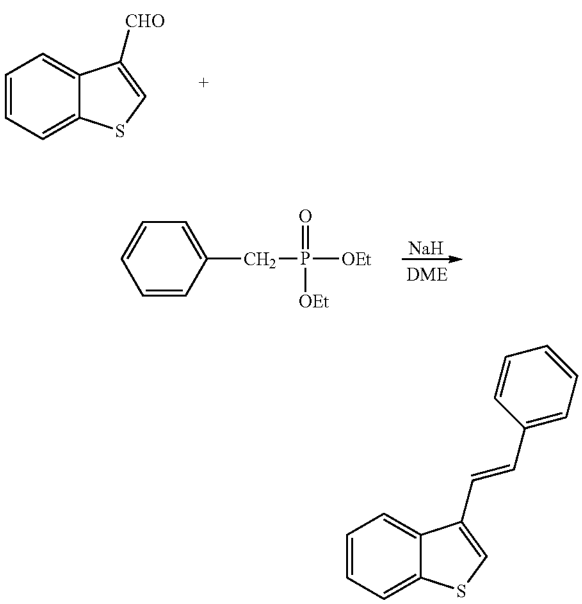

Synthesis of 3-styrylbenzo[b]thiophene

This is based on Journal of Heterocyclic Chemistry, 18(5), 967-72, 1981. NaH (1.3 g, 28 mmol) was added to a mixture of 3-carbaldehydebenzo[b]thiophene (4.27 g, 25 mmol), diethyl benzylphosphonate (5.76 g, 25 mmol) in 50 mL of 1,2-dimethoxyethane at 0° C. under $N_2$ and stirred for 15 minutes at 0° C. and 3 h at room temperature. The reaction mixture was then poured into ice water and filtrated. The solid from the filtration was recrystallized from ethanol to yield 4.5 g of desired product was obtained as a yellow solid.

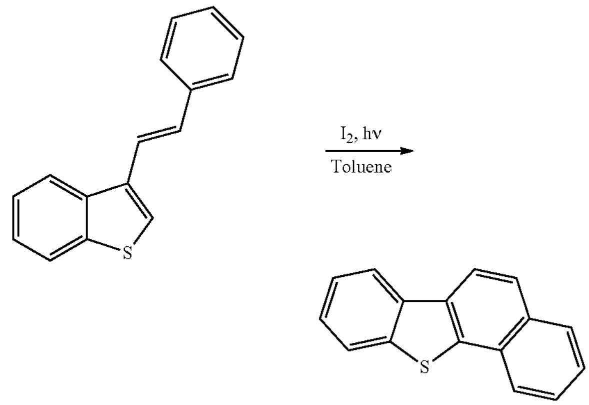

Synthesis of benzo[b]naphtha[2,1-d]thiophene 3-styrylbenzo[b]thiophene (13.8 g, 58 mmol), $I_2$ (0.13 g, 3 mmol) and 1.1 L of toluene were added in a photo reaction flask. The mixture was irradiated with a medium pressure mercury lamp with stirring for 6 h. The mixture was then concentrated and purified by silica gel column chromatography (15% EtOAc in hexanes). The product was further recrystallized from 20% EtOAc in methanol to give 12.9 g of pure product.

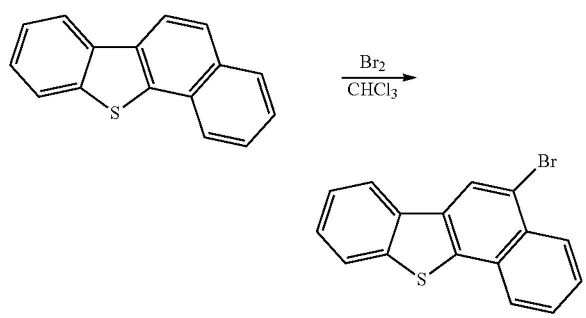

Synthesis of 5-bromobenzo[b]naphtho[2,1-d]thiophene $Br_2$ (1.53 g, 9.4 mmol) in ~50 mL $CHCl_3$ was added dropwise to a solution of benzo[b]naphtha[2,1-d]thiophene (2.2 g, 9.4 mmol) in 300 mL of $CHCl_3$ at room temperature. The mixture was stirring for 22 h. The reaction was quenched by aqueous $Na_2SO_3$. After workup, silica gel column chromatography (50% $CH_2Cl_2$ in hexanes) and washing with minimum amount of methanol and hexane, 2.8 g of product was obtained.

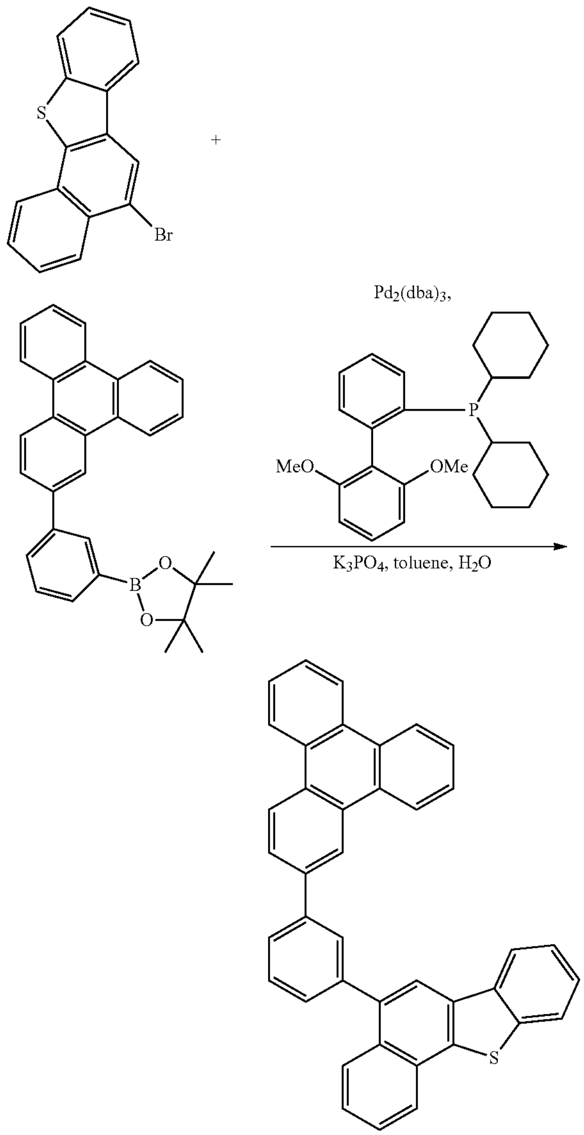

Compound 69S

Synthesis of Compound 69S

A mixture of 5-Bromobenzo[b]naphtho[2,1-d]thiophene (1.45 g, 4.6 mmol), 4,4,5,5-tetramethyl-2-(3-(triphenylen-2-yl)phenyl)-1,3,2-dioxaborolane (2.4 g, 5.58 mmol), $K_3PO_4$ (5.85 g, 27.6 mmol), 100 mL of toluene and 10 mL of water was bubbled with $N_2$ for 15 minutes. Then $Pd_2(dba)_3$ (212 mg, 0.23 mmol) and 2-dicyclohexylphosphino-2',6'-dimethoxybiphenyl (378 mg, 0.92 mmol) were added. The mixture was bubbled with $N_2$ for another 20 minutes then brought to reflux for overnight. After workup, silica gel column chromatography (40% $CH_2Cl_2$ in hexanes), 2.2 g of product was obtained as a white solid. Compound 4S showed a triplet energy of 491 nm at 77K in 2-methylTHF.

Example 2

Synthesis of 7-(3-(triphenylen-2-yl)phenyl)triphenyleno[1,12-bcd]thiophene (or Compound 67S)

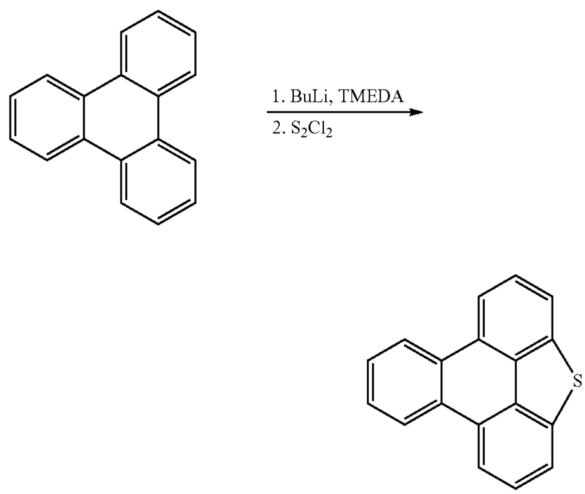

Synthesis of triphenyleno[1,12-bcd]thiophene

To an oven-dried 3-necked 250 mL round bottom flask equipped with a condenser and two rubber septa was added 100 mL of dry hexanes via cannula. The flask was cooled to −50° C. using acetone/dry ice bath. TMEDA (3.3 mL, 21.0 mmol) was added via syringe followed by n-BuLi (1.6 M, 13.7 mL, 21.9 mmol) via syringe. The solution was allowed to warm to room temperature. After stirring for 30 minutes, triphenylene (1.0 g, 4.38 mmol) was added and heated to reflux under $N_2$. The mixture became dark red and was refluxed for 3 h. $S_2Cl_2$ (0.9 mL, 10.95 mmol) was added to the cooled solution. A violent reaction occurred followed by precipitation of a solid. Water was then added and the mixture was extracted twice with $CH_2Cl_2$. The organic extracts were dried over $MgSO_4$, filtered, and evaporated and the residue was purified by silica gel column chromatography (0-2.5% $CH_2Cl_2$ in hexanes). 0.5 g of triphenyleno[1,12-bcd]thiophene was collected.

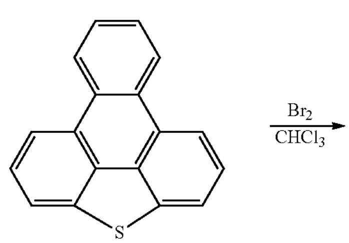

-continued

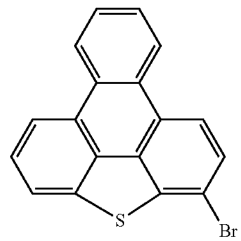

Synthesis of 7-bromotriphenyleno[1,12-bcd]thiophene

Triphenyleno[1,12-bcd]thiophene (1.5 g, 5.8 mmol) was dissolved in 100 mL of chloroform. $Br_2$ was slowly added into the reaction solution. After the reaction was stirred at room temperature for 3 days, the mixture was filtered through a Celite plug and washed by $CH_2Cl_2$. The combined filtrate was concentrated to get 2.2 g of 7-bromotriphenyleno[1,12-bcd] thiophene which was used for next step without further purification.

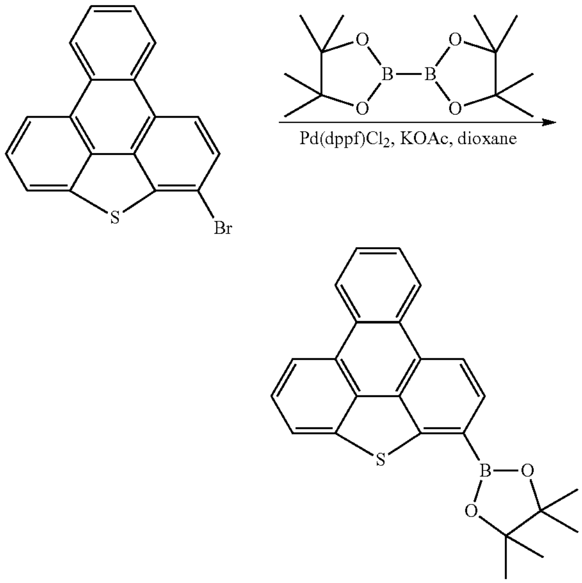

Synthesis of 4,4,5,5-tetramethyl-2-(triphenyleno[1,12-bcd]thiophen-3-yl)-1,3,2-dioxaborolane A mixture of 7-bromotriphenyleno[1,12-bcd]thiophene (2.2 g, 6.5 mmol), KOAc (1.6 g, 20 mmol) and 300 mL of dioxane was bubbled with $N_2$ for 25 minutes. Then Pd(dppf) $Cl_2$ (0.16 g, 0.2 mmol) was added and the mixture was bubbled with $N_2$ for another 25 minutes. The reaction was heated to 90° C. overnight. The mixture was then cooled to temperature, filtered through a Celite plug and washed by $CH_2Cl_2$. The combined filtrate was concentrated. The crude product was purified by silica gel silica column chromatography (3% EtOAc in hexanes) as elute to yield 0.25 g of product.

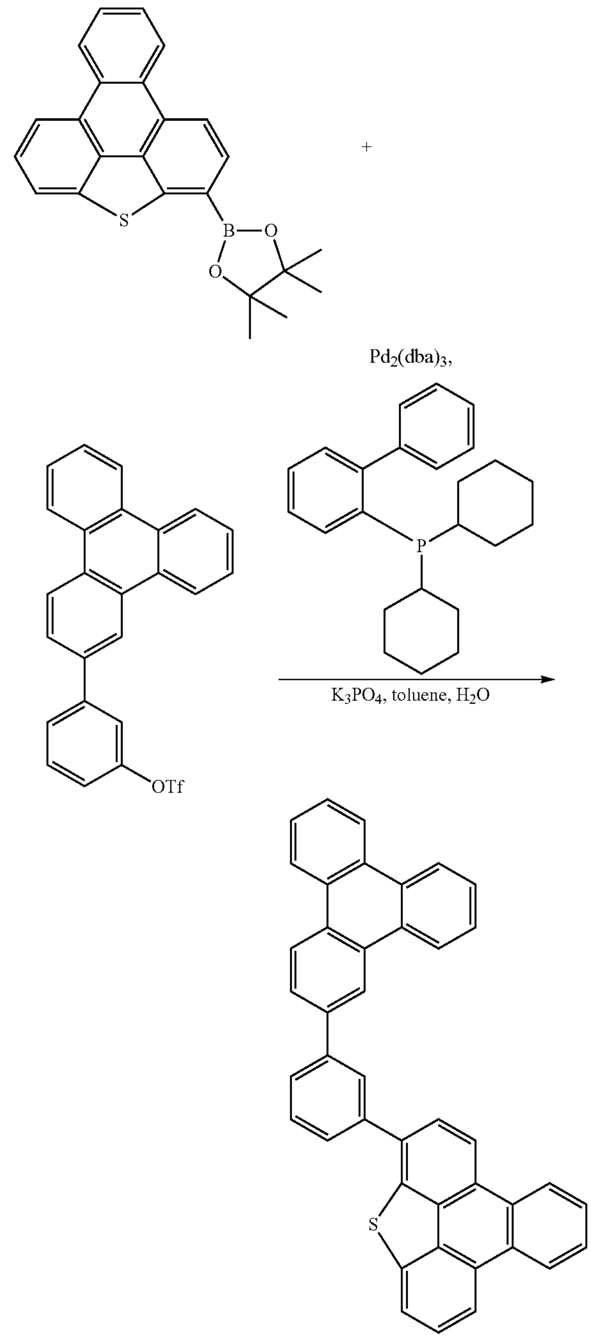

Compound 67S

Synthesis of Compound 67S

A mixture of 4,4,5,5-tetramethyl-2-(triphenyleno[1,12-bcd]thiophen-7-yl)-1,3,2-dioxaborolane (0.24 g, 0.62 mmol), 3-(triphenylen-2-yl)phenyl trifluoromethanesulfonate (0.26 g, 0.57 mmol), $K_3PO_4$ (0.36 g, 1.7 mmol), dioxane (30 mL) and water (3 mL) was bubbled with $N_2$ for 1 h. Then $Pd_2(dba)_3$ (5.2 mg, 0.0057 mmol) and (biphenyl-2-yl)dicyclohexylphosphine (8 mg, 0.023 mmol) was added and the mixture was bubbled with $N_2$ for another 15 minutes. After stirring at room temperature overnight, additional $Pd_2(dba)_3$ (5.2 mg, 0.0057 mmol) and (biphenyl-2-yl)dicyclohexylphosphine (8 mg, 0.023 mmol) were added. The reaction was stirred at room temperature for three days. The precipitate was collected by filtration and purified by silica gel column chromatography (0-40% of $CH_2Cl_2$ in hexanes) to yield 50 mg of product as a white solid that showed a triplet energy of 490 nm at 77 K in 2-methylTHF.

Example 3

Synthesis of Phenanthro[4,5-bcd]thiophene

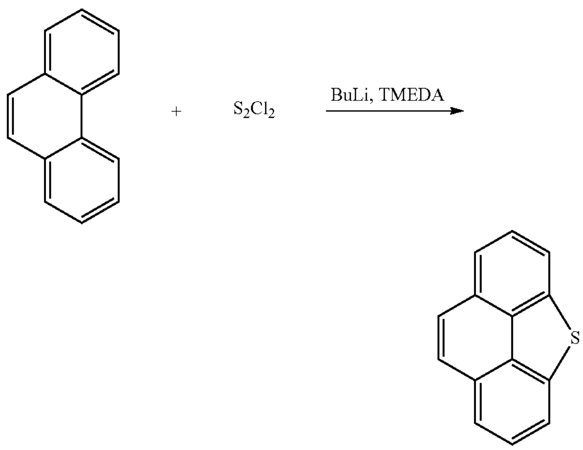

The synthesis is based on Heteroatom Chemistry, 5(2), 113-19, 1994. To an oven-dried 3-neck 1 L round bottom flask equipped with a condenser and a dropping funnel was added phenanthrene (5.7 g, 32 mmol) and 220 mL of dry hexanes. TMEDA (24 mL, 160 mmol) was added followed by n-BuLi (1.6 M, 100 mL, 160 mmol) dropwise via a dropping funnel. The solution was heated to reflux for 3 h under $N_2$. The reaction mixture was cooled in an ice bath and $S_2Cl_2$ (6.4 mL, 80.0 mmol) was added slowly. The reaction mixture was allowed to stir overnight at room temperature. Water and $CH_2Cl_2$ were added and the layers were separated. The aqueous layer was extracted with $CH_2Cl_2$. The organic extracts were dried over $MgSO_4$, filtered, and evaporated. The material was purified by silica gel column chromatography (0-10% $CH_2Cl_2$ in hexanes) to yield 2.3 g of an off-white solid contaminated with sulfur. Another column chromatography eluting with hexanes provided 0.42 g of pure material. Phenanthro[4,5-bcd]thiophene showed a triplet energy of 508 nm at 77K in 2-methylTHF.

Example 4

Synthesis of Benzo[b]phenanthro[9,10-d]thiophene

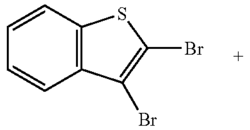

-continued

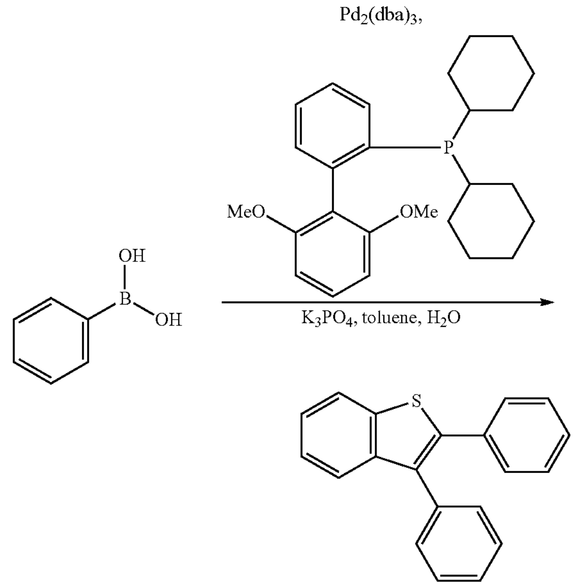

The synthesis is based on Tetrahedron, 37(1), 75-81, 1981. To a 500 mL 3-neck round bottom flask was added 2,3-dibromobenzo[b]thiophene (5.0 g, 17.12 mmol), phenylboronic acid (5.2 g, 42.81 mmol), 2-dicyclohexylphosphino-2',6'-dimethoxybiphenyl (281 mg, 0.68 mmol), $K_3PO_4$ (11.8 g, 51.36 mmol), 150 mL of toluene and 5 mL of water. $N_2$ was bubbled directly into the flask for 20 minutes. $Pd_2(dba)_3$ (157 mg, 0.171 mmol) was added to the reaction mixture which was then heated to reflux for 5 h. Water was added to the cooled reaction mixture and the layers were separated. The aqueous layer was extracted twice with $CH_2Cl_2$ and the organic extracts were dried over $MgSO_4$, filtered, and evaporated to yield a red oil which was dried to give 5.71 g of a red solid. The solid was purified by silica gel column chromatography (10-20% $CH_2Cl_2$ in hexanes) to yield 4.81 g of the product as a white solid.

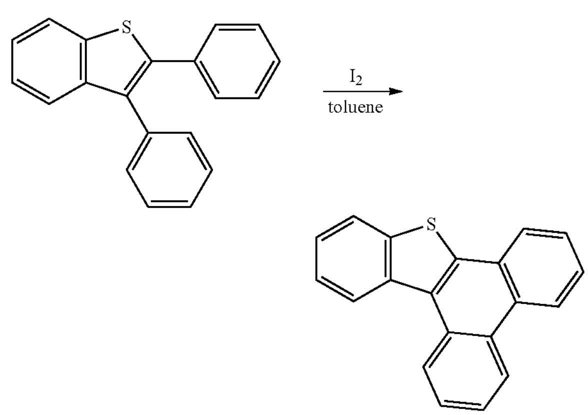

A photoreactor was loaded with 2,3-diphenylbenzo[b]thiophene (4.81 g, 16.8 mmol) and 800 mL toluene. The solution was irradiated using a medium pressure mercury lamp for 12 h. The solvent was evaporated and the residue was purified by silica gel column chromatography (0-20% of EtOAc in hexanes). The product was collected and recrystallized from hexanes (with a small amount of EtOAc to initially dissolve the material) to yield 1.61 g of product an off-white solid. Benzo[b]phenanthro[9,10-d]thiophene showed a triplet energy of 488 nm at 77 Kin 2-methylTHF.

Example 5

Synthesis of benzo[b]triphenyleno[2,1-d]thiophene

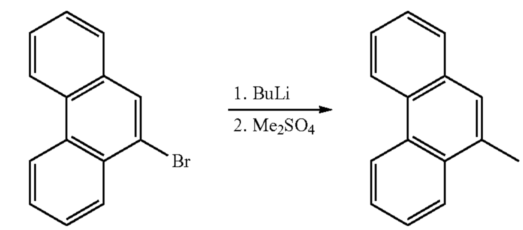

This synthesis is based on Journal of Heterocyclic Chemistry, 21(6), 1775-9, 1984.

Synthesis of 9-methylphenanthrene

9-Bromophenanthrene (27 g, 102 mmol) was dissolved in 400 mL of dry ether and cooled to −78° C. 170 mL of BuLi (1.6 M in hexane) was slowly added into this solution in 45 minutes. The reaction mixture was warmed to room temperature. The mixture was then stirred at room temperature for 2 h before it was cooled to −78° C. again and $Me_2SO_4$ (17.6 g, 133 mmol) in ether was slowly added. The mixture was stirred at room temperature for 10 h. The mixture was poured into 15% HCl aqueous solution and extracted with $CH_2Cl_2$ and dried over $MgSO_4$. The solvent was evaporated to give a residue which was recrystallized from hexane to yield 14.2 g of product as a white solid.

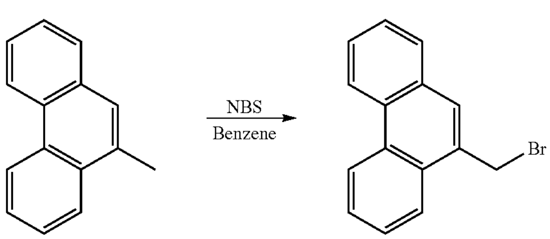

Synthesis of 9-(bromomethyl)phenanthrene

A mixture of 9-methylphenanthrene (14.2 g, 74 mmol), benzoyl peroxide (40 mg, 0.16 mmol) and NBS (13.3 g, 74.6 mmol) in 210 mL of benzene was refluxed for 5 h. The reaction mixture was cooled to 0° C. and the succinimide precipitated was removed by filtration. The filtrate was washed by 15% NaOH, dried over $MgSO_4$ and concentrated to yield 18 g of product which was used for the next step without further purification.

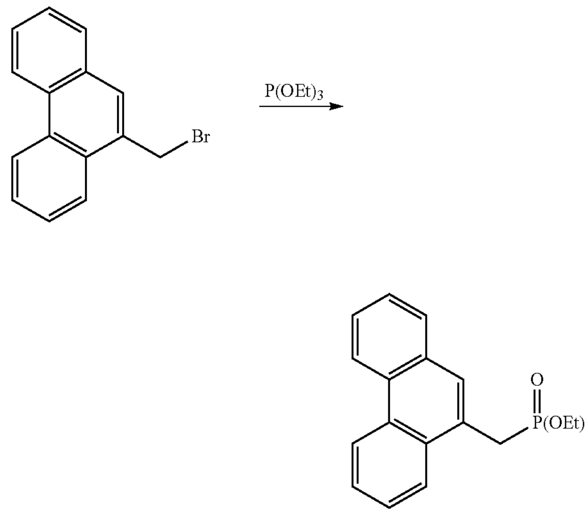

Synthesis of diethyl (phenanthren-9-ylmethyl)phosphonate 9-(Bromomethyl)phenanthrene (18 g, 66.4 mmol) and triethyl phosphite (10.7 g) were mixed and heated to 150° C. under $N_2$ for 4 h. The reaction mixture was concentrated and the residue was purified by silica gel column chromatography to yield 12 g of product.

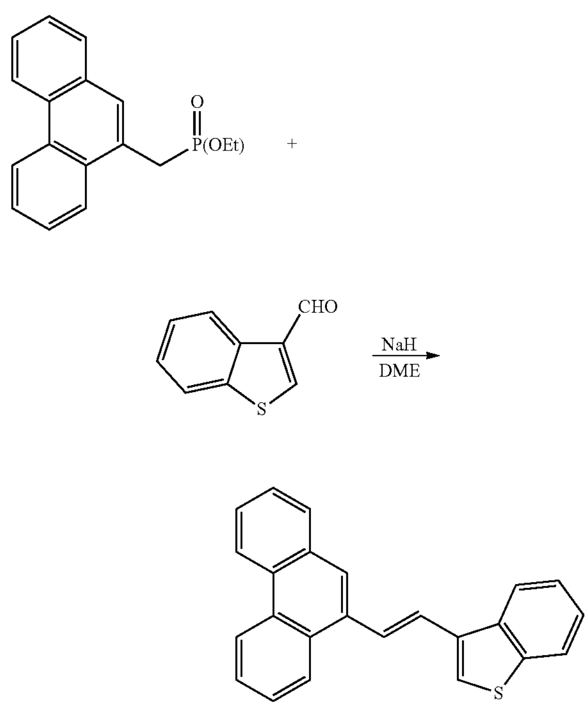

Synthesis of 3-(2-(phenanthren-9-yl)vinyl)benzo[b]thiophene

Diethyl(phenanthren-9-ylmethyl)phosphonate (11 g, 33.5 mmol) and 3-carbaldehydebenzo[b]thiophene (5.5 g, 33.5 mmol) were dissolved in 250 mL of 1,2-dimethoxyethane. The mixture was cooled to 0° C. and NaH (6 g, 150 mmol) was added in portions. The reaction mixture was warmed to room temperature and heated to reflux for 2.5 h. The reaction mixture was concentrated and the residue was purified by silica gel column chromatography (30% $CH_2Cl_2$ in hexane) to yield 6 g of product.

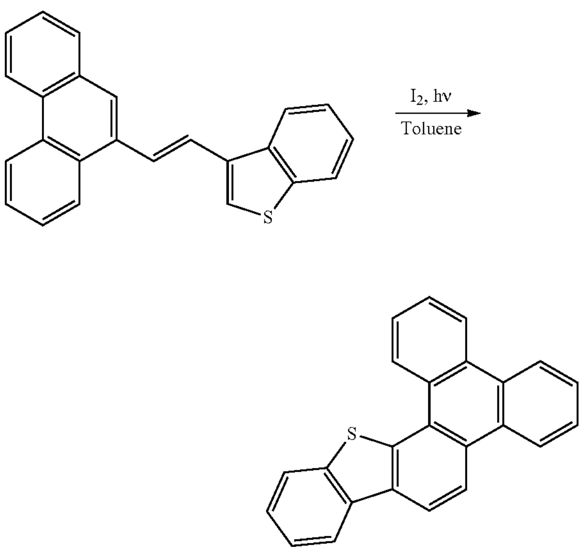

Synthesis of benzo[b]triphenyleno[2,1-d]thiophene 3-(2-phenanthren-9-yl)vinyl)benzo[b]thiophene (0.5 g, 1.5 mmol), $I_2$ (38 mg, 0.15 mmol) and 250 mL of toluene were charged in a photo reactor. The reaction mixture was irradiated with a medium pressure mercury lamp for 3.5 h. The reaction mixture was concentrated to give a residue which was purified by silica gel chromatography (10% $CH_2Cl_2$ in hexanes) to yield 0.3 g of product. Benzo[b]triphenyleno[2,1-d]thiophene showed a triplet energy of 463 nm at 77K in 2-methylTHF.

Device Examples

All example devices were fabricated by high vacuum (<$10^{-7}$ Torr) thermal evaporation. The anode electrode was 1200 Å of indium tin oxide (ITO). The cathode consisted of 10 Å of LiF followed by 1,000 Å of Al. All devices were encapsulated with a glass lid sealed with an epoxy resin in a nitrogen glove box (<1 ppm of $H_2O$ and $O_2$) immediately after fabrication, and a moisture getter was incorporated inside the package.

The organic stack of Device Examples 1-4 in Table 1 consisted of sequentially, from the ITO surface, 100 Å of Compound A as the hole injection layer (HIL), 300 Å of 4,4'-bis[N-(1-naphthyl)-N-phenylamino]biphenyl (α-NPD) as the hole transporting layer (HTL), 300 Å of Compound 4S doped with 10 or 15 wt % of Compound A as the emissive layer (EML), 100 Å or 50 Å of Compound 69S or Compound B as the ETL2 and 400 Å or 450 Å of $Alq_3$ (tris-8-hydroxyquinoline aluminum) as the ETL1.

Comparative Device Example 1 was fabricated similarly to the Device Example 3 except that the CBP was used as the host.

The device data for the Device Examples and Comparative Device Examples is shown in Table 2. Ex. is an abbreviation for example. Comp. is an abbreviation for comparative. Cmpd. is an abbreviation for compound.

TABLE 2

Device Example and Comparative Device Example data.

| | | | | at 1000 cd/m$^2$ | | | | | | at 40 mA/cm$^2$ | |
|---|---|---|---|---|---|---|---|---|---|---|---|
| Device Ex. | Cmpd. A % | ETL2 (Å) | ETL1 (Å) | x | x | V (V) | LE (cd/A) | EQE (%) | PE (lm/W) | $L_0$ (cd/m$^2$) | $LT_{80}$ (h) |
| 1 | 10 | 69S (100) | $Alq_3$ (400) | 0.371 | 0.595 | 7.2 | 31 | 8.6 | 13.5 | 8,878 | 80 |
| 2 | 15 | 69S (100) | $Alq_3$ (400) | 0.369 | 0.598 | 6.9 | 34.6 | 9.6 | 15.7 | 9,816 | 141 |
| 3 | 10 | B (50) | $Alq_3$ (450) | 0.369 | 0.598 | 6.5 | 35.5 | 9.8 | 17.1 | 9,497 | 72 |
| 4 | 15 | B (50) | $Alq_3$ (450) | 0.367 | 0.602 | 6.1 | 46.8 | 12.9 | 24.1 | 11,974 | 95 |
| Comp. Ex. 1 | 10 | B (50) | $Alq_3$ (450) | 0.345 | 0.615 | 5.8 | 61 | 16.7 | 33.0 | 16,118 | 82 |

As used herein, the following compounds have the following structures:

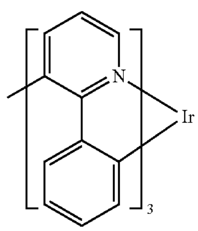

Compound A

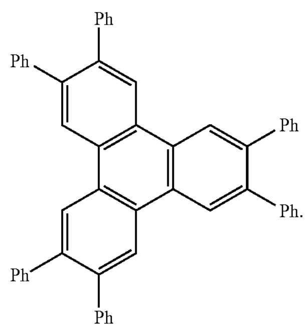

Compound B

Device Examples use Compound 69S as the host. The external quantum efficiencies are 8.8-12.9%, which is lower than the efficiency of the Comparative Device Example which uses CBP as the host. The reason may be a certain degree of luminescence quenching of the phosphorescence of Compound A by Compound 69S due to the similar triplet energy (Compound 69S $T_1$=491 nm; Compound A $T_1$=525 nm). However, the operational lifetime of the Device Examples are respectable compared to that of the Comparative Device Example. Device Example 2 has a $LT_{80}$ (time required for the initial luminance $L_0$ to drop from 80%) of 141 h whereas Comparative Device Example 1 has a $LT_{80}$ of 82 h. The result demonstrates the stability of the triphenylene-benzo-/dibenzo-moiety compounds with fused rings. Since the triplet energy of triphenylene-benzo-/dibenzo-moiety compounds with benzo fused rings may be lower than 490 nm, they may be particularly suitable as host materials for yellow, orange, red or IR phosphorescent emitters.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A compound comprising one of the formulae:

Formula 2

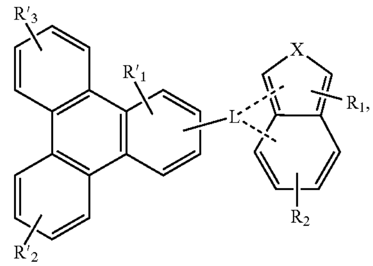

Formula 3

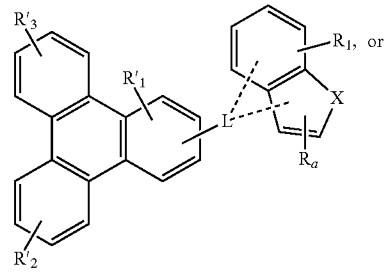

Formula 4

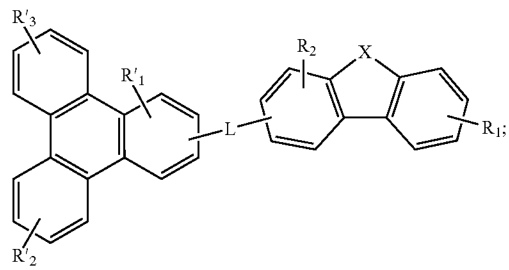

wherein X is S or Se;

wherein $R_1$, $R_2$, and $R_a$ are independently selected from hydrogen, deuterium, alkyl, alkoxy, amino, alkenyl, alkynyl, arylkyl, aryl, and heteroaryl;

wherein each of $R_1$ and $R_2$ represent mono, di, tri or tetra substituents;

wherein at least two substituents of $R_1$ or $R_2$ are joined to form a fused ring;

wherein $R_a$ represents mono or di substituents which cannot fuse to form a benzo ring; and wherein L represents a spacer or a direct connection to the benzothiophene, or benzoselenophene moiety with additional fused rings;

wherein $R'_1$, $R'_2$, and $R'_3$ are independently selected from the group consisting of hydrogen, deuterium, alkyl, alkoxy, amino, alkenyl, alkynyl, arylkyl, aryl, and heteroaryl;

wherein each of $R'_1$, $R'_2$, and $R'_3$ may represent mono, di, tri, or tetra substituents.

2. The compound of claim 1, wherein the at least two substituents of $R_1$ or $R_2$ are joined to form a 6-membered carbocyclic or heterocyclic ring.

3. The compound of claim 2, the at least two substituents of $R_1$ or $R_2$ are joined to form a benzene ring.

4. The compound of claim 1, wherein the compound has the formula:

Formula 4

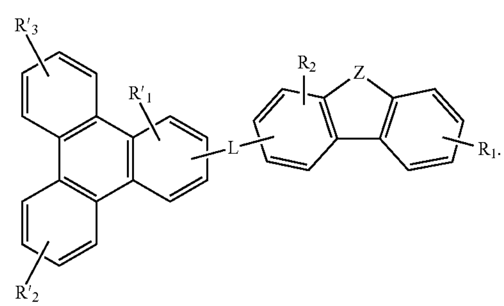

5. The compound of claim 1, wherein X is S.

6. The compound of claim 1, wherein L is a direct connection.

7. The compound of claim 1, wherein L has the formula:

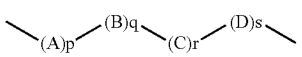

wherein A, B, C and D are independently selected from the group consisting of:

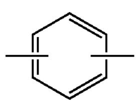, 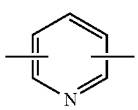, 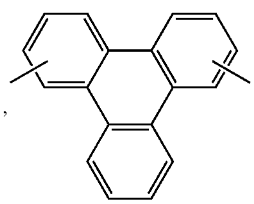, 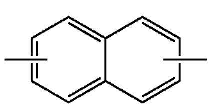, 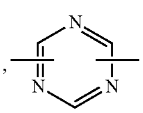, 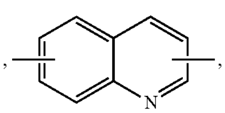, 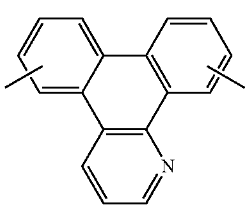, 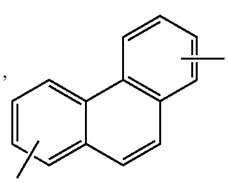, and 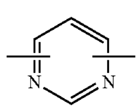, wherein A, B, C and D are optionally further substituted with $R_a$;

wherein each of p, q, r and s are 0, 1, 2, 3, or 4; and wherein p+q+r+s is at least 1.

8. The compound of claim 1, wherein L is phenyl.

9. The compound of claim 1, wherein the at least two substituents of $R_1$ or $R_2$ that are joined to form fused rings form a ring system selected from the group consisting of:

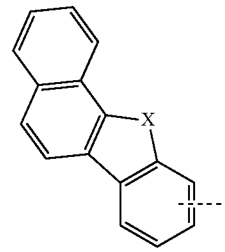, 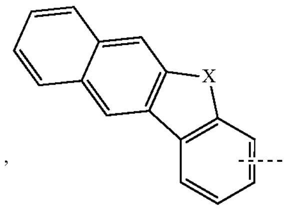, 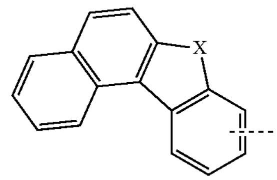, 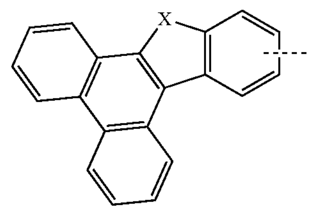, 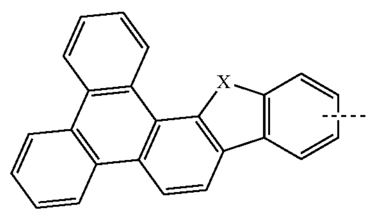, 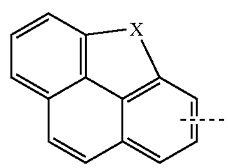, and 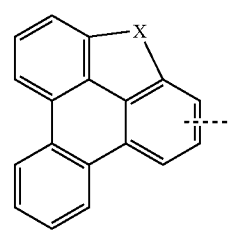.

10. The compound of claim 1, wherein the compound is selected from the group consisting of:

Formula 4-1

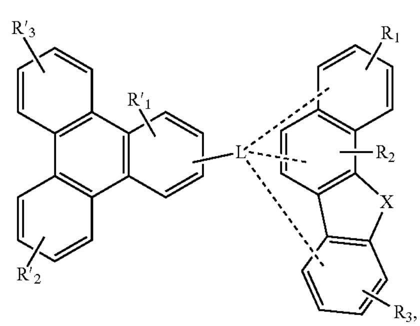

-continued
Formula 4-2
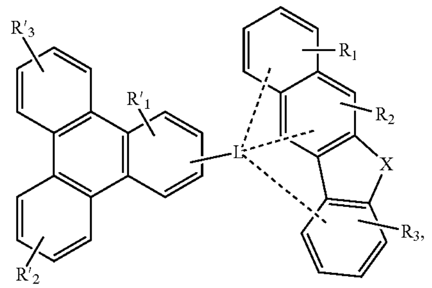
Formula 4-3
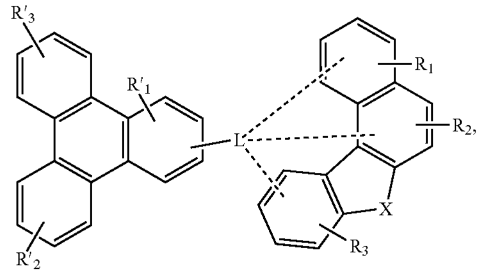
Formula 4-4
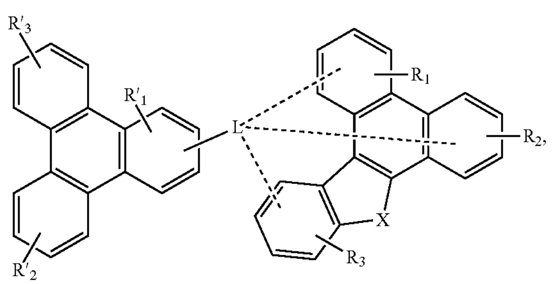
Formula 4-5
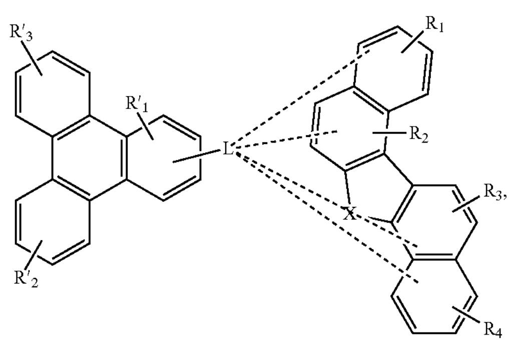
Fromula 4-6
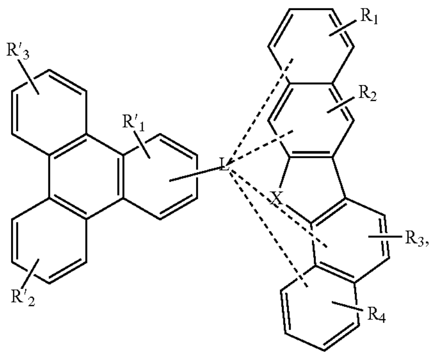
-continued
Formula 4-7
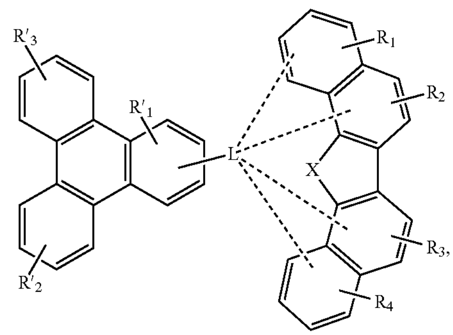
Formula 4-8
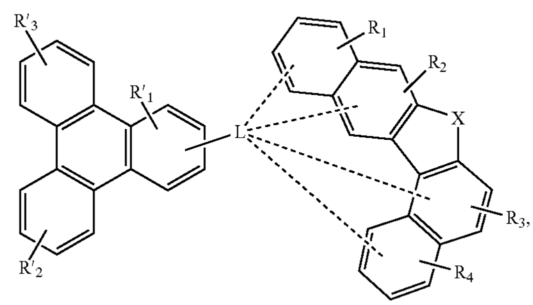
Formula 4-9
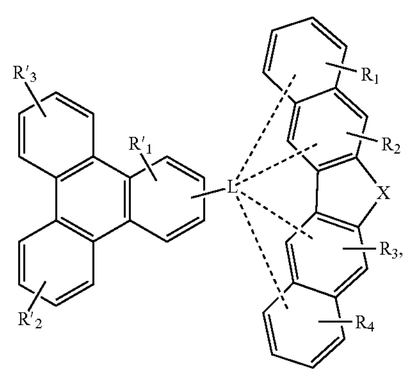
Formula 4-10
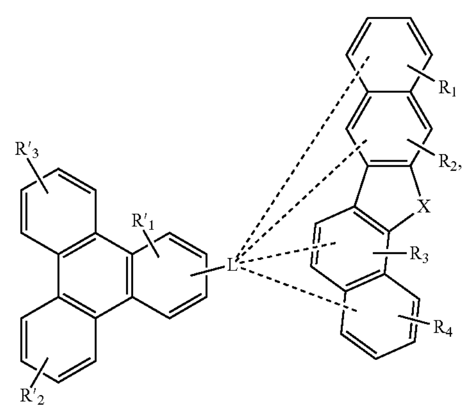

-continued
Formula 4-11
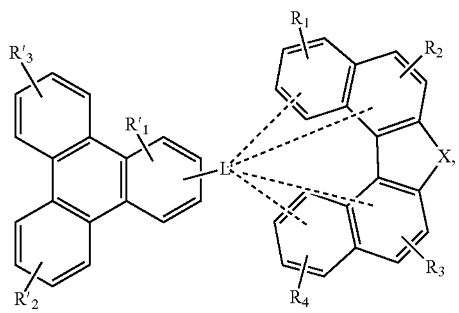
Formula 4-12
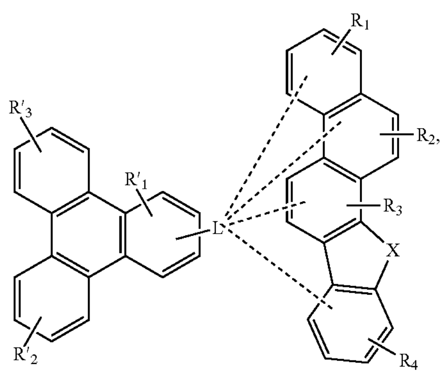
Formula 4-13
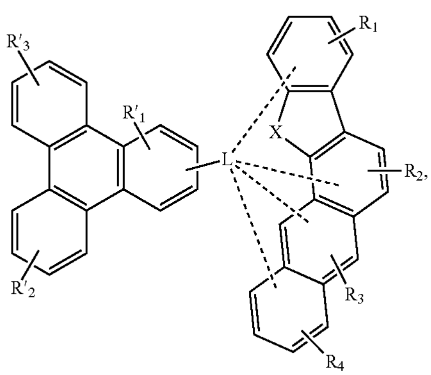
Formula 4-14
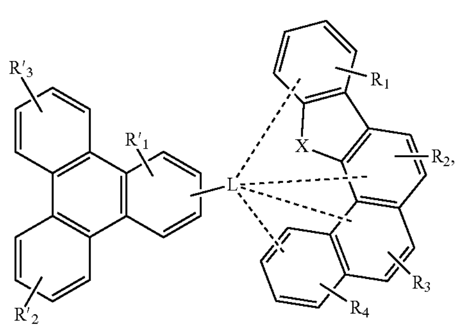
-continued
Formula 4-15
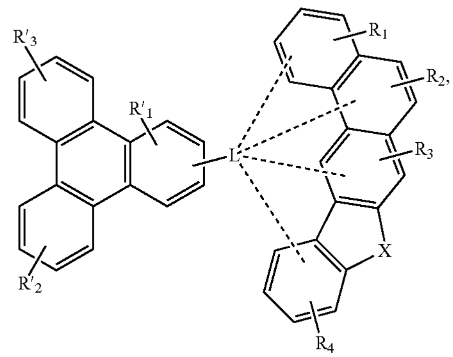
Formula 4-16
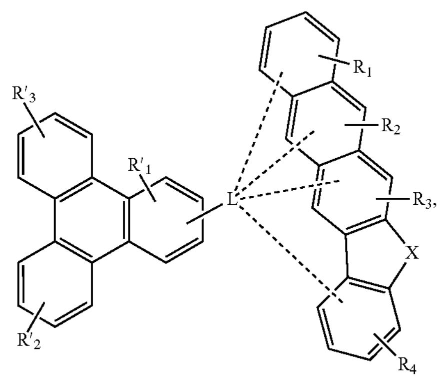
Formula 4-17
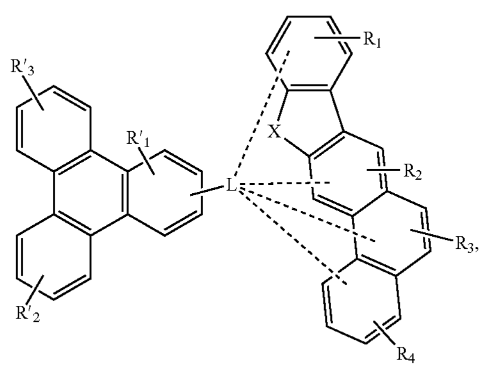
Formula 4-18
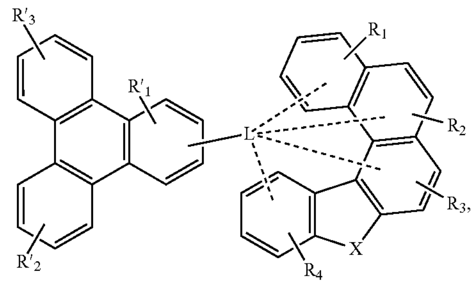

-continued
Formula 4-19
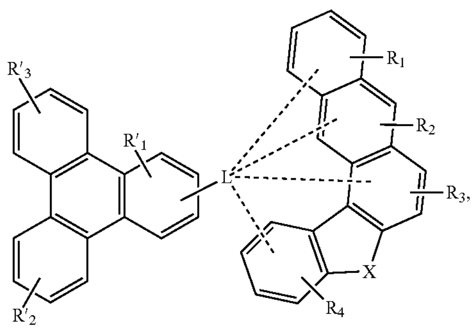
Formula 4-20
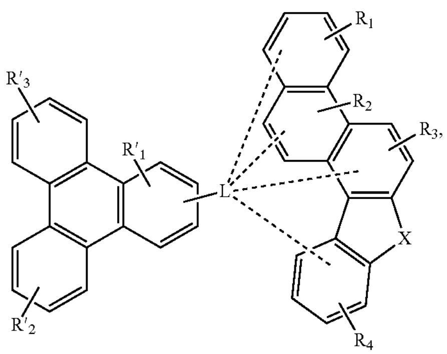
Formula 4-21
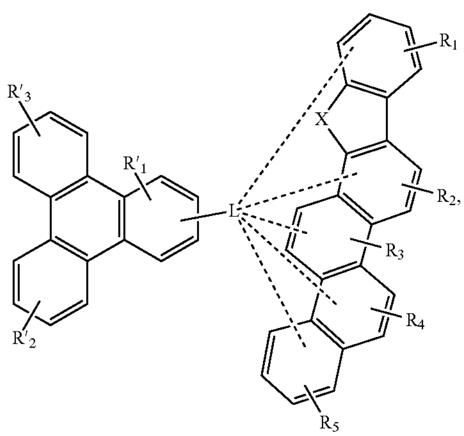
Formula 4-22
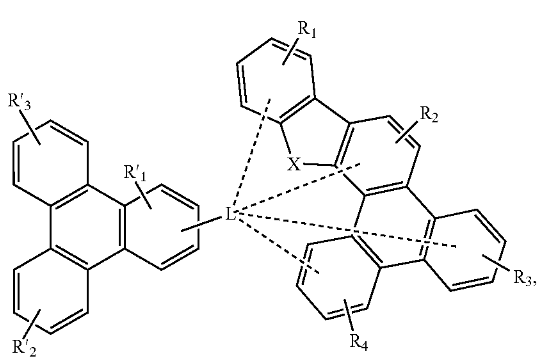
-continued
Formula 4-23
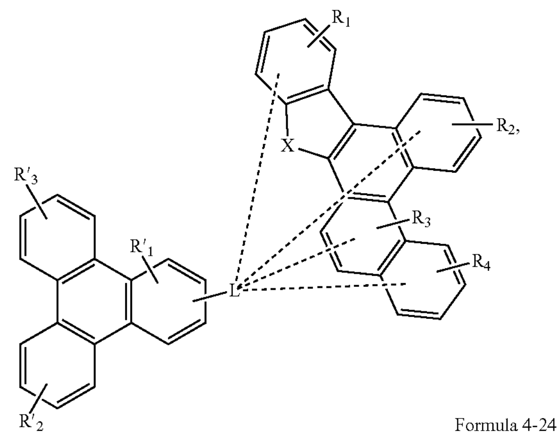
Formula 4-24
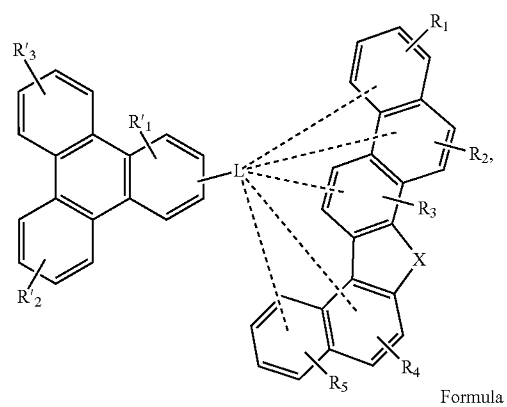
Formula 4-25
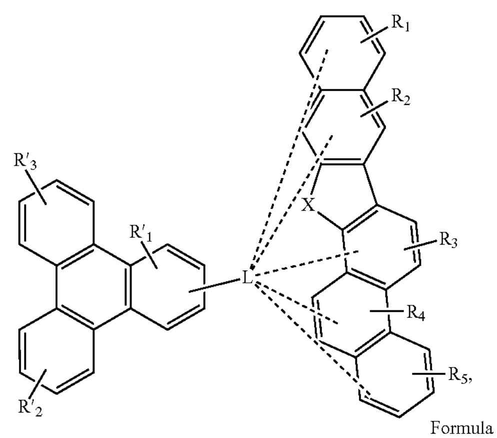
Formula 4-26
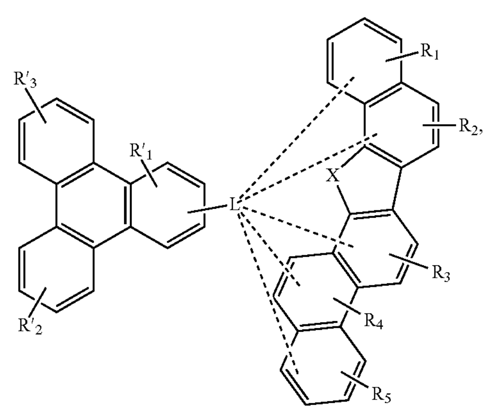

Formula 4-27

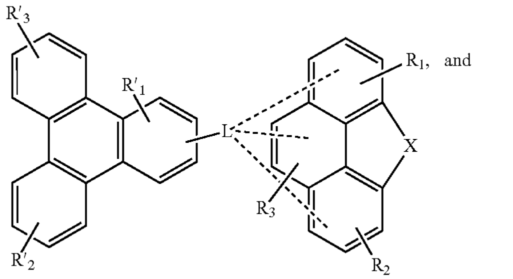

Formula 4-28

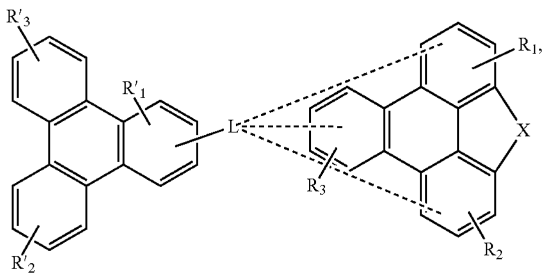

wherein X is S or Se;

wherein $R_1$, $R_2$, $R_3$, $R_4$, $R_5$, $R'_1$, $R'_2$, and $R'_3$ are independently selected from the group consisting of hydrogen, deuterium, alkyl, alkoxy, amino, alkenyl, alkynyl, arylkyl, aryl, and heteroaryl;

wherein each of $R_1$, $R_2$, $R_3$, $R_4$, $R_5$, $R'_1$, $R'_2$, and $R'_3$ may represent mono, di, tri or tetra substituents; and wherein L is a spacer or a direct linkage.

11. The compound of claim 1, wherein the compound is selected from the group consisting of:

Compound 3

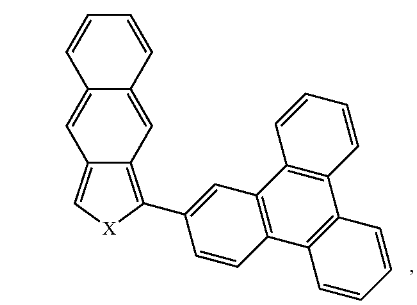

Compound 4

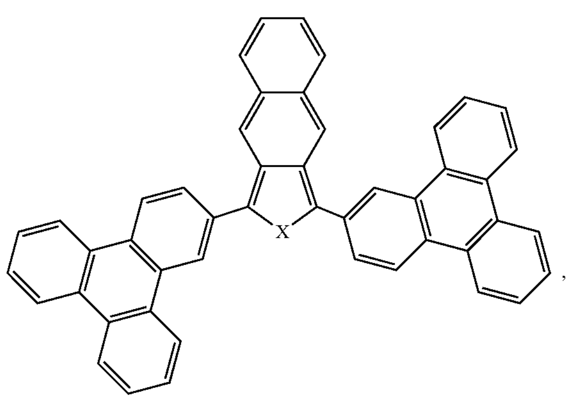

Compound 3

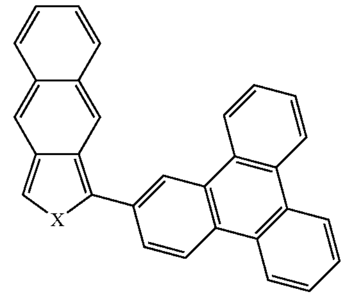

Compound 5

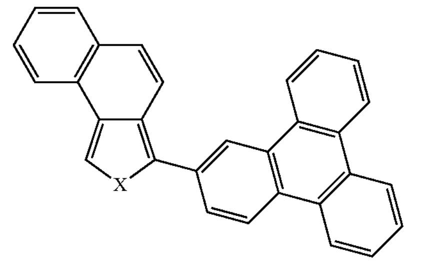

Compound 6

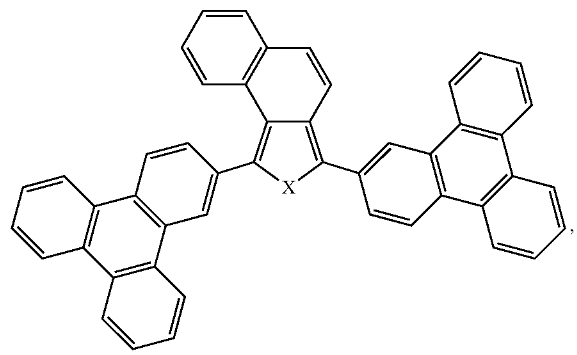

Compound 7

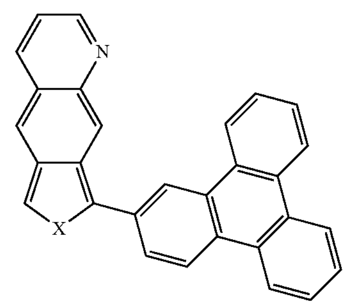

Compound 8

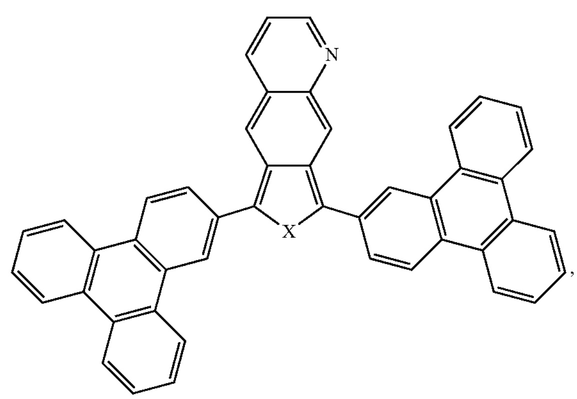

-continued
Compound 9
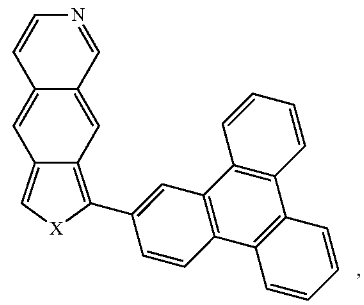
Compound 10
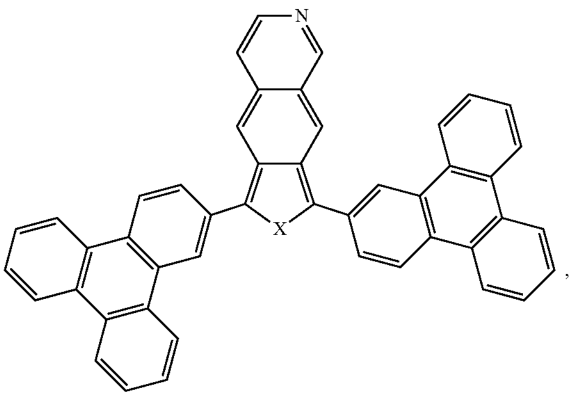
Compound 11
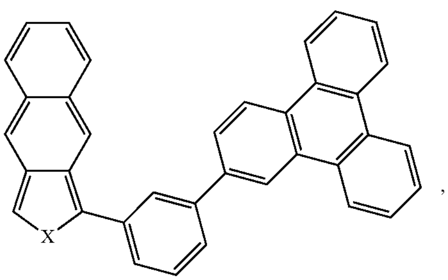
Compound 12
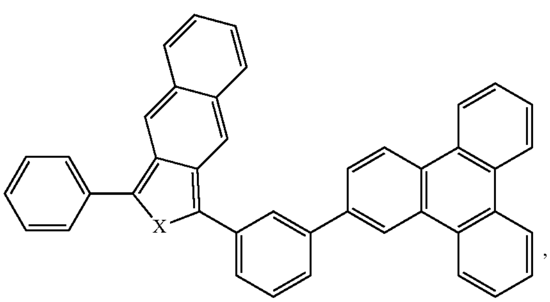
Compound 13
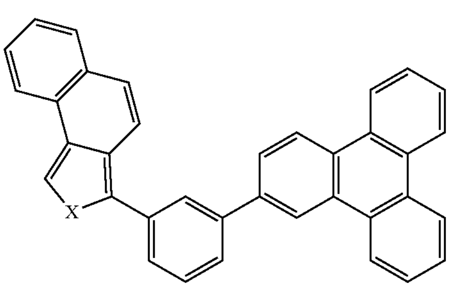
-continued
Compound 14
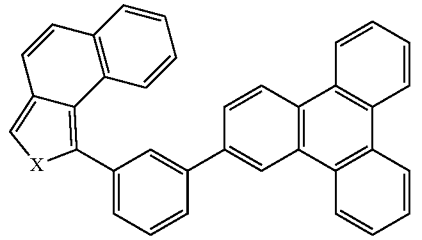
Compound15
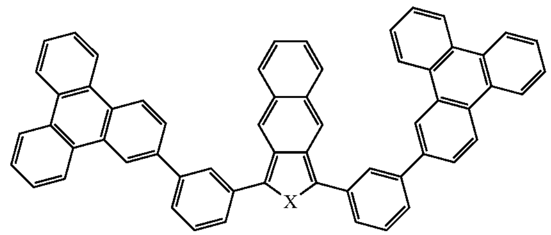
Compound 16
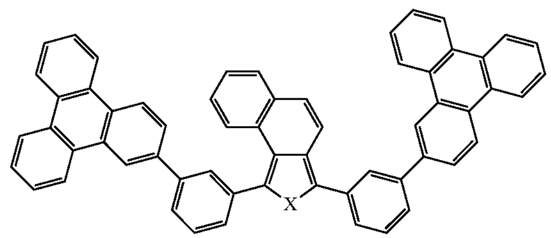
Compound 17
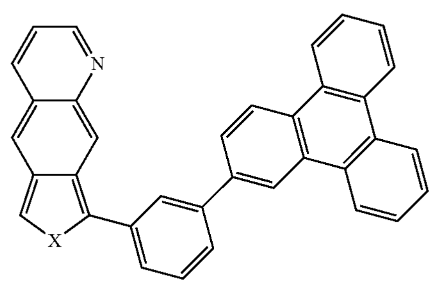
Compound 18
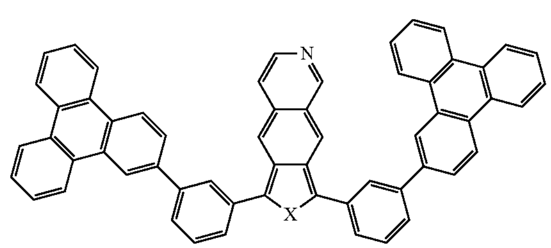

Compound 19
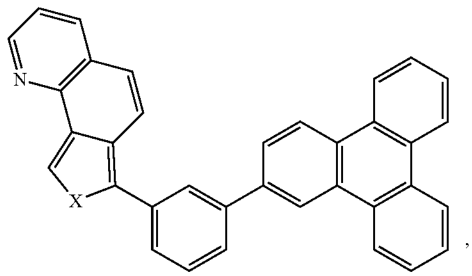
Compound 20
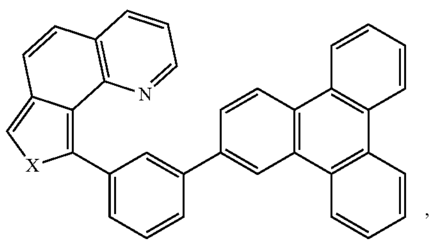
Compound 21
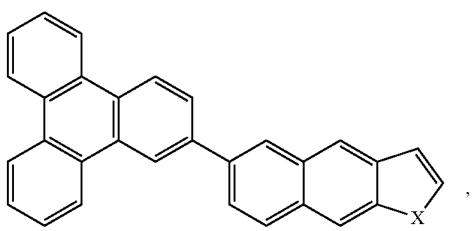
Compound 22
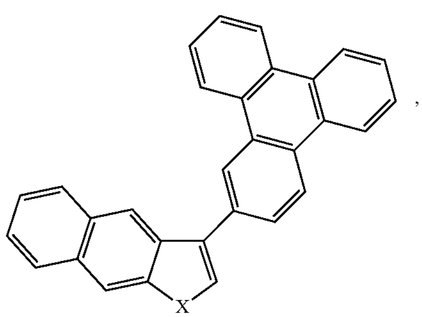
Compound 23
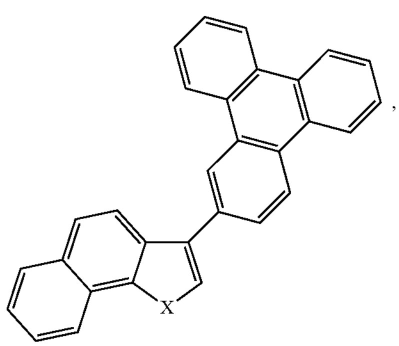
Compound 24
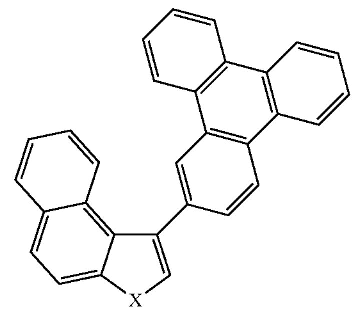
Compound 25
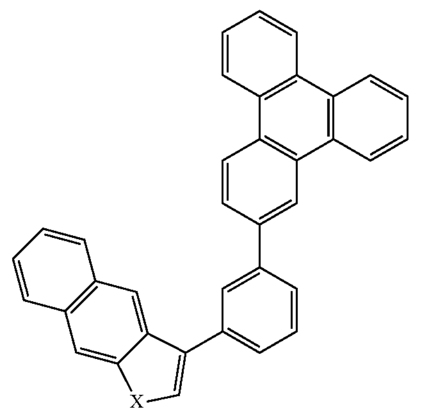
Compound 26
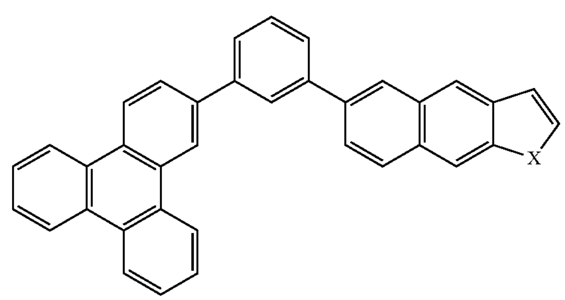
Compound 27
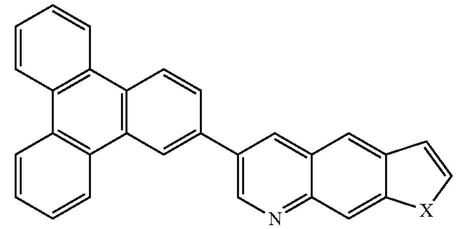

Compound 28
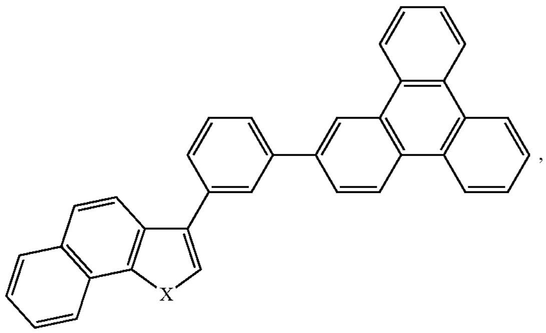
Compound 29
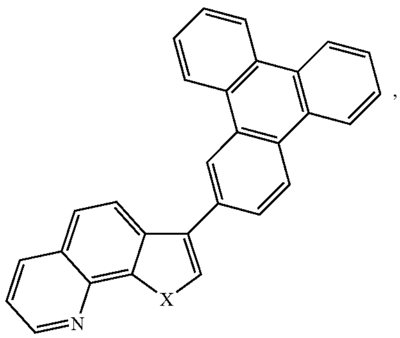
Compound 30
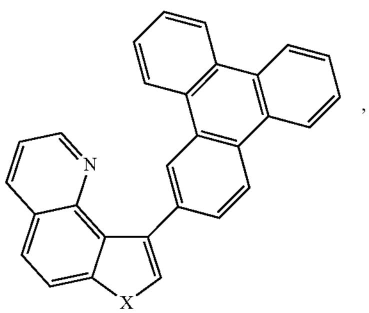
Compound 31
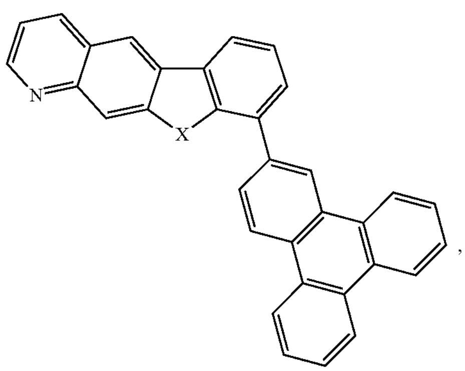
Compound 32
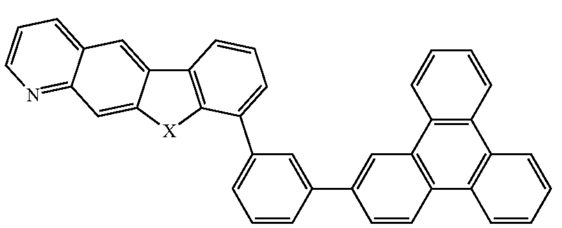
Compound 33
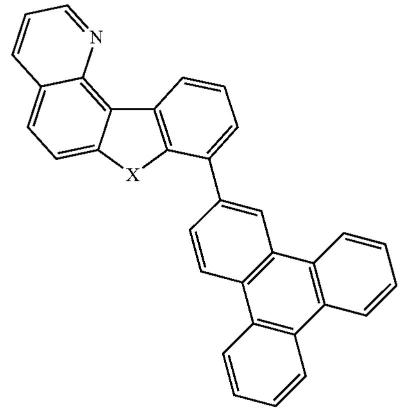
Compound 34
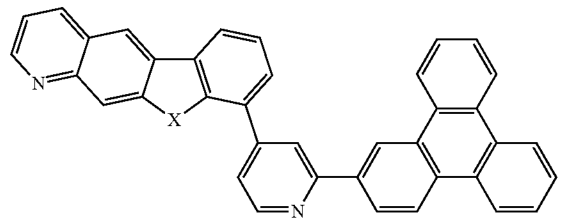
Compound 35
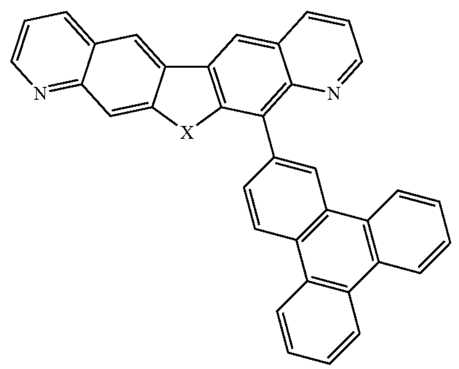
Compound 36
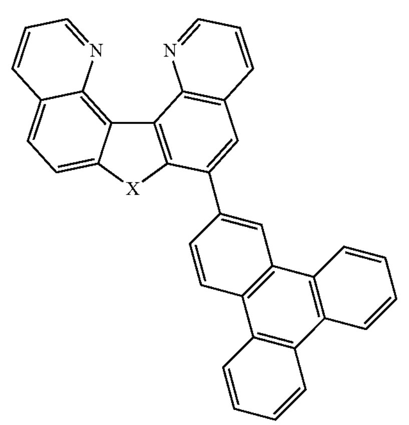

-continued
Compound 37
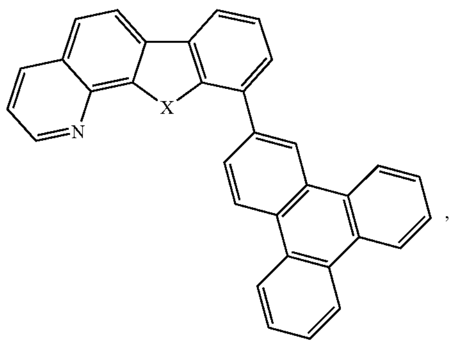
Compound 38
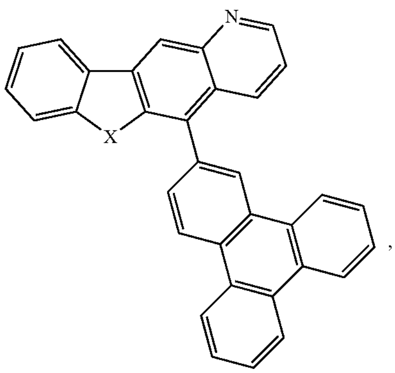
Compound 39
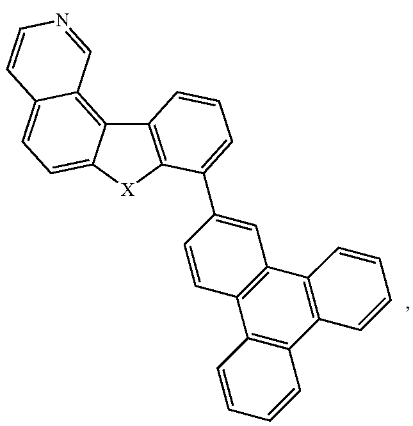
Compound 40
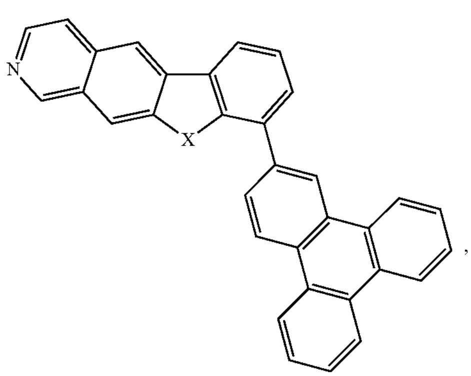
-continued
Compound 41
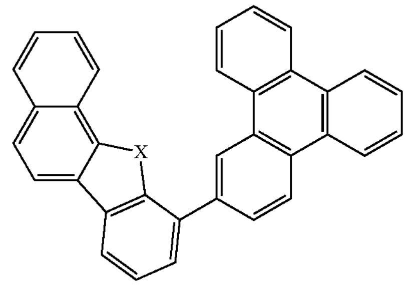
Compound 42
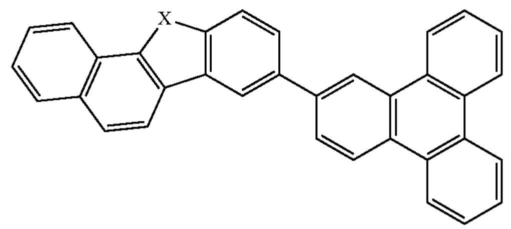
Compound 43
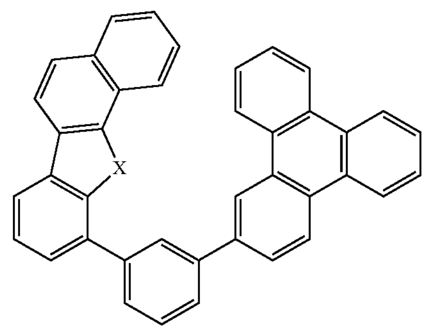
Compound 44
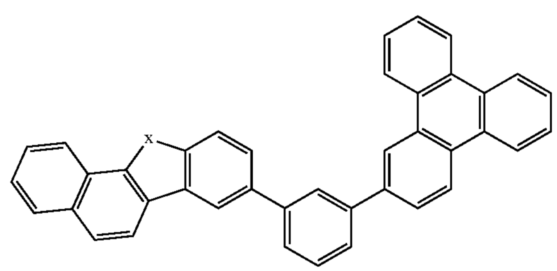
Compound 45
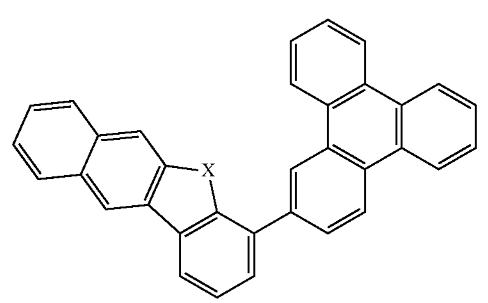

-continued
Compound 46
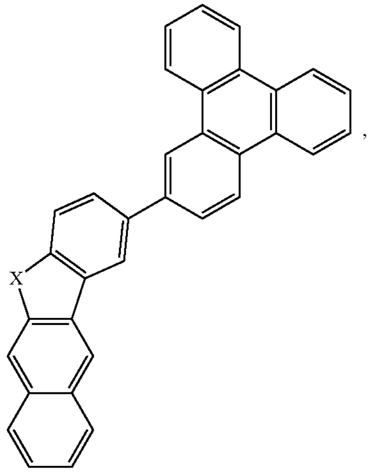
Compound 47
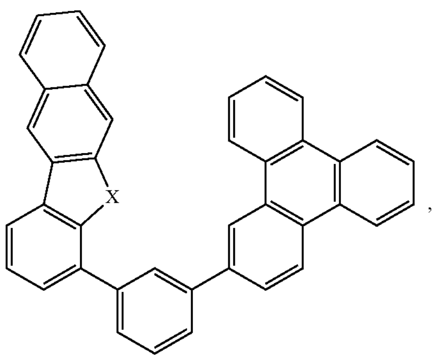
Compound 48
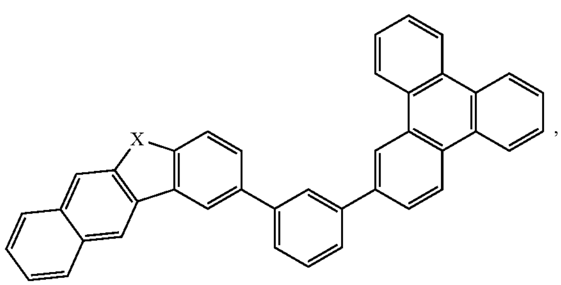
Compound 49
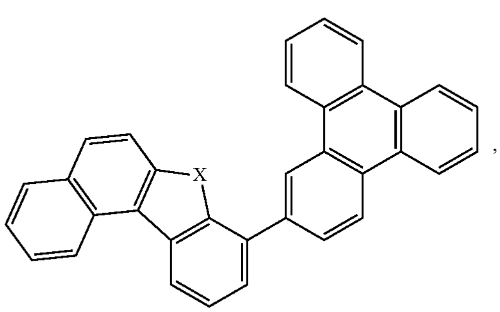
-continued
Compound 50
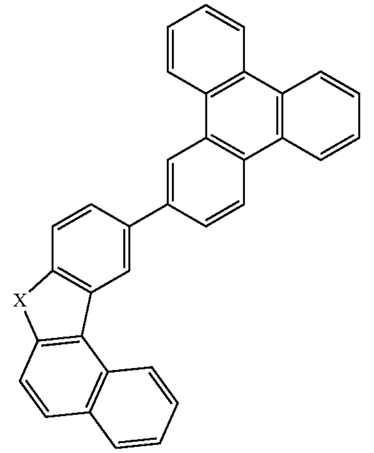
Compound 51
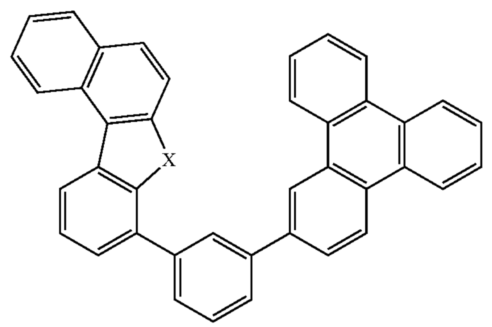
Compound 52
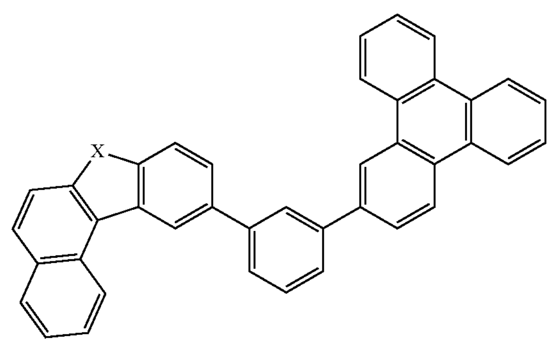
Compound 53
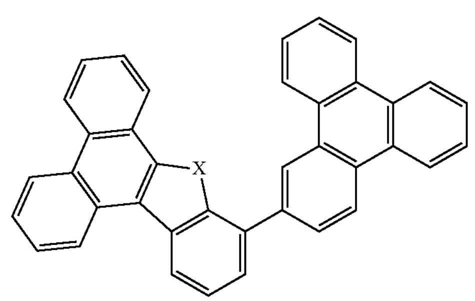

-continued
Compound 54
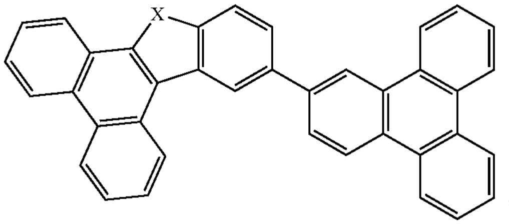
Compound 55
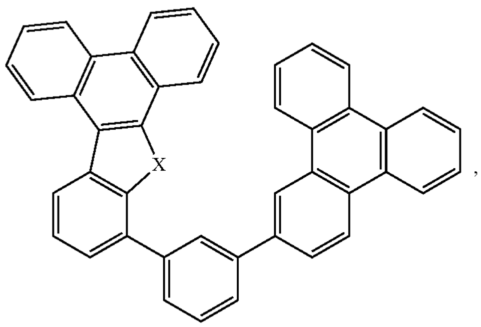
Compound 56
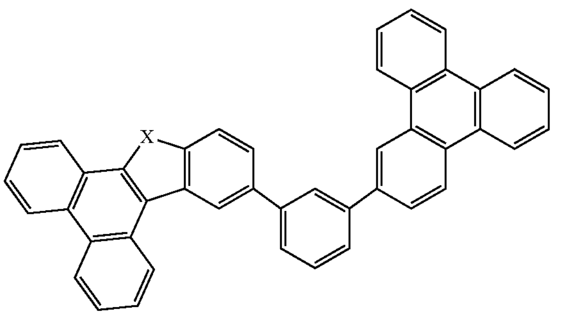
Compound 57
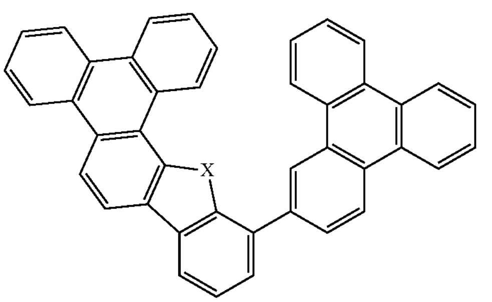
Compound 58
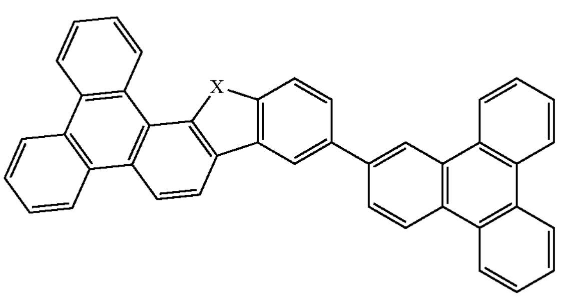
-continued
Compound 59
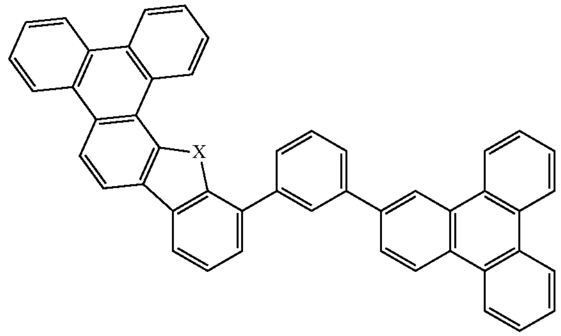
Coumpound 60
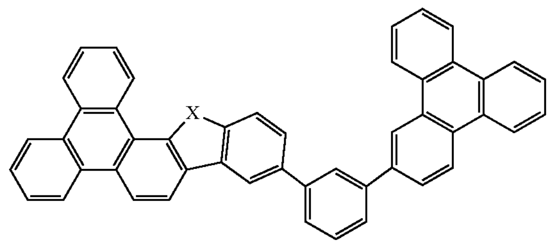
Compound 61
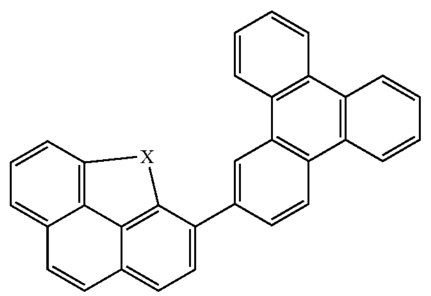
Compound 62
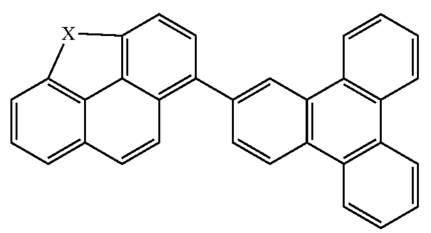
Compound 63
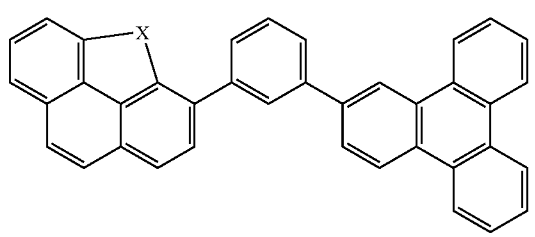

-continued

Compound 64

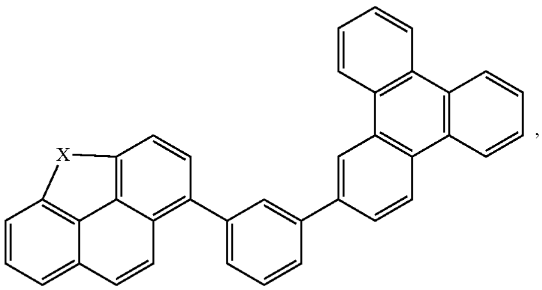

Compound 65

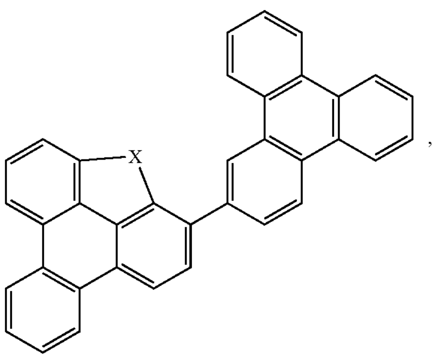

Compound 66

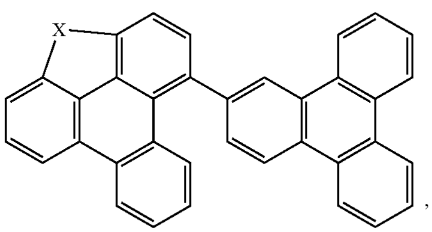

Compound 67

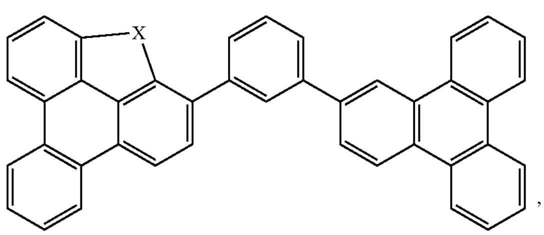

Compound 68

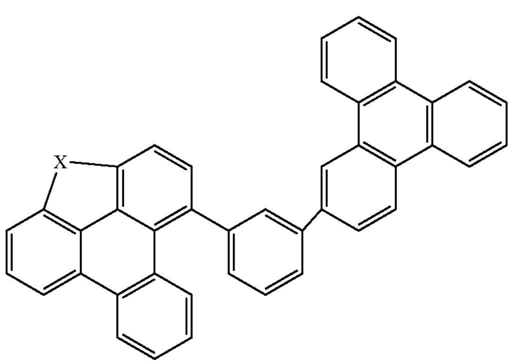

, and

-continued

Compound 69

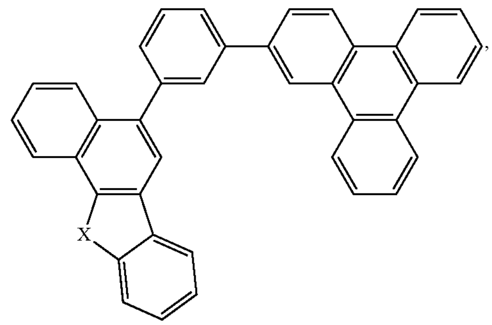

wherein X is S, or Se.

12. A first device comprising an organic light emitting device, further comprising:

an anode;

a cathode; and an organic layer, disposed between the anode and the cathode, wherein the organic layer comprises a compound comprising one of the formulae:

Formula 2

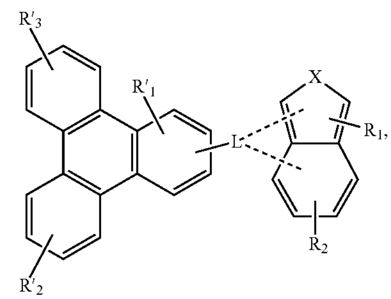

Formula 3

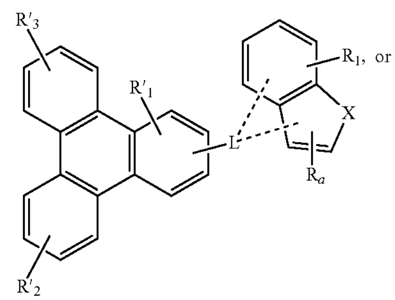

Formula 4

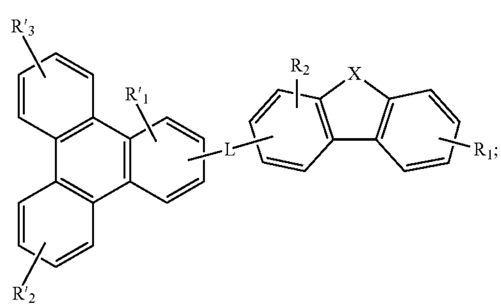

wherein X is S or Se;

wherein $R_1$, $R_2$, and $R_a$ are independently selected from hydrogen, deuterium, alkyl, alkoxy, amino, alkenyl, alkynyl, arylkyl, aryl, and heteroaryl;

wherein each of $R_1$ and $R_2$ may represent mono, di, tri or tetra substituents;

wherein at least two substituents of $R_1$ or $R_2$ are joined to form a fused ring;

wherein $R_a$ represents mono or di substituents which cannot fuse to form a benzo ring; and wherein L represents a spacer or a direct connection to the benzothiophene, or benzoselenophene moiety with additional fused rings;

wherein $R'_1$, $R'_2$, and $R'_3$ are independently selected from the group consisting of hydrogen, deuterium, alkyl, alkoxy, amino, alkenyl, alkynyl, arylkyl, aryl, and heteroaryl;

wherein each of $R'_1$, $R'_2$ and $R'_3$ may represent mono, di, tri, or tetra substituents.

13. The first device of claim 12, wherein the compound is selected from the group consisting of:

Formula 2

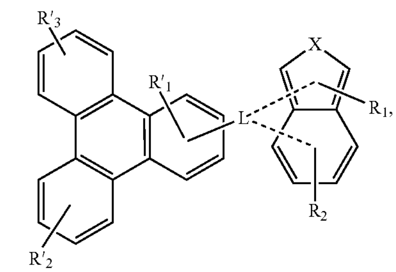

Formula 3

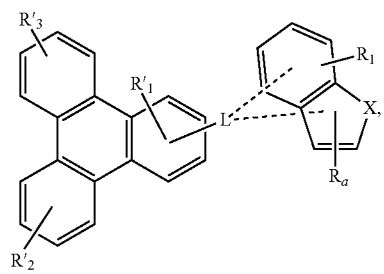

Formula 4

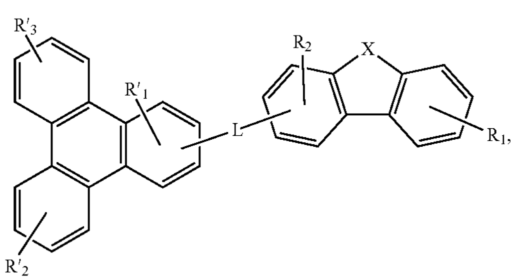

wherein X is S or Se;

wherein $R_1$, $R_2$, and $R_a$ are independently selected from hydrogen, alkyl, alkoxy, amino, alkenyl, alkynyl, arylkyl, aryl, and heteroaryl;

wherein each of $R_1$ and $R_2$ may represent mono, di, tri or tetra substituents;

wherein at least two substituents of $R_1$ or $R_2$ are joined to form a fused ring;

wherein $R_a$ represents mono or di substituents which cannot fuse to form a benzo ring; and wherein L represents a spacer or a direct connection to the benzothiophene, or benzoselenophene moiety with additional fused rings.

14. The first device of claim 12, wherein the organic layer is an emissive layer and the compound comprising one of Formulae 2-4 is the host.

15. The first device of claim 14, wherein the organic layer further comprises an emissive compound.

16. The first device of claim 15, wherein the emissive compound is a transition metal complex having at least one ligand selected from the group consisting of:

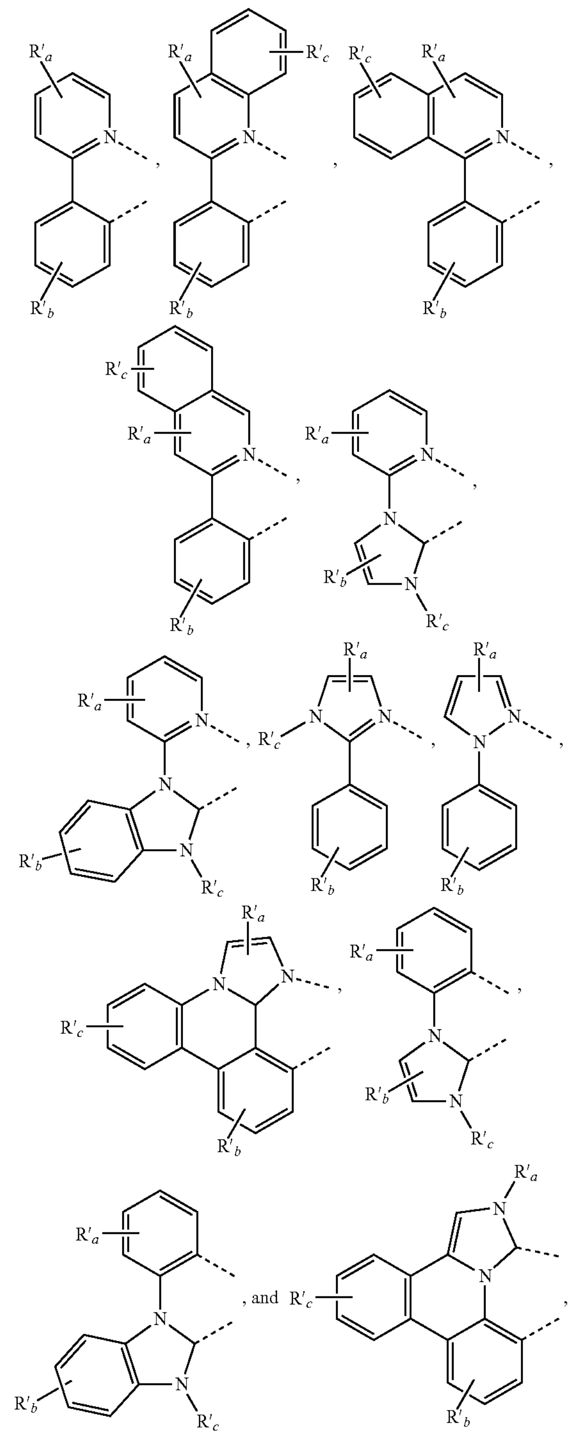

wherein each of $R'_a$, $R'_b$ and $R'_c$ may represent mono, di, tri, or tetra substituents;

wherein each of $R'_a$, $R'_b$ and $R'_c$ substituent are independently selected from a group consisting of hydrogen, deuterium, alkyl, heteroalkyl, aryl, or heteroaryl; and wherein two adjacent substituents may form into a ring.

17. The first device of claim 12, wherein the device comprises a second organic layer that is non-emissive, and the compound comprising Formula I is a non-emissive material in the second organic layer.

18. The first device of claim 12, wherein the first device is an organic light emitting device.

19. The first device of claim 12, wherein the first device is a consumer product.

* * * * *